(12) United States Patent
Kimura et al.

(10) Patent No.: US 7,924,244 B2
(45) Date of Patent: Apr. 12, 2011

(54) SEMICONDUCTOR DEVICE AND METHOD OF DRIVING THE SEMICONDUCTOR DEVICE

(75) Inventors: Hajime Kimura, Kanagawa (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 824 days.

(21) Appl. No.: 10/350,134

(22) Filed: Jan. 24, 2003

(65) Prior Publication Data

US 2003/0137503 A1   Jul. 24, 2003

(30) Foreign Application Priority Data

Jan. 24, 2002   (JP) ................................ 2002-016183

(51) Int. Cl.
G09G 3/30   (2006.01)
(52) U.S. Cl. ......................................................... 345/76
(58) Field of Classification Search .............. 345/76–78, 345/212, 98, 87–92, 100, 45, 26
See application file for complete search history.

(56) References Cited

U.S. PATENT DOCUMENTS

| | | | | |
|---|---|---|---|---|
| 5,572,015 A | * | 11/1996 | Bird et al. | 250/208.1 |
| 5,844,535 A | * | 12/1998 | Itoh et al. | 345/92 |
| 5,872,737 A | | 2/1999 | Tsuruda et al. | |
| 6,091,203 A | | 7/2000 | Kawashima et al. | |
| 6,103,558 A | * | 8/2000 | Yamanaka et al. | 438/166 |
| 6,157,356 A | * | 12/2000 | Troutman | 345/82 |
| 6,304,241 B1 | * | 10/2001 | Udo et al. | 345/96 |
| 6,362,798 B1 | * | 3/2002 | Kimura et al. | 345/55 |
| 6,380,876 B1 | * | 4/2002 | Nagao | 341/154 |
| 6,542,138 B1 | | 4/2003 | Shannon et al. | |
| 6,750,833 B2 | | 6/2004 | Kasai | |
| 6,777,888 B2 | | 8/2004 | Kondo | |
| 6,809,480 B2 | | 10/2004 | Shino | |
| 7,091,939 B2 | | 8/2006 | Kasai | |

(Continued)

FOREIGN PATENT DOCUMENTS

CN   87 2 16946   9/1988

(Continued)

OTHER PUBLICATIONS

European Patent Office Search Report (European Application No. 03000609.2), 3 pages, mailed May 8, 2008.

*Primary Examiner* — Bipin Shalwala
*Assistant Examiner* — Steven E Holton
(74) *Attorney, Agent, or Firm* — Fish & Richardson P.C.

(57) ABSTRACT

Display irregularities in light emitting devices, which develop due to dispersions per pixel in the threshold value of TFTs for supplying electric current to light emitting elements, are obstacles to increasing the image quality of the light emitting devices. An electric potential in which the threshold voltage of a TFT (105) is either added to or subtracted from the electric potential of a reset signal line (110) is stored in capacitor means (108). A voltage, in which the corresponding threshold voltage is added to an image signal, is applied to a gate electrode of a TFT (106). TFTs within a pixel are disposed adjacently, and dispersion in the characteristics of the TFTs does not easily develop. The threshold value of the TFT (105) is thus cancelled, even if the threshold values of the TFTs (106) differ per pixel, and a predetermined drain current can be supplied to an EL element (109).

27 Claims, 26 Drawing Sheets

U.S. PATENT DOCUMENTS

| | | |
|---|---|---|
| 2002/0070913 A1 | 6/2002 | Kimura et al. |
| 2002/0101180 A1 | 8/2002 | Shino |
| 2002/0113760 A1 * | 8/2002 | Kimura .......................... 345/82 |
| 2003/0132931 A1 | 7/2003 | Kimura et al. |
| 2003/0169218 A1 | 9/2003 | Kimura et al. |
| 2004/0080474 A1 | 4/2004 | Kimura |

FOREIGN PATENT DOCUMENTS

| | | |
|---|---|---|
| EP | 1 003 150 | 5/2000 |
| EP | 1054512 A2 * | 11/2000 |
| EP | 1191512 A2 | 3/2002 |
| EP | 1 594 116 | 11/2005 |
| EP | 2228783 A1 | 9/2010 |
| JP | 63-086614 | 4/1988 |
| JP | 10-135424 | 5/1998 |
| JP | 11-272233 | 10/1999 |
| JP | 2001-083924 | 3/2001 |
| JP | 2001-255845 | 9/2001 |
| JP | 2002-008388 | 1/2002 |
| JP | 2002169510 A | 6/2002 |
| WO | WO 98/48403 | 10/1998 |
| WO | WO99/48078 | 9/1999 |
| WO | 01/20591 | 3/2001 |
| WO | WO02-075709 | 9/2002 |

* cited by examiner

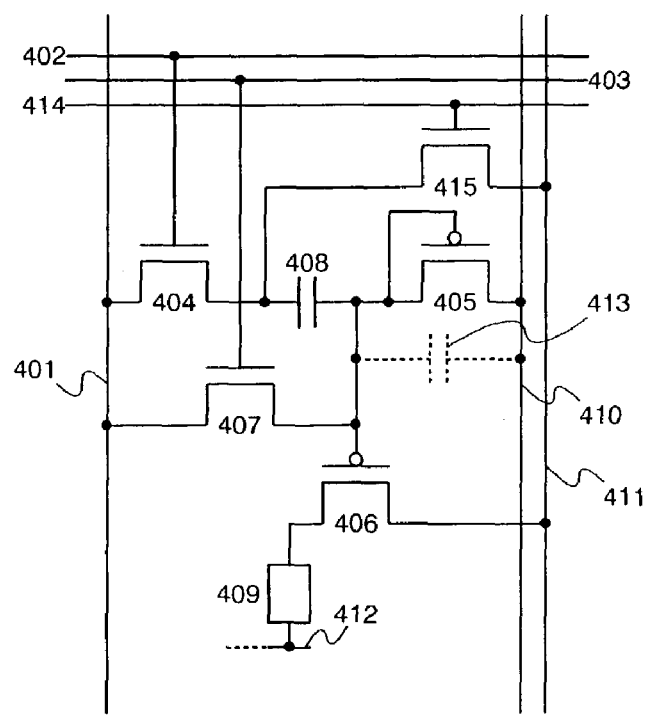
Fig. 5A
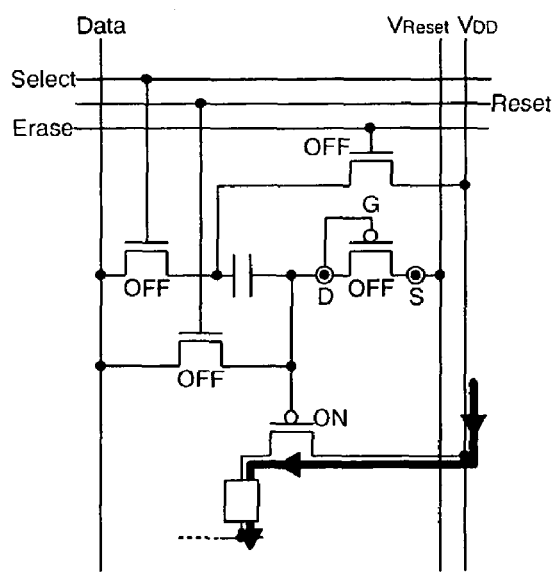 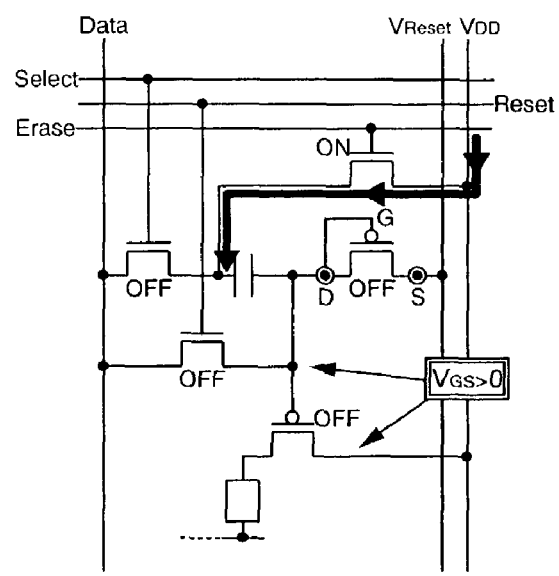
Fig. 5B                    Fig. 5C

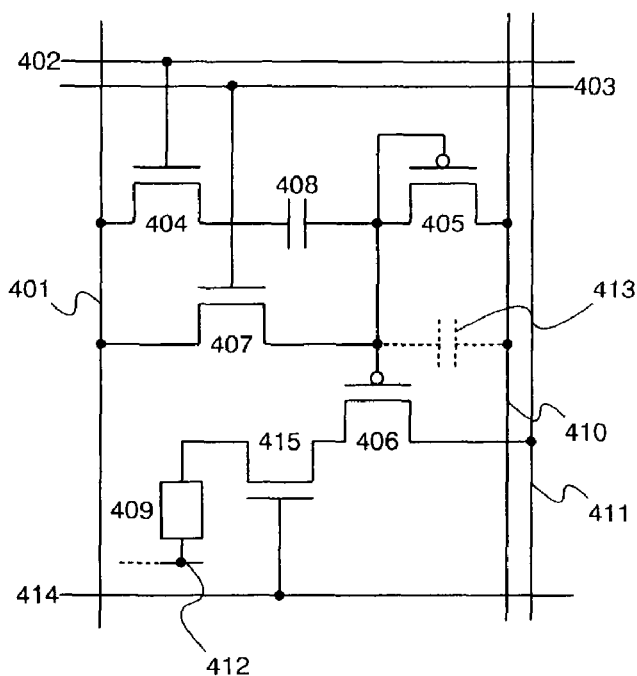
Fig. 6A
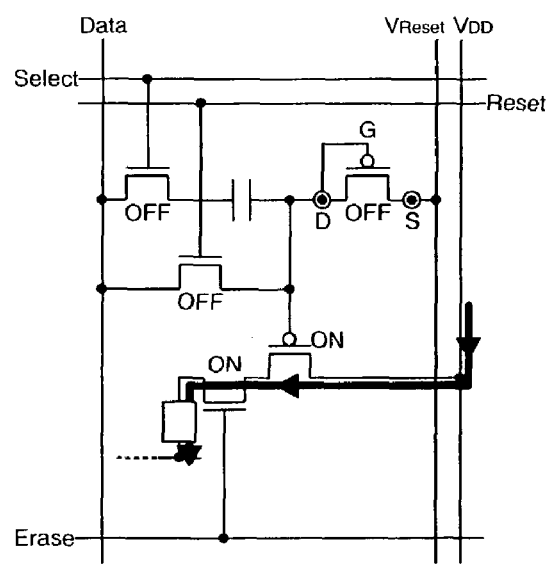 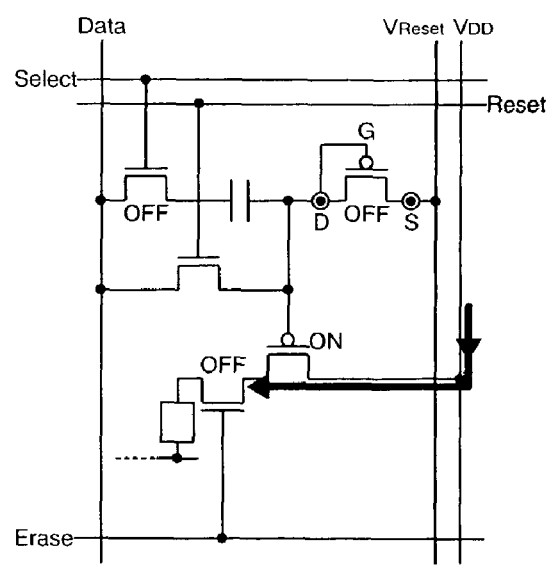
Fig. 6B                    Fig. 6C

SEMICONDUCTOR DEVICE AND METHOD OF DRIVING THE SEMICONDUCTOR DEVICE

BACKGROUND OF THE INVENTION

1. Field of the Invention

The present invention relates to a semiconductor device having a transistor and a method of driving the semiconductor device. Further, the present invention relates to an active matrix light emitting device having a semiconductor device with a thin film transistor (hereinafter referred to as a TFT) formed on an insulator such as glass or plastic, and a method of driving the semiconductor device. Also, the present invention relates to electronic equipment using this type of light emitting device.

2. Description of the Related Art

The development of display devices in which light emitting elements such as electro luminescence (EL) elements are used, has become active in recent years. Being self-luminous, the light emitting element is high in visibility and eliminates the need for a backlight that is necessary in liquid crystal display devices (LCDs) etc., thereby being capable of reducing the thickness of such devices. Also, the light emitting devices may have virtually no limit in terms of viewing angles.

The term EL element indicates an element having a light emitting layer in which luminescence generated by application of an electric field can be obtained. There are light emission when returning to a base state from a singlet excitation state (fluorescence), and light emission when returning to a base state from a triplet excitation state (phosphorescence) in the light emitting layer. A light emitting device of the present invention may use either of the aforementioned types of light emission.

EL elements normally have a laminate structure in which a light emitting layer is sandwiched between a pair of electrodes (anode and cathode). A laminate structure consisting of an anode, a hole transporting layer, a light emitting layer, an electron transporting layer, and a cathode can be given as a typical structure. Further, structures having the following layers laminated in order between an anode and a cathode also exist: a hole injecting layer, a hole transporting layer, a light emitting layer, and an electron transporting layer; and a hole injecting layer, a hole transporting layer, a light emitting layer, an electron transporting layer, and an electron injecting layer. Any of the above-stated structures may be employed as the EL element structure used in the light emitting device of the present invention. Furthermore, fluorescent pigments and the like may also be doped into the light emitting layer.

Here, all layers formed in EL elements between the anode and the cathode are referred to generically as "EL layers". The aforementioned hole injecting layer, hole transporting layer, light emitting layer, electron transporting layer, and electron injecting layer are all included in the category of EL layers, and light emitting elements structured by an anode, an EL layer, and a cathode are referred to as EL elements.

The structure of a pixel in a general light emitting device is shown in FIG. 8. Note that an EL display device is used as an example of a typical light emitting device. The pixel shown in FIG. 8 has a source signal line 801, a gate signal line 802, a switching TFT 803, a driver TFT 804, capacitor means 805, an EL element 806, an electric current supply line 807, and an electric power source line 808.

The connectivity relationship between each portion is explained. The term TFT as used here refers to a three terminal element having a gate, a source, and a drain, but it is difficult to make clear distinctions between the source and the drain due to the structure of TFTs. One terminal, the source or the drain, is therefore denoted as a first electrode, and the other terminal is denoted as a second electrode when explaining the connections between the elements. The terms source and drain are used in the case where a definition of the electric potential of each element is necessary relating to on and off states of the TFT (for example, when explaining a voltage between the gate and the source of the TFT).

Further, the TFT being in an on state refers to a state in which the voltage between the gate and the source of the TFT exceeds the threshold value of the TFT, and electric current flows between the source and the drain. The TFT being in an off state refers to a state in which the voltage between the gate and the source of the TFT is less than the threshold value of the TFT, and the electric current does not flow between the source and the drain. Note that there are cases in which a slight amount of the electric current, referred to as a leak current, flows between the source and the drain even if the voltage between the gate and the source of the TFT is less than the threshold value. However, this state is treated similarly to the off state.

A gate electrode of the switching TFT 803 is connected to the gate signal line 802, a first electrode of the switching TFT 803 is connected to the source signal line 801, and a second electrode of the switching TFT 803 is connected to a gate electrode of the driver TFT 804. A first electrode of the driver TFT 804 is connected to the electric current supply line 807, and a second electrode of the driver TFT 804 is connected to a first electrode of the EL element 806. A second electrode of the EL element 806 is connected to the electric power source line 808. There is a mutual electric potential difference between the electric current supply line 807 and the electric power source line 808. Further, the capacitor means 805 may be formed between the gate electrode of the driver TFT 804 and the line having a fixed electric potential, such as the electric current supply line 807, in order to maintain the voltage between the gate and the source of the driver TFT 804 during light emission.

An image signal input to the source signal line 801 is then input to the gate electrode of the driver TFT 804 if a pulse is input to the gate signal line 802 and the switching TFT 803 is on. The voltage between the gate and the source of the driver TFT 804, and the amount of the electric current flowing between the source and the drain of the driver TFT 804 (hereinafter referred to as a drain current), are determined in accordance with the electric potential of the input image signal. This electric current is supplied to the EL element 806, and the EL element 806 emits light.

TFTs formed by polycrystalline silicon (hereinafter referred to as P—Si) have a higher field-effect mobility than TFTs formed by using amorphous silicon (hereinafter referred to as A-Si), and a larger on current, and therefore are very suitable as transistors used in light emitting devices.

Conversely, TFTs formed by P—Si have a problem in that dispersion in their electrical characteristics tends to develop due to defects in crystal grain boundaries.

If there is a dispersion in TFT threshold values, for example a dispersion per pixel in the threshold values of the driver TFTs 804 in FIG. 8, then a difference in the brightness of the EL elements 806 develops due to dispersion in the value of the drain current of the TFTs, corresponding to the dispersion in the TFT threshold values, even if the same image signal is input to different pixels. This particularly becomes a problem for display devices employing an analog gray scale method.

It has been proposed recently that these types of TFT threshold value dispersions can be corrected. A structure shown in FIG. 10 can be given as one example of such as proposal (refer to patent document 1).
[Patent Document 1] International Publication Number 99-48403 Pamphlet (p. 25, FIG. 3, FIG. 4).

A pixel shown in FIG. 10A has a source signal line 1001, first to third gate signal lines 1002 to 1004, TFTs 1005 to 1008, capacitor means 1009 ($C_2$) and 1010 ($C_1$), an EL element 1011, an electric current supply line 1012, and an electric power source line 1013.

A gate electrode of the TFT 1005 is connected to the first gate signal line 1002, a first electrode of the TFT 1005 is connected to the source signal line 1001, and a second electrode of the TFT 1005 is connected to a first electrode of the capacitor means 1009. A second to electrode of the capacitor means 1009 is connected to a first electrode of the capacitor means 1010, and a second electrode of the capacitor means 1010 is connected to the electric current supply line 1012. A gate electrode of the TFT 1006 is connected to the second electrode of the capacitor means 1009 and the first electrode of the capacitor means 1010, a first electrode of the TFT 1006 is connected to the electric current supply line 1012, and a second electrode of the TFT 1006 is connected to a first electrode of the TFT 1007 and a first electrode of the TFT 1008. A gate electrode of the TFT 1007 is connected to the second gate signal line 1003, and a second electrode of the TFT 1007 is connected to the second electrode of the capacitor means 1009. A gate electrode of the TFT 1008 is connected to the third gate signal line 1004, and a second electrode of the TFT 1008 is connected to a first electrode of the EL element 1011. A second electrode of the EL element 1011 is connected to the electric power source line 1013, and has a mutual electric potential difference with the electric current supply line 1012.

Operation is explained using FIGS. 10A and 10B, and FIGS. 11A to 11F. FIG. 10B shows image signals input to the source signal line 1001 and the first to the third gate signal lines 1002 to 1004, and shows pulse timing. FIG. 10B is divided into sections I to VIII corresponding to each operation shown in FIGS. 11A to 11F. Further, a structure using four TFTs is used as an example in the pixel shown in FIGS. 10A and 10B, with all four being p-type TFTs. The TFTs therefore turn on when an L level signal is input to their gate electrodes, and turn off when an H level signal is input. Furthermore, although image signals input to the source signal line 1001 are shown here which have a pulse shape in order to indicate input periods only, predetermined analog electric potentials may also be used for an analog gray scale method.

First, L level is input to the first and the third gate signal lines 1002 and 1004, and the to TFTs 1005 and 1008 turn on (section I). The second gate signal line 1003 then becomes L level, and the TFT 1007 turns on. Electric charge accumulates in the capacitor means 1009 and 1010 as shown in FIG. 11A. The TFT 1006 turns on at the point when an electric potential difference between both electrodes of the capacitor means 1010, in other words, when a voltage maintained in the capacitor means 1010, exceeds a threshold value $|V_{th}|$ of the TFT 1006 (section II).

The third gate signal line 1004 then becomes H level, and the TFT 1008 turns off. The electric charge which has accumulated in the capacitor means 1009 and 1010 thus moves once again, and the voltage stored in the capacitor means 1010 soon becomes equal to $|V_{th}|$. The electric potential of the electric current supply line 1012 and the electric potential of the source signal line 1001 are both an electric potential $V_{DD}$ at this point, as shown in FIG. 11B, and therefore the voltage maintained in the capacitor means 1009 also becomes equal to $|V_{th}|$. The TFT 1006 therefore soon turns off.

The second gate signal line 1003 becomes H level after the voltages maintained in the capacitor means 1009 and 1010 become equal to $|V_{th}|$, as discussed above, and the TFT 1007 turns off (section IV). $|V_{th}|$ is thus stored in the capacitor means 1009 by this operation, as shown in FIG. 11C.

A relationship like that of Eq. (1) results for an electric charge $Q_1$ stored at this point in the capacitor means 1010 ($C_1$). Similarly, a relationship like that of Eq. (2) results for an electric charge $Q_2$ stored at this point in the capacitor means 1009 ($C_2$).

[Eq. (1)]

$$Q_1 = C_1 \times |V_{th}| \qquad (1)$$

[Eq. (2)]

$$Q_2 = C_2 \times |V_{th}| \qquad (2)$$

Input of an image signal is then performed as shown in FIG. 11D (section V). The image signal is output to the source signal line 1001, and the electric potential of the source signal line 1001 changes from the electric potential $V_{DD}$ to an electric potential $V_{Data}$ of the image signal (the TFT 1006 is a p-channel TFT here, and therefore $V_{DD} > V_{Data}$). If the electric potential of the gate electrode of the TFT 1006 is taken as an electric potential $V_P$, and the electric charge in the node is taken as Q, then relationships like those of Eq. (3) and Eq. (4) develop due to conservation law of charge including the capacitor means 1009 and 1010.

[Eq. (3)]

$$Q + Q_1 = C_1 \times (V_{DD} - V_P) \qquad (3)$$

[Eq. (4)]

$$Q - Q_2 = C_2 \times (V_P - V_{Data}) \qquad (4)$$

From Eqs. (1) to (4), the electric potential $V_P$ of the gate electrode of the TFT 1006 can be expressed by Eq. (5).

[Eq. (5)]

$$V_P = \frac{C_1}{C_1 + C_2} V_{DD} + \frac{C_2}{C_1 + C_2} V_{Data} - |V_{th}| \qquad (5)$$

A voltage $V_{GS}$ between the gate and the source of the TFT 1006 is therefore expressed by Eq. (6).

[Eq. (6)]

$$\begin{aligned} V_{GS} &= V_P - V_{DD} \\ &= \frac{C_2}{C_1 + C_2}(V_{Data} - V_{DD}) - |V_{th}| \\ &= \frac{C_2}{C_1 + C_2}(V_{Data} - V_{DD}) - V_{th} \end{aligned} \qquad (6)$$

The term $V_{th}$ is contained in the right-hand side of Eq. (6). That is, the threshold voltage of the TFT 1006 in each pixel is added to the image signal input from the source signal line 1001, and this is stored by the capacitor means 1009 and 1010.

The first gate signal line 1002 becomes H level when the input of the image signal is complete, and the TFT 1005 turns off (section VI). The source signal line 1001 then returns to a predetermined electric potential (section VII). Operations for writing in the image signal to the pixels are thus complete (FIG. 11E).

The third gate signal line 1004 then becomes L level, the TFT 1008 turns on, and the EL element 1011 emits light due to electric current flowing in the EL element 1011, as shown in FIG. 11F. The amount of electric current flowing in the EL element 1011 at this point depends upon the voltage between the gate and the source of the TFT 1006, and a drain current $I_{DS}$ flowing in the TFT 1006 is expressed by Eq. (7).

[Eq. (7)]

$$I_{DS} = \frac{\beta}{2}(V_{GS} - V_{th}) \quad (7)$$
$$= \frac{\beta}{2}\left\{\frac{C_2}{C_1 + C_2}(V_{Data} - V_{DD})\right\}^2$$

It can be seen from Eq. (7) that the drain current $I_{DS}$ of the TFT 1006 does not depend on the threshold value $V_{th}$. The value of the electric current flowing in the EL elements 1011 of each of the pixels therefore does not change, even if there is dispersion in the threshold values of the TFTs 1006 in each of the pixels. Electric current therefore flows correctly in the EL elements 1011 in accordance with the image signal $V_{Data}$.

However, the drain current $I_{DS}$ in Eq. (7) does depend upon the capacitances $C_1$ and $C_2$ with the aforementioned structure. That is, the drain current $I_{DS}$ will have dispersion if the capacitance values of the capacitor means 1009 and 1010 have dispersion.

SUMMARY OF THE INVENTION

An object of the present invention is therefore to provide a semiconductor device capable of correcting dispersions in TFT threshold values due to the aforementioned problem, specifically a semiconductor device having a structure that is not influenced by dispersions in capacitance values. In addition, an object of the present invention is to provide a method of driving the semiconductor device.

Operating principles of the present invention are explained using FIGS. 14A to 14E. Consider circuits like those of FIG. 14A or 14B. Switching elements 1403 and 1413 are elements that are controlled by input signals, and may be elements capable of being placed in a conductive or a non-conductive state. For example, elements such as TFTs, with which on and off can be selected by an input signal, may be employed.

Further, an element in which electric current develops only in a single direction when an electric potential difference is imparted to both electrodes of the element is defined as a rectifying element. Diodes and TFTs having a short circuit between their gate and drain (this state is denoted as a diode connection) can be given as examples of rectifying elements.

Consider circuits in which the switching elements 1403 and 1413, capacitor means 1402 and 1412, and rectifying elements 1401 and 1411 are connected as shown in FIGS. 14A and 14B. The rectifying element 1401 uses a p-channel TFT, and the rectifying element 1411 uses an n-channel TFT.

Terminals in each circuit are denoted by α, β, γ, and δ. Fixed electric potentials are imparted to each of the terminals α to γ. The electric potential imparted to the terminals α and β in FIG. 14A is taken as $V_{SS}$, and the electric potential imparted to the terminal γ is taken as $V_{Reset}$ ($V_{Reset} \geq V_{SS} + |V_{th}P|$, where $V_{th}P$ is the threshold value of the rectifying element 1401). The electric potential imparted to the terminals α and β for the case of FIG. 14B is taken as $V_x$, and the electric potential imparted to the terminal γ is taken as $V_{Reset}$ ($V_{Reset} \leq V_x - |V_{th}N|$, where $V_{th}N$ is the threshold value of the rectifying element 1411).

The switching elements 1403 and 1413 are conductive during a period denoted by symbol i in FIG. 14C. In FIG. 14A, the electric potential of a gate electrode and a drain electrode of the TFT 1401, which is a rectifying element, drops to become $V_{SS}$ in FIG. 14A. On the other hand, in FIG. 14B, the electric potential of a gate electrode and a drain electrode of the TFT 1411, which is a rectifying element, increases to become $V_x$. The voltage between the source and the drain of both the TFT 1401 and the TFT 1411 is higher than the absolute value of the threshold voltage, and therefore both turn on.

The switching elements 1403 and 1413 then become non-conductive during a period denoted by symbol ii in FIG. 14C. The TFTs 1401 and 1411 are both on at this point, and electric current develops in each between their source and drain. The electric potential of the gate electrode and the drain electrode of the TFT 1401 increases in FIG. 14A, and the electric potential of the gate electrode and the drain electrode of the TFT 1411 drops in FIG. 14B. The voltage between the source and the drain of the TFT 1401 and the voltage between the source and the drain of the TFT 1411, in other words the voltages between the gate and the source of the TFTs 1401 and 1411, therefore become smaller.

The voltages between the gate and the source of the TFTs 1401 and 1411 each therefore become equal to the threshold value of their respective TFTs. The TFTs 1401 and 1411 therefore turn off. The electric potential differences between the electric potential of the drain electrode of the TFTs 1401 and 1411, and the terminal α are stored by the capacitor means 1402 and 1412 at this point.

$V_{Reset} - |V_{th}P|$ is therefore output from the terminal δ in FIG. 14A during a period denoted by symbol iii in FIG. 14C, and $V_{Reset} + |V_{th}N|$ is output from the terminal δ in FIG. 14B.

It can be seen that the threshold voltage of the TFTs 1401 and 1411 can be output for both FIG. 14A and FIG. 14B. For example, if a signal is input to the terminal α in this state, then capacitive coupling occurs by the capacitor means 1402 and 1412, and the electric potential of the terminal δ changes by the amount of the voltage of the input signal. The TFT threshold voltage already appears at the terminal δ, and therefore there is a correction applied with respect to the signal input by the amount of the TFT threshold voltage.

A different structure having the same operating principle may also be used as shown in FIGS. 14D and 14E, in which a diode 1410 or capacitor means 1420 is formed as a substitute for the switching element 1403, and the electric potential of the gate electrode and the drain electrode of the TFT 1401 is lowered by reducing the electric potential of the terminal β ($V_{SS}$ here). The electric potential of the terminal δ at this point can drop to $V_{SS} + |V_{th}D|$, where $V_{th}D$ is the threshold value of the diode 1410). Electric current does not flow in the reverse direction in the case of FIG. 14D provided that the electric potential of the terminal β is increased ($V_{DD}$ here) after the electric potential of the gate electrode and the drain electrode of the TFT 1401 are initially reduced, and this therefore becomes similar to making a switching element non-conductive.

Note that although the TFT 1401 uses a p-channel TFT here, it may also use an n-channel TFT. In this case, the drain electrode and the gate electrode of the TFT 1401 are connected to the terminal γ side. Similarly, although the TFT 1411 uses an n-channel TFT, it may also use a p-channel TFT.

The drain electrode and the gate electrode of the TFT 1411 are then connected to the terminal γ side for this case.

Further, the TFTs 1401 and 1411 may also use diodes. For the diodes to be used here, in addition to diodes having a normal p-n junction, TFTs having the aforementioned diode connection may also be used.

Correcting dispersion in TFT threshold values in a light emitting device, and reducing dispersion in the brightness of EL elements are taken as objectives here and methods for accomplishing the objectives are explained. The operating principle of the present invention is not limited to the correction of dispersion in TFT threshold values, however, and of course it is also possible to apply the present invention to other electronic circuits.

Structures of the present invention are discussed below.

According to the present invention, there is provided a semiconductor device comprising:
a rectifying element;
capacitor means; and
a switching element,
characterized in that:
  a first electrode of the rectifying element is electrically connected to a first electrode of the capacitor means and a first electrode of the switching element.

According to the present invention, there is provided a semiconductor device comprising:
a first rectifying element having a first electrode;
a second rectifying element having a first electrode; and
capacitor means,
characterized in that:
  a first electrode of the first rectifying element electrically connected to a first electrode of the capacitor means and a first electrode of the second rectifying element.

According to the present invention, there is provided a semiconductor device comprising:
a rectifying element;
capacitor means; and
a switching element,
characterized in that:
  an electric potential $V_1$ of a first electric power source is imparted to a first electrode of the rectifying element;
  a second electrode of the rectifying element is electrically connected to a first electrode of the capacitor means and a first electrode of the switching element;
  an electric potential $V_2$ of a second electric power source is imparted to a second electrode of the switching element;
  a signal having an electric potential that is greater than or equal to an electric potential $V_3$ and less than or equal to ($V_3$+an electric potential $V_{Data}$), or greater than or equal to ($V_3-V_{Data}$) and less than or equal to $V_3$, is input to a second electrode of the capacitor means; and
  a signal having an electric potential equal to any one of ($V_1$+|$V_{th}$|), $V_2$, and ($V_1$+|$V_{th}$|±$V_{Data}$) is obtained from the second electrode of the rectifying element when a threshold voltage of the rectifying element is taken as $V_{th}$.

According to the present invention, there is provided a semiconductor device comprising:
a rectifying element;
capacitor means; and
a switching element,
characterized in that:
  an electric potential $V_1$ of a first electric power source is imparted to a first electrode of the rectifying element;
  a second electrode of the rectifying element is electrically connected to a first electrode of the capacitor means and a first electrode of the switching element;
  an electric potential $V_2$ of a second electric power source is imparted to a second electrode of the switching element;
  a signal having an electric potential that is greater than or equal to an electric potential $V_3$ and less than or equal to ($V_3$+an electric potential $V_{Data}$), or greater than or equal to ($V_3-V_{Data}$) and less than or equal to $V_3$, is input to a second electrode of the capacitor means; and
  a signal having an electric potential equal to any one of ($V_1-|V_{th}|$), $V_2$, and ($V_1-|V_{th}|±V_{Data}$) is obtained from the second electrode of the rectifying element when a threshold voltage of the rectifying element is taken as $V_{th}$.

According to the present invention, there is provided a semiconductor device comprising:
a first rectifying element;
a second rectifying element; and
capacitor means,
characterized in that:
  an electric potential $V_1$ of a first electric power source is imparted to a first electrode of the first rectifying element;
  a second electrode of the first rectifying element is electrically connected to a first electrode of the capacitor means and a first electrode of the second rectifying element;
  a first signal having an electric potential greater than or equal to an electric potential $V_2$ and less than or equal to an electric potential $V_2'$ is input to a second electrode of the second rectifying element;
  a second signal having an electric potential that is greater than or equal to an electric potential $V_3$ and less than or equal to ($V_3$+an electric potential $V_{Data}$), or greater than or equal to ($V_3-V_{Data}$) and less than or equal to $V_3$, is input to a second electrode of the capacitor means; and
  a signal having an electric potential equal to any one of ($V_1-|V_{th}1|$), ($V_2+V_{th}2$), and ($V_1-|V_{th}1|±V_{Data}$) is obtained from the second electrode of the first rectifying element when a threshold voltage of the first rectifying element is taken as $V_{th}1$ and a threshold voltage of the second rectifying element is taken as $V_{th}2$.

According to the present invention, there is provided a semiconductor device comprising:
a first rectifying element;
a second rectifying element; and
capacitor means,
characterized in that:
  an electric potential $V_1$ of a first electric power source is imparted to the first electrode of the first rectifying element;
  a second electrode of the first rectifying element is electrically connected to a first electrode of the capacitor means and a first electrode of the second rectifying element;
  a first signal having a voltage amplitude of an electric potential greater than or equal to an electric potential $V_2$ and less than or equal to an electric potential $V_2'$ is input to a second electrode of the second rectifying element;
  a second signal having an electric potential that is greater than or equal to an electric potential $V_3$ and less than or equal to ($V_3$+an electric potential $V_{Data}$), or greater than or equal to ($V_3-V_{Data}$) and less than or equal to $V_3$, is input to a second electrode of the capacitor means; and a signal having an electric potential equal to any one of ($V_1+V_{th}1$), ($V_2'-V_{th}2$), and ($V_1+V_{th}1\pm V_{Data}$) is obtained from the second electrode of the first rectifying element when a threshold voltage of the first rectifying element is taken as $V_{th}1$ and a threshold voltage of the second rectifying element is taken as $V_{th}2$.

According to the present invention, there is provided a semiconductor device, characterized in that:

the rectifying element is formed by using a transistor having a connection between its gate and its drain;

$V_1<V_2$ if the transistor having a connection between its gate and its drain is an n-channel transistor; and $V_1>V_2$ if the transistor having a connection between its gate and its drain is a p-channel transistor.

According to the present invention, there is provided a semiconductor device, characterized in that:

the first rectifying element is formed by using a transistor having a connection between its gate and its drain;

$V_1<V_2$ if the transistor having a connection between its gate and its drain is an n-channel transistor; and $V_1>V_2$ if the transistor having a connection between its gate and its drain is a p-channel transistor.

According to the present invention, there is provided a semiconductor device, further comprising a transistor, characterized in that a gate electrode of the transistor is electrically connected to the first electrode of the capacitor means.

According to the present invention, there is provided a semiconductor device comprising a plurality of pixels, each pixel including:
 a source signal line;
 a first gate signal line;
 a second gate signal line;
 a reset electric power source line;
 an electric current supply line;
 a first transistor;
 a second transistor;
 a third transistor;
 a fourth transistor;
 capacitor means; and
 a light emitting element,
 characterized in that:
  a gate electrode of the first transistor is electrically connected to the first gate signal line;
  a first electrode of the first transistor is electrically connected to the source signal line;
  a second electrode of the first transistor is electrically connected to a first electrode of the capacitor means;
  a second electrode of the capacitor means is electrically connected to a gate electrode of the second transistor, a first electrode of the second transistor, and a gate electrode of the third transistor;
  a second electrode of the second transistor is electrically connected to the reset electric power source line;
  a first electrode of the third transistor is electrically connected to the electric current supply line;
  a second electrode of the third transistor is electrically connected to a first electrode of the light emitting element;
  a gate electrode of the fourth transistor is electrically connected to the second gate signal line;
  a first electrode of the fourth transistor is electrically connected to the source signal line or the second electrode of the first transistor; and
  a second electrode of the fourth transistor is electrically connected to the gate electrode of the second transistor, the first electrode of the second transistor, and the gate electrode of the third transistor.

According to the present invention, there is provided a semiconductor device comprising a plurality of pixels, each pixel including:
 a source signal line;
 a first gate signal line;
 a second gate signal line;
 a reset electric power source line;
 an electric current supply line;
 a first transistor;
 a second transistor;
 a third transistor;
 capacitor means;
 a diode; and
 a light emitting element,
 characterized in that:
  a gate electrode of the first transistor is electrically connected to the first gate signal line;
  a first electrode of the first transistor is electrically connected to the source signal line;
  a second electrode of the first transistor is electrically connected to a first electrode of the capacitor means;
  a second electrode of the capacitor means is electrically connected to a gate electrode of the second transistor, a first electrode of the second transistor, and a gate electrode of the third transistor;
  a second electrode of the second transistor is electrically connected to the reset electric power source line;
  a first electrode of the third transistor is electrically connected to the electric current supply line;
  a second electrode of the third transistor is electrically connected to a first electrode of the light emitting element;
  a first electrode of the diode is electrically connected to the gate electrode of the second transistor, the first electrode of the second transistor, and the gate electrode of the third transistor; and
  a second electrode of the diode is electrically connected to the second gate signal line.

According to the present invention, there is provided a semiconductor device comprising a plurality of pixels, each pixel including:
 a source signal line;
 a first gate signal line;
 a second gate signal line;
 a reset electric power source line;
 an electric current supply line;
 a first transistor;
 a second transistor;
 a third transistor;
 a first capacitor means;
 a second capacitor means; and
 a light emitting element,
 characterized in that:
  a gate electrode of the first transistor is electrically connected to the first gate signal line;
  a first electrode of the first transistor is electrically connected to the source signal line;
  a second electrode of the first transistor is electrically connected to a first electrode of the first capacitor means;

a second electrode of the first capacitor means is electrically connected to a gate electrode of the second transistor, a first electrode of the second transistor, and a gate electrode of the third transistor;
a second electrode of the second transistor is electrically connected to the reset electric power source line;
a first electrode of the third transistor is electrically connected to the electric current supply line;
a second electrode of the third transistor is electrically connected to a light emitting element;
a first electrode of the second capacitor means is electrically connected to the gate electrode of the second transistor, the first electrode of the second transistor, and the gate electrode of the third transistor; and
a second electrode of the second capacitor means is electrically connected to the second gate signal line.

According to the present invention, there is provided a semiconductor device comprising a plurality of pixels, each pixel including:
a source signal line;
a first gate signal line;
a second gate signal line;
a third gate signal line;
a reset electric power source line;
an electric current supply line;
a first transistor;
a second transistor;
a third transistor;
a fourth transistor;
a fifth transistor;
a first capacitor means;
a second capacitor means; and
a light emitting element,
characterized in that:
a gate electrode of the first transistor is electrically connected to the first gate signal line;
a first electrode of the first transistor is electrically connected to the source signal line;
a second electrode of the first transistor is electrically connected to a first electrode of the first capacitor means;
a second electrode of the first capacitor means is electrically connected to a gate electrode of the second transistor, a first electrode of the second transistor, and a gate electrode of the third transistor;
a second electrode of the second transistor is electrically connected to the reset electric power source line;
a first electrode of the third transistor is electrically connected to the electric current supply line;
a second electrode of the third transistor is electrically connected to a light emitting elements;
a gate electrode of the fourth transistor is electrically connected to the second gate signal line;
a first electrode of the fourth transistor is electrically connected to the source signal line or the second electrode of the first transistor;
a second electrode of the fourth transistor is electrically connected to the gate electrode of the second transistor, the first electrode of the second transistor, and the gate electrode of the third transistor;
a first electrode of the second capacitor means is electrically connected to the second electrode of the first transistor;
a second electrode of the second capacitor means is electrically connected to the second electrode of the third transistor;
a gate electrode of the fifth transistor is electrically connected to the third gate signal line;
a first electrode of the fifth transistor is electrically connected to the second electrode of the third transistor; and
a second electrode of the fifth transistor is connected to an electric power source electric potential that is equal to or lower than an electric potential of a second electrode of the light emitting element.

According to the present invention, there is provided a semiconductor device, further comprising:
an erasure gate signal line; and
an erasure transistor,
characterized in that:
a gate electrode of the erasure transistor is electrically connected to the erasure gate signal line;
a first electrode of the erasure transistor is electrically connected to the electric current supply line; and
the second electrode of the erasure transistor is electrically connected to the gate electrode of the third transistor.

According to the present invention, there is provided a semiconductor device, further comprising:
an erasure gate signal line; and
an erasure transistor,
characterized in that:
a gate electrode of the erasure transistor is electrically connected to the erasure gate signal line;
a first electrode of the erasure transistor is electrically connected to the electric current supply line; and
a second electrode of the erasure transistor is electrically connected to the second electrode of the first transistor.

According to the present invention, there is provided a semiconductor device, further comprising:
an erasure gate signal line; and
an erasure transistor,
characterized in that:
the erasure transistor is formed between the electric current supply line and the first electrode of the third transistor, or between the second electrode of the third transistor and the first electrode of the light emitting element; and
a gate electrode of the erasure transistor is electrically connected to the erasure gate signal line.

According to the present invention, there is provided a semiconductor device, characterized in that the second transistor and the third transistor have the same polarity.

According to the present invention, there is provided a method of driving a semiconductor device, the semiconductor device comprising:
a rectifying element;
capacitor means; and
a switching element,
characterized in that:
an electric potential $V_1$ of a first electric power source is imparted to a first electrode of the rectifying element;
a second electrode of the rectifying element is electrically connected to a first electrode of the capacitor means and a first electrode of the switching element; and
an electric potential $V_2$ of a second electric power source is imparted to a second electrode of the switching element;

the method of driving the semiconductor device comprising:
when a threshold voltage of the rectifying element is taken as $V_{th}$,
a first step of making the switching element conductive and setting the electric potential of a second electrode of the rectifying element to $V_2$; and
a second step of making the switching element non-conductive, making the voltage between both electrodes of the rectifying element converge to the threshold voltage $V_{th}$, and setting the electric potential of the second electrode of the rectifying element to $(V_1+V_{th})$.

According to the present invention, there is provided a method of driving a semiconductor device, the semiconductor device comprising:
a rectifying element;
capacitor means; and
a switching element,
characterized in that:
an electric potential $V_1$ of a first electric power source is imparted to a first electrode of the rectifying element;
a second electrode of the rectifying element is electrically connected to the first electrode of the capacitor means and a first electrode of the switching element;
an electric potential $V_2$ of a second electric power source is imparted to a second electrode of the switching element; and
a signal having an electric potential that is greater than or equal to an electric potential $V_3$ and less than or equal to $(V_3+$an electric potential $V_{Data})$, or greater than or equal to $(V_3-V_{Data})$ and less than or equal to $V_3$, is input to a second electrode of the capacitor means;
the method of driving the semiconductor device comprising:
when a threshold voltage of the rectifying element is taken as $V_{th}$,
a first step of making the switching element conductive and setting the electric potential of a second electrode of the rectifying element to $V_2$;
a second step of making the switching element non-conductive, making the voltage between both electrodes of the rectifying element converge to the threshold voltage $V_{th}$, and setting the electric potential of the second electrode of the rectifying element to $(V_1+V_{th})$; and
a third step of changing the electric potential of the second electrode of the capacitor means by $V_{Data}$, and setting the electric potential of the second electrode of the rectifying element to $(V_1+V_{th}\pm V_{Data})$.

According to the present invention, there is provided a method of driving a semiconductor device, the semiconductor device comprising:
a rectifying element;
capacitor means; and
a switching element,
characterized in that:
an electric potential $V_1$ of a first electric power source is imparted to a first electrode of the rectifying element;
a second electrode of the rectifying element is electrically connected to a first electrode of the capacitor means and a first electrode of the switching element; and
an electric potential $V_2$ of a second electric power source is imparted to a second electrode of the switching element;

the method of driving the semiconductor device comprising:
when a threshold voltage of the rectifying element is taken as $V_{th}$,
a first step of making the switching element conductive and setting the electric potential of the second electrode of the rectifying element to $V_2$; and
a second step of making the switching element non-conductive, making the voltage between both electrodes of the rectifying element converge to the threshold voltage $V_{th}$, and setting the electric potential of the second electrode of the rectifying element to $(V_1-|V_{th}|)$.

According to the present invention, there is provided a method of driving a semiconductor device, the semiconductor device comprising:
a rectifying element;
capacitor means; and
a switching element,
characterized in that:
an electric potential $V_1$ of a first electric power source is imparted to a first electrode of the rectifying element;
a second electrode of the rectifying element is electrically connected to a first electrode of the capacitor means and a first electrode of the switching element;
an electric potential $V_2$ of a second electric power source is imparted to a second electrode of the switching element; and
a signal having an electric potential that is greater than or equal to an electric potential $V_3$ and less than or equal to $(V_3+$an electric potential $V_{Data})$, or greater than or equal to $(V_3-V_{Data})$ and less than or equal to $V_3$, is input to a second electrode of the capacitor means;
the method of driving the semiconductor device comprising:
when a threshold voltage of the rectifying element is taken as $V_{th}$,
a first step of making the switching element conductive and setting the electric potential of the second electrode of the rectifying element to $V_2$;
a second step of making the switching element non-conductive, making the voltage between both electrodes of the rectifying element converge to the threshold voltage $V_{th}$, and setting the electric potential of the second electrode of the rectifying element to $(V_1-|V_{th}|)$; and
a third step of changing the electric potential of the second electrode of the capacitor means by $V_{Data}$, and setting the electric potential of the second electrode of the rectifying element to $(V_1-|V_{th}|\pm V_{Data})$.

According to the present invention, there is provided a method of driving a semiconductor device, characterized in that:
the semiconductor device further comprises a transistor; and
a gate electrode of the transistor is electrically connected to the second electrode of the rectifying element.

According to the present invention, there is provided a method of driving a semiconductor device, the semiconductor device comprising:
a first rectifying element having a first electrode and a second electrode;
a second rectifying element having a first electrode and a second electrode; and
capacitor means, characterized in that:
an electric potential $V_1$ of a first electric power source is imparted to a first electrode of the first rectifying element;
a second electrode of the first rectifying element is electrically connected to a first electrode of the capacitor means and a first electrode of the second rectifying element; and
a first signal having an electric potential greater than or equal to an electric potential $V_2$ and less than or equal to an electric potential $V_2'$ is input to a second electrode of the second rectifying element;
the method of driving the semiconductor device comprising:
when a threshold voltage of the first rectifying element is taken as $V_{th}1$ and a threshold voltage of the second rectifying element is taken as $V_{th}2$,
a first step of setting the electric potential of a second electrode of the second capacitor means to $V_2$, and setting the electric potential of the second electrode of the first rectifying element to $(V_2+V_{th}2)$; and
a second step of setting the electric potential of a second electrode of the second capacitor means to $V_2'$, making the voltage between both electrodes of the first rectifying element converge to the threshold voltage $V_{th}1$, and setting the electric potential of the second electrode of the first rectifying element to $(V_1-|V_{th}1|)$.

According to the present invention, there is provided a method of driving a semiconductor device, the semiconductor device comprising:
a first rectifying element;
a second rectifying element; and
capacitor means,
characterized in that:
an electric potential $V_1$ of a first electric power source is imparted to a first electrode of the first rectifying element;
a second electrode of the first rectifying element is electrically connected to a first electrode of the capacitor means and a first electrode of the second rectifying element;
a first signal having an electric potential greater than or equal to an electric potential $V_2$ and less than or equal to an electric potential $V_2'$ is input to a second electrode of the second rectifying element; and
a second signal having an electric potential that is greater than or equal to an electric potential $V_3$ and less than or equal to $(V_3+$an electric potential $V_{Data})$, or greater than or equal to $(V_3-V_{Data})$ and less than or equal to $V_3$, is input to a second electrode of the capacitor means;
the method of driving the semiconductor device comprising:
when a threshold voltage of the first rectifying element is taken as $V_{th}1$ and a threshold voltage of the second rectifying element is taken as $V_{th}2$,
a first step of setting the electric potential of the second electrode of the second capacitor means to $V_2$, and setting the electric potential of the second electrode of the first rectifying element to $(V_2+V_{th}2)$;
a second step of setting the electric potential of a second electrode of the second capacitor means to $V_2'$, making the voltage between both electrodes of the first rectifying element converge to the threshold voltage $V_{th}1$, and setting the electric potential of the second electrode of the first rectifying element to $(V_1-|V_{th}1|)$; and
a third step of changing the electric potential of the second electrode of the capacitor means by $V_{Data}$, and setting the electric potential of the second electrode of the first rectifying element to $(V_1-|V_{th}1|+V_{Data})$.

According to the present invention, there is provided a method of driving a semiconductor device, the semiconductor device comprising:
a first rectifying element;
a second rectifying element; and
capacitor means;
characterized in that:
an electric potential $V_1$ of a first electric power source is imparted to the first electrode of the first rectifying element;
a second electrode of the first rectifying element is electrically connected to a first electrode of the capacitor means and a first electrode of the second rectifying element; and
a first signal having an electric potential greater than or equal to an electric potential $V_2$ and less than or equal to an electric potential $V_2'$ is input to a the second electrode of the second rectifying element;
the method of driving the semiconductor device comprising:
when a threshold voltage of the first rectifying element is taken as $V_{th}1$ and a threshold voltage of the second rectifying element is taken as $V_{th}2$,
a first step of setting the electric potential of a second electrode of the second capacitor means to $V_2$,' and setting the electric potential of the second electrode of the first rectifying element to $(V_2'-|V_{th}2|)$; and
a second step of setting the electric potential of a second electrode of the second capacitor means to $V_2$, making the voltage between both electrodes of the first rectifying element converge to the threshold voltage $V_{th}1$, and setting the electric potential of the second electrode of the first rectifying element to $(V_1+V_{th}1)$.

According to the present invention, there is provided a method of driving a semiconductor device, the semiconductor device comprising:
a first rectifying element;
a second rectifying element; and
capacitor means,
characterized in that:
an electric potential $V_1$ of a first electric power source is imparted to a first electrode of the first rectifying element;
a second electrode of the first rectifying element is electrically connected to a first electrode of the capacitor means and a first electrode of the second rectifying element;
a first signal having an electric potential greater than or equal to an electric potential $V_2$ and less than or equal to an electric potential $V_2'$ is input to a second electrode of the second rectifying element; and
a second signal having an electric potential that is greater than or equal to an electric potential $V_3$ and less than or equal to $(V_3+$an electric potential $V_{Data})$, or greater than or equal to $(V_3-V_{Data})$ and less than or equal to $V_3$, is input to a second electrode of the capacitor means;

the method of driving the semiconductor device comprising:

when a threshold voltage of the first rectifying element is taken as $V_{th}1$ and a threshold voltage of the second rectifying element is taken as $V_{th}2$, a first step of setting the electric potential of the second electrode of the second capacitor means to $V_2'$, and setting the electric potential of the second electrode of the first rectifying element to $(V_2'-|V_{th}2|)$;

a second step of setting the electric potential of a second electrode of the second capacitor means to $V_2$, making the voltage between both electrodes of the first rectifying element converge to the threshold voltage $V_{th}1$, and setting the electric potential of the second electrode of the first rectifying element to $(V_1+V_{th}1)$; and a third step of changing the electric potential of the second electrode of the capacitor means by $V_{Data}$, and setting the electric potential of the second electrode of the first rectifying element to $(V_1+V_{th}1\pm V_{Data})$.

According to the present invention, there is provided a method of driving a semiconductor device, characterized in that:

the semiconductor device further comprises a transistor; and a gate electrode of the transistor is electrically connected to the second electrode of the first rectifying element.

According to the present invention, there is provided a method of driving a semiconductor device, characterized in that:

the rectifying element is formed by using a transistor having a connection between its gate and its drain;

$V_1<V_2$ if the transistor having a connection between its gate and its drain is an n-channel transistor; and $V_1>V_2$ if the transistor having a connection between its gate and its drain is a p-channel transistor.

According to the present invention, there is provided a method of driving a semiconductor device, characterized in that:

the first rectifying element is formed by using a transistor having a connection between its gate and its drain;

$V_1<V_2$ if the transistor having a connection between its gate and its drain is an n-channel transistor; and $V_1>V_2$ if the transistor having a connection between its gate and its drain is a p-channel transistor.

BRIEF DESCRIPTION OF THE DRAWINGS

In the accompanying drawings:

FIGS. 5A to 5C are diagrams for explaining an embodiment mode of the present invention, and operation of the embodiment mode;

FIGS. 6A to 6C are diagrams for explaining an embodiment mode of the present invention, and operation of the embodiment mode;

DETAILED DESCRIPTION OF THE PREFERRED EMBODIMENTS

Embodiment Mode 1

Figure 1A:
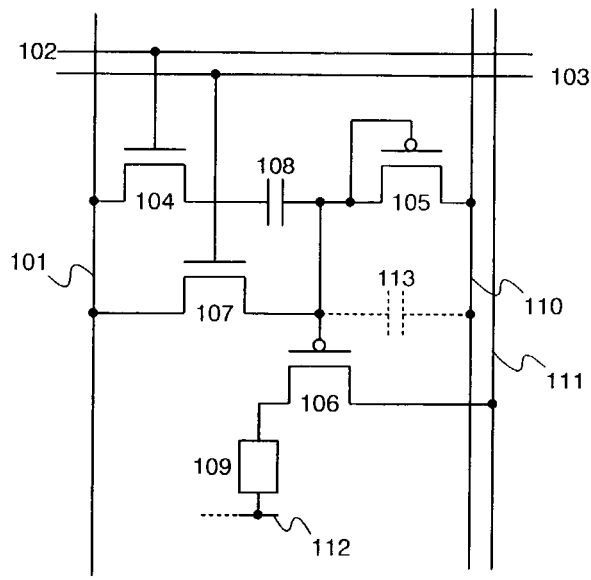
FIGS. 1A and 1B are diagrams for explaining an embodiment mode of the present invention, and operation of the embodiment mode.

Embodiment Mode 1 of the present invention is shown in FIG. 1A. Embodiment Mode 1 has a source signal line 101, a first gate signal line 102, a second gate signal line 103, TFTs 104 to 107, capacitor means 108, an EL element 109, a reset electric power source line 110, an electric current supply line 111, and an electric power source line 112. In addition, a storage capacitor means 113 for storing an image signal may also be formed.

A gate electrode of the TFT 104 is connected to the first gate signal line 102, a first electrode of the TFT 104 is connected to the source signal line 101, and a second electrode of the TFT 104 is connected to a first electrode of the capacitor means 108. A gate electrode and a first electrode of the TFT 105 are connected with each other, and also connected to a second electrode of the capacitor means 108. A second electrode of the TFT 105 is connected to the reset electric power source line 110. A gate electrode of the TFT 106 is connected to the second electrode of the capacitor means 108, and to the gate electrode and the first electrode of the TFT 105. A first electrode of the TFT 106 is connected to the electric current supply line 111, and a second electrode of the TFT 106 is connected to a first electrode of the EL element 109. A second electrode of the EL element 109 is connected to the electric power source line 112, and has a mutual electric potential difference with the electric current supply line 111. A gate electrode of the TFT 107 is connected to the second gate signal line 103, a first electrode of the TFT 107 is connected to the source signal line 101, and a second electrode of the TFT 107 is connected to the gate electrode of the TFT 106. When forming the storage capacitor means 113, formation is possible between the gate electrode of the TFT 106 and a position at which a fixed electric potential can be obtained, such as the electric current supply line 111.

Figure 1B:
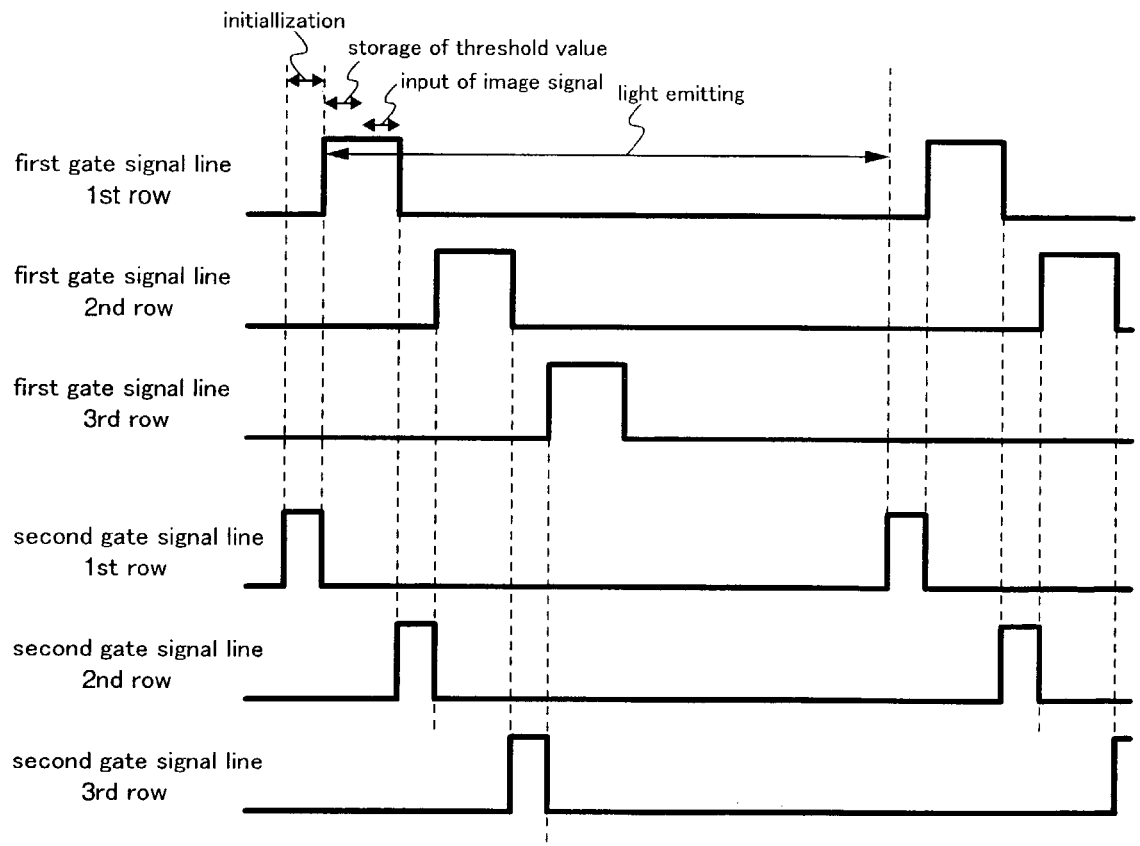

FIG. 1B shows the timing at which pulses are input to the first and the second gate signal lines. Operation is explained using FIGS. 1A and 1B, and FIGS. 2A to 2D. Note that although a structure is used here wherein the TFTs 104 and 107 are n-channel TFTs, and the TFTs 105 and 106 are p-channel TFTs, the TFTs 104 and 107 may have any polarity, provided that they function as simple switching elements.

The electric potential of the reset electric power source line 110 is $V_{Reset}$, and the electric potential of the electric current supply line 111 is $V_{DD}$, where $V_{Reset} < V_{DD}$. The electric potential of the source signal line 101 first becomes $V_{SS}$ (where $V_{SS} < V_{Reset}$), and in addition, the second gate signal line 103 becomes H level and the TFT 107 turns on. The electric potentials of the gate electrodes of the TFTs 105 and 106 thus drop. The voltage between the gate and the source of the TFT 106 soon becomes less than the threshold value, and the TFT 106 turns on. The voltage between the gate and the source of the TFT 105 also becomes less than the threshold value, and the TFT 105 also turns on (see FIG. 2A). Although the TFT 104 is off in FIG. 2A at this point, it may also be on during this period.

Figure 2A:
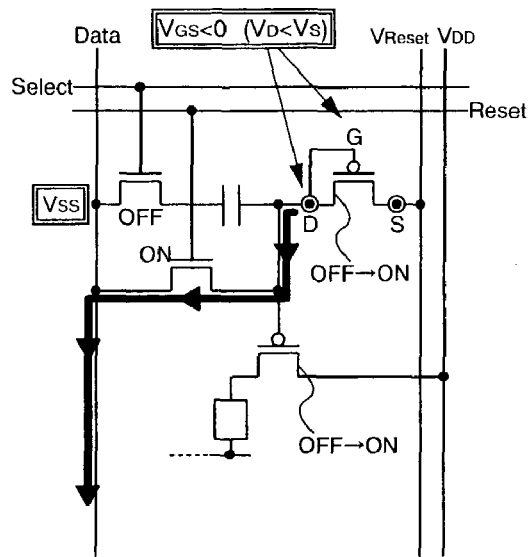
FIGS. 2A to 2E are diagrams for explaining an embodiment mode of the present invention, and operation of the embodiment mode.
Figure 2B:
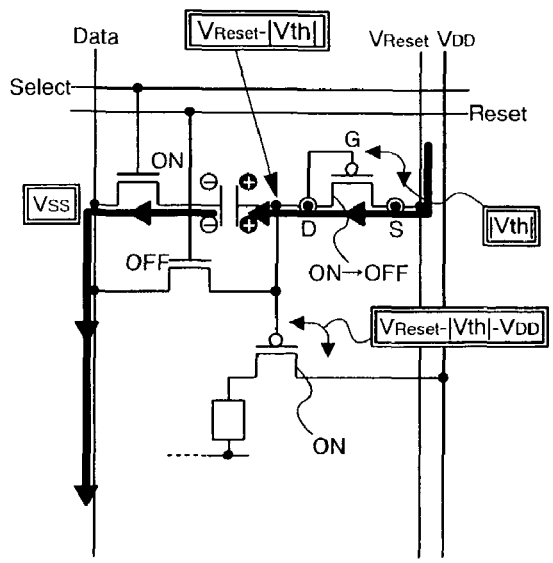

An electric current path develops from the reset electric power source line 110 to the TFT 105 to the TFT 107 and to the source signal line 101 when the TFT 105 turns on. The second gate signal line 103 therefore becomes L level after the TFT 105 turns on, and the TFT 107 turns off. The first gate signal line 102 becomes H level at the same time, and the TFT 104 turns on. Electric charge thus moves as shown in FIG. 2B. The TFT 105 is on, and therefore the electric potentials of the gate electrodes of the TFTs 105 and 106 increase. The gate and the drain of the TFT 105 are connected here, and therefore the TFT 105 turns off at the point when the voltage between the gate and the source of the TFT 105, that is, the voltage between the source and the drain of the TFT 105, becomes equal to the threshold value. The electric potentials of the gate electrodes of the TFTs 105 and 106 is ($V_{Reset} - |V_{th}|$) at this point. In focusing on the capacitor means 108, however, electric charge accumulates such that the voltage between both electrodes of the capacitor means 108 becomes ($V_{Reset} - |V_{th}| - V_{SS}$).

Figure 2C:
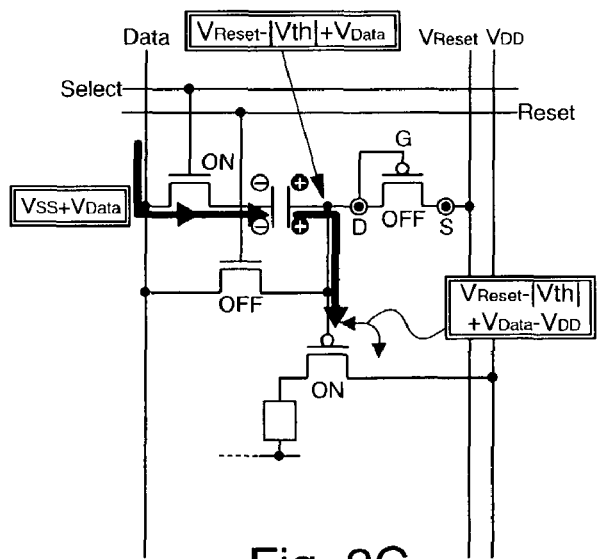
Figure 2D:
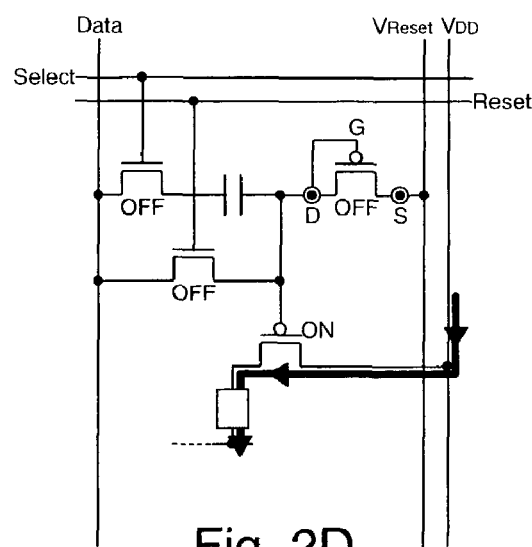

An image signal is then input from the source signal line 101 (see FIG. 2C). The electric potential of the source signal line 101 changes by $V_{Data}$ from $V_{SS}$. The electric potentials of the gate electrodes of the TFTs 105 and 106 also change by $V_{Data}$ due to capacitive coupling with the capacitor means 108. The TFT 105 should not turn on at this point. Conditions of the values of $V_{Data}$ at this point are discussed below. On the other hand, the electric potential of the source of the TFT 106 is $V_{DD}$ (where $V_{DD} > V_{Reset}$), and the voltage between the gate and the source of the TFT 106 becomes ($V_{Reset} - |V_{th}| + V_{Data} - V_{DD}$). A drain current corresponding to the voltage between the gate and the source of the TFT 106 is supplied to the EL element 109, and light is emitted (see FIG. 2D).

Figure 2E:
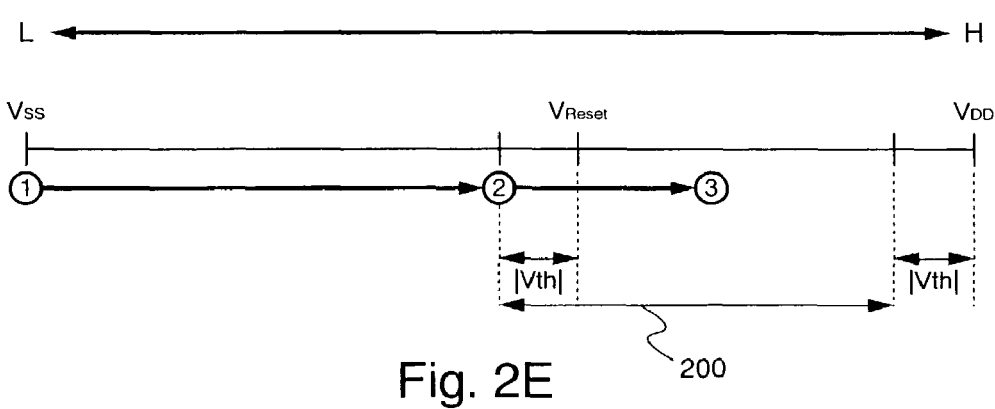

The relationship between the sizes of the electric potential $V_{Reset}$ of the reset electric power source line 110, the electric potential $V_{DD}$ of the electric current supply line 111, the electric potential of the source signal line 101, and the image signal $V_{Data}$ is explained here using FIG. 2E.

First of all, the fixed electric potential size relationship follows $V_{SS} < V_{Reset} < V_{DD}$.

Next, consider the electric potentials of the gate electrodes of the TFTs 105 and 106. The electric potentials of the gate electrodes of the TFTs 105 and 106 become the electric potential shown by symbol [1] in FIG. 2E due to the initialization of FIG. 2A, that is, $V_{SS}$. The electric potentials of the gate electrodes of the TFTs 105 and 106 rise in the period during which storage of the threshold value is performed, and finally arrive at the electric potential shown by symbol [2] in FIG. 2E, that is, ($V_{Reset} - |V_{th}|$). The electric potentials then additionally change by $V_{Data}$ from the potential shown by symbol [2] when the image signal is input. The electric potentials of the gate electrodes of the TFTs 105 and 106 become lower than the electric potential of symbol [2] in the case where $V_{Data}$ is a negative value. That is, the voltage between the gate and the source of the TFT 105 becomes lower than the threshold value, and the TFT 105 turns on, and this is contrary to the previous conditions. It is therefore necessary for $V_{Data}$ to be a positive value. The electric potentials of the TFTs 105 and 106 become electric potentials shown by symbol [3] in FIG. 2E due to the input image signal, that is, ($V_{Reset} - |V_{th}| + V_{Data}$). Further, the TFT 106 turns off if the electric potential of the gate electrode of the TFT 106 becomes higher than $V_{DD} - |V_{th}|$, and therefore the range of electric potential values which the image signal $V_{Data}$ is capable of taking is the range denoted by reference numeral 200 in FIG. 2E. In other words, it is necessary that the following relationship be true: $0 \leq V_{Data} \leq V_{DD} - V_{Reset}$ (preferably, $0 < V_{Data} \leq V_{DD} - V_{Reset}$ to ensure that the TFT 105 turns off). However, at a gray scale 0, that is, when the EL element 109 is in a state of absolutely no light emission, an electric potential that is slightly higher than the electric potential at which the TFT 106 turns off, in other words, slightly higher than ($V_{DD} - V_{Reset}$), may be applied.

The closer $V_{Data}$ comes to zero at this point, the larger the absolute value of the voltage between the gate and the source of the TFT 106, and therefore the higher the brightness of the EL element 109 becomes. The larger $V_{Data}$ becomes, the smaller the absolute value of the voltage between the gate and the source of the TFT 106 becomes, and therefore the brightness of the EL element 109 is low.

Display of an image is performed by performing the above operations over one screen. Storage of the threshold value is accomplished in the present invention by using only the capacitor means 108, and therefore it is possible to perform accurate correction of the threshold value without dispersion in the capacitance values influencing the value of electric current flowing in the EL elements 109, as discussed above.

Embodiment Mode 2

A digital gray scale method for controlling the EL element 109 in only two states, one having a brightness of 100% and one a brightness of 0%, by using a region in which it is difficult for TFT threshold values and the like to influence the on electric current is proposed as a method differing from the analog gray scale method discussed above. Only two gray scales, white and black, can be achieved by this method, and therefore multiple gray scales are realized by combining this method with a time gray scale method, a surface area gray scale method, or the like.

The term time gray scale method refers to a method in which a visible brightness difference can be achieved by utilizing a difference in the amount of time that the EL elements 109 emit light. The operation of this method will be described in detail in another section of this specification, and only two states of the EL elements 109, that is, light emission and non-light emission, need to be used with this type of driving method. Therefore only two electric potentials need to be imparted by the image signal $V_{Data}$, that is, H level and L level.

The TFT 106 is a p-channel TFT here, and therefore the EL element 109 emits light when $V_{Data}$ is L level, and the EL element 109 does not emit light when $V_{Data}$ is H level. From the conditions of $V_{Data}$ shown in Embodiment Mode 1, the electric potential is in the range shown by the reference numeral 200 in FIG. 2E and as much electric current as possible can be supplied to the EL element 109 at this point when $V_{Data}$ is L level. In addition, an electric potential at which the TFT 105 does not turn on may also be used. In other words, an electric potential equal to, or slightly greater than, $(V_{Reset}-|V_{th}|)$ may be used. On the other hand, an electric potential able to ensure that the TFT 106 turns off may be used when $V_{Data}$ is H level. It is not particularly necessary that the electric potential be in the range denoted by the reference numeral 200 for this case. Rather, it is desirable that an electric potential higher than the range denoted by the reference numeral 200 (for example, $V_{DD}$ or the like) be input.

Embodiment Mode 3

Figure 3A:
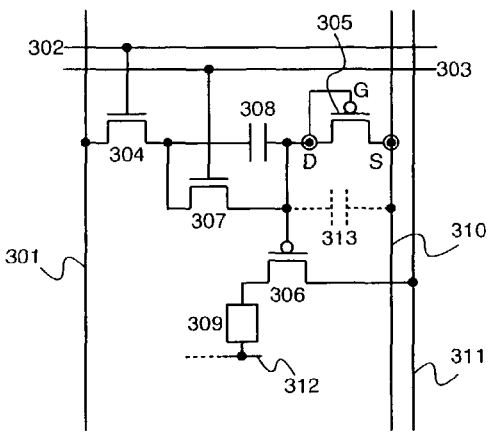
FIGS. 3A to 3E are diagrams for explaining an embodiment mode of the present invention, and operation of the embodiment mode.
Figure 3B:
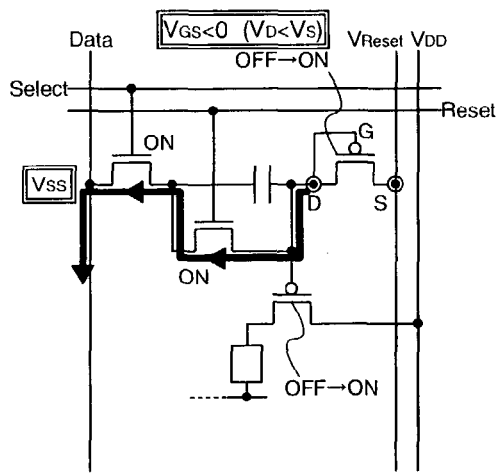

An example in which some TFT connections differ is shown in FIG. 3A as a third embodiment mode. Although generally similar to the structure shown in FIG. 1A, there is a difference in that a first electrode of a TFT 307 is connected to a second electrode of a TFT 304, not to a source signal line.

Operation is explained following FIGS. 3B to 3E. The electric potential of a reset electric power source line 310 is $V_{Reset}$, and the electric potential of an electric current supply line 311 is $V_{DD}$, such that $V_{Reset}<V_{DD}$. First, the electric potential of a source signal line 301 becomes $V_{SS}$ (where $V_{SS}<V_{Reset}$), and in addition, first and second gate signal lines 302 and 303 become H level, while TFTs 304 and 307 turn on. The electric potentials of gate electrodes of TFTs 305 and 306 thus drop. The voltage between the gate and the source of the TFT 305 soon becomes lower than the threshold value of the TFT 305, which turns on, and the voltage between the gate and the source of the TFT 306 becomes lower than the threshold value of the TFT 306, which also turns on (see FIG. 3B).

Figure 3C:
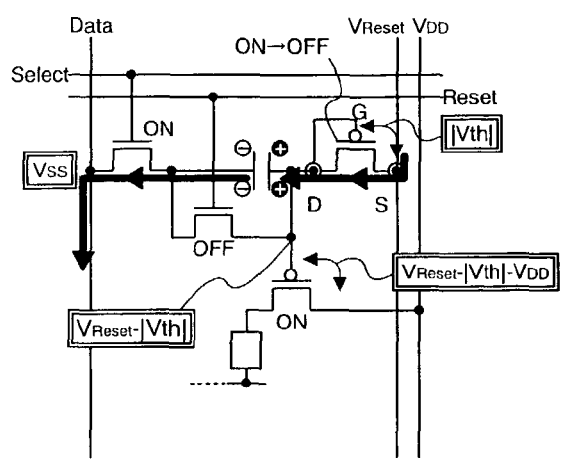

An electric current path from the reset electric power source line 310 to the TFT 305, to the TFT 307, to the TFT 304, and to the source signal line 301 develops due to the TFT 305 turning on. The second gate signal line 303 therefore becomes L level immediately after both the TFTs 305 and 306 turn on, and the TFT 307 turns off. Movement of electric charge as shown in FIG. 3C thus develops. The TFT 305 is on, and therefore the electric potentials of the gate electrodes of the TFTs 305 and 306 rise. The gate and the drain of the TFT 305 are connected here, and therefore the TFT 305 turns off at the point when the voltage between the gate and the source of the TFT 305, that is the voltage between the source and the drain of the TFT 305, becomes equal to the threshold value $V_{th}$. The electric potentials of the gate electrodes of the TFTs 305 and 306 are $(V_{Reset}-|V_{th}|)$ at this point. In focusing on the capacitor means 308, however, electric charge accumulates by the amount that the electric potential of the second electrode changes.

Figure 3D:
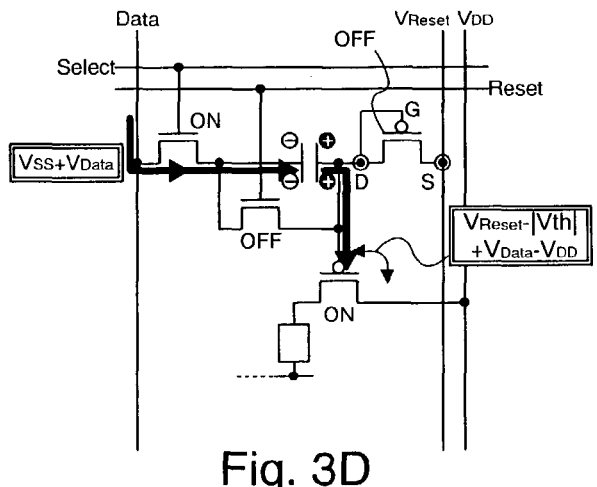
Figure 3E:
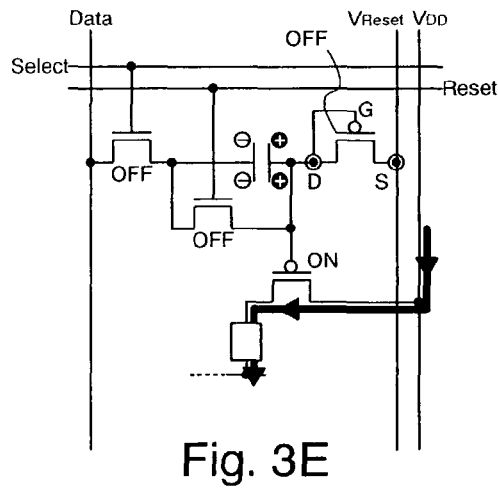

An image signal is then input from the source signal line 301 (see FIG. 3D). The electric potential of the source signal line 301 changes by $V_{Data}$ from $V_{SS}$. The electric potentials of the gate electrodes of the TFTs 305 and 306 also change by $V_{Data}$ due to capacitive coupling with the capacitor means 308. The TFT 305 does not turn on at this point. On the other hand, the electric potential of the source of the TFT 306 is $V_{DD}$ (where $V_{DD}>V_{Reset}$), and the voltage between the gate and the source of the TFT 306 becomes $(V_{Reset}-|V_{th}|+V_{Data}-V_{DD})$. A drain current corresponding to the voltage between the gate and the source of the TFT 306 is supplied to the EL element 309, and light is emitted (see FIG. 3E).

Embodiment Mode 4

Figure 9A:
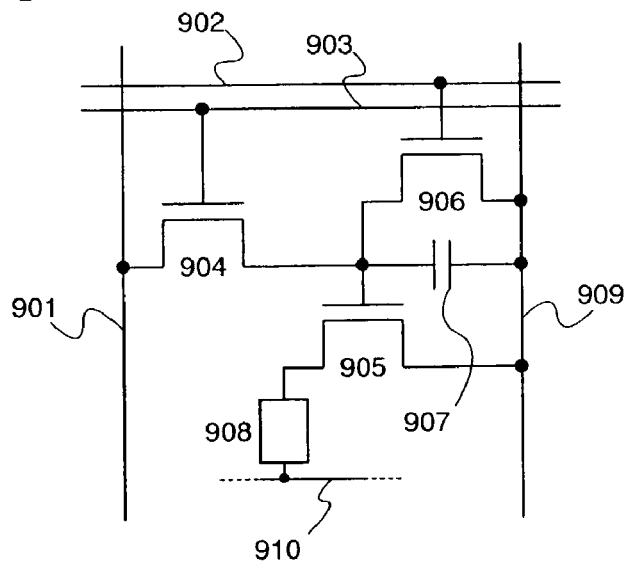
FIGS. 9A to 9C are diagrams for explaining a method combining a digital gray scale method and a time gray scale method.

A method of combining a digital gray scale method and a time gray scale method is explained here. The structure of a pixel shown in FIG. 9A is an example that can be employed by driving with using this type of method. It becomes possible to minutely control the length of time during which light is emitted by using an erasure TFT 906 in addition to a switching TFT 904, and a driver TFT 905.

Figure 9B:
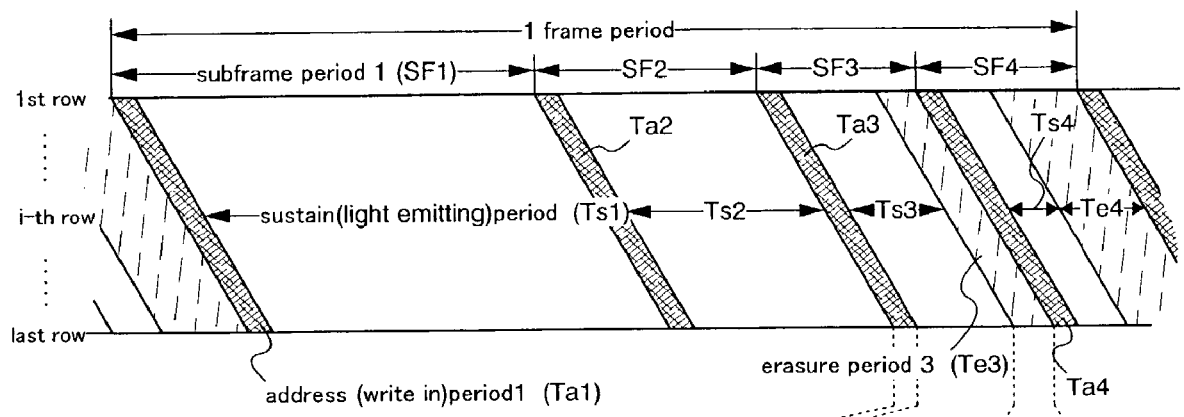
Figure 9C:
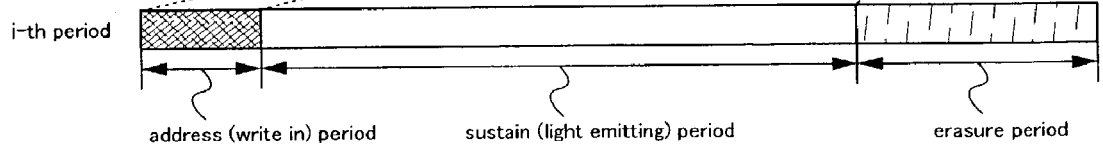
Figure 10A:
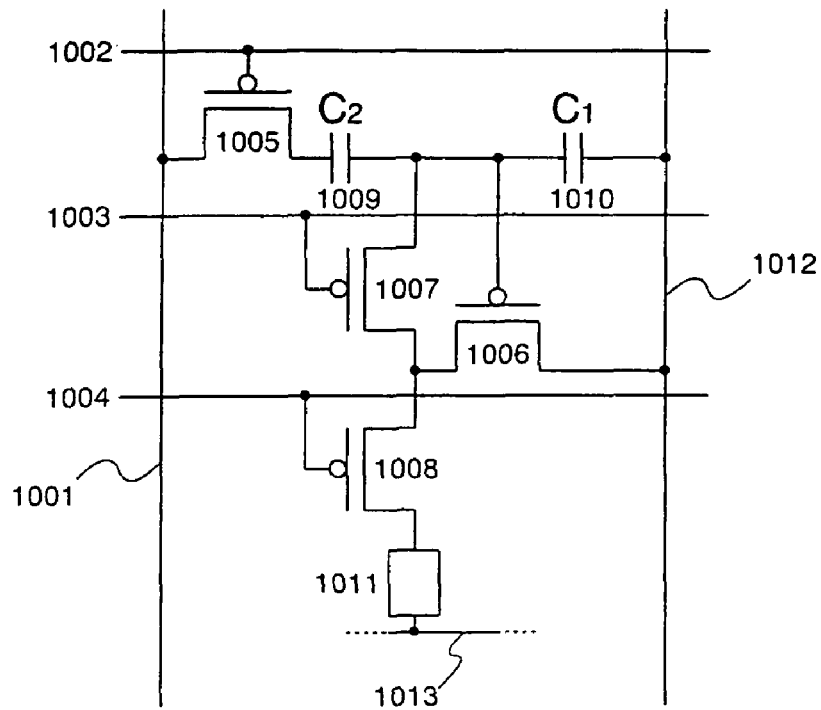
FIGS. 10A and 10B are diagrams for explaining an example of a pixel of a light emitting device capable of correcting dispersions in TFT threshold values, and operation of the light emitting device pixel.
Figure 10B:
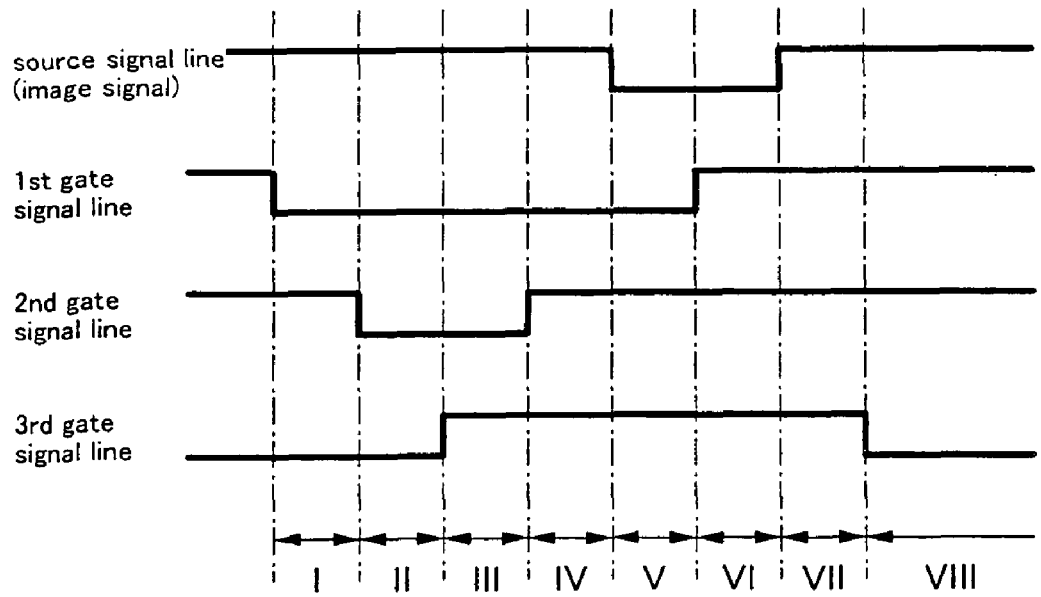
Figure 11A:
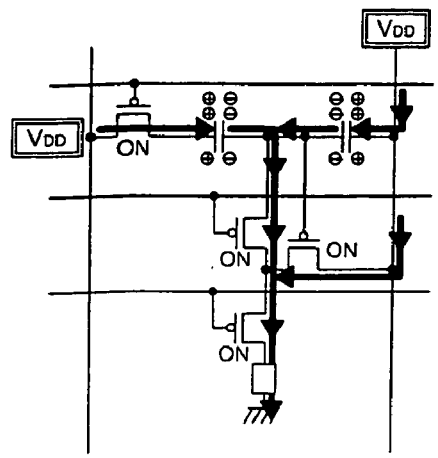
FIGS. 11A to 11F are diagrams for explaining an example of a pixel of a light emitting device capable of correcting dispersions in TFT threshold values, and operation of the light emitting device pixel.
Figure 11B:
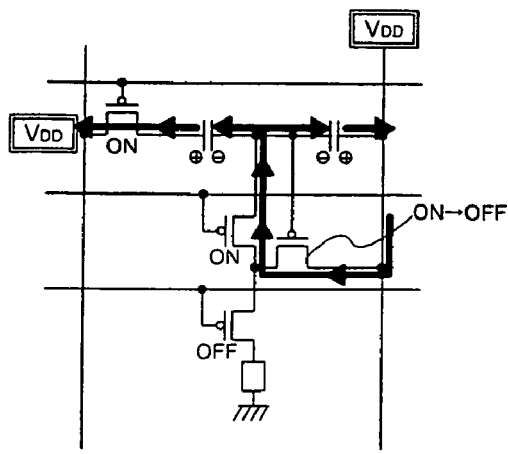
Figure 11C:
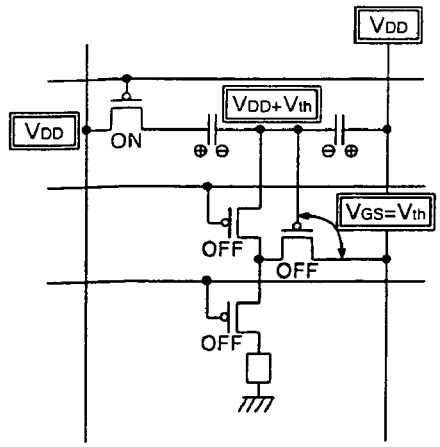
Figure 11D:
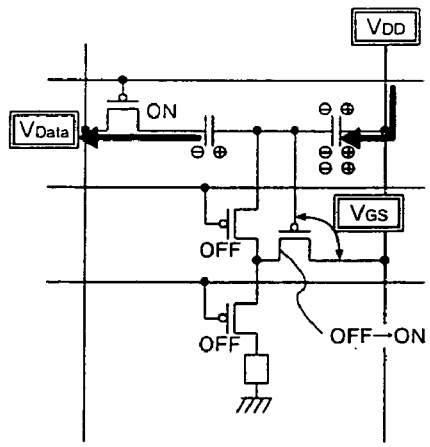
Figure 11E:
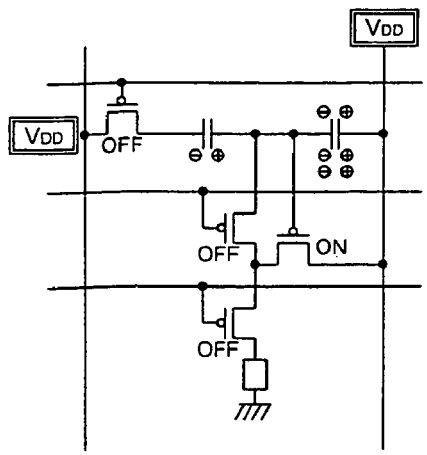
Figure 11F:
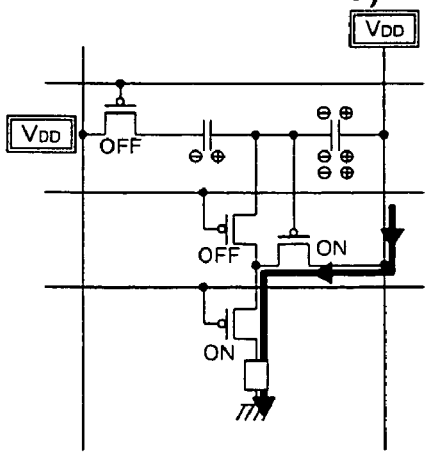

One frame period is divided into a plurality of subframe periods when combining a digital gray scale method and a time gray scale method, as shown in FIG. 9B. Each of the subframe periods has an address (write in) period and a sustain (light emitting) period as shown in FIG. 9C, and in addition, an erasure period if necessary. A method of gray scale expression may be used, for example, in which the number of subframe periods are formed corresponding to the number of display bits, and the lengths of the sustain (light emitting) period in each of the subframe periods are taken as $2^{(n-1)}:2^{(n-2)}:\ldots:2:1$. Light emission or non-light emission by the EL element is selected for each sustain (light emitting) period, and gray scale expression is performed by utilizing the difference in the lengths of the total time during which the EL element emits light in one frame period. It is recognized that brightness increases with a longer total light emitting period, and brightness decreases with a shorter total light emitting period. A 4-bit gray scale example is shown in FIG. 9B, and one frame period is divided into four subframe periods. By combining the subframe periods with sustain (light emitting) periods, $2^4=16$ gray scales can be expressed. Note that the number of divisions of the frame period is not limited to four, and that it is also possible to further divide the frame period into more subframe periods.

Further, it is not always necessary that the relative lengths of the sustain (light emitting) periods during gray scale expression be $2^{(n-1)}:2^{(n-2)}:\ldots:2:1$.

The length of the sustain (light emitting) period of lower bits becomes very short when forming multiple gray scales by this method, and therefore a period develops, after the sustain (light emitting) period is complete and the next address period immediately begins, during which address (write in) periods of different subframe periods overlap. In this case, an image signal input to a certain pixel is also input at the same time to different pixels, and correct display therefore cannot be performed. The erasure period is formed in order to solve this problem, and is formed after Ts3 and Ts4 in FIG. 9B so that address (write in) periods belonging to adjacent subframe periods do not overlap. Erasure periods are not formed in SF1 and SF2, which have long sustain (light emitting) periods and in which there is no concern that address (write in) periods belonging to adjacent subframe periods will overlap.

Figure 4A:
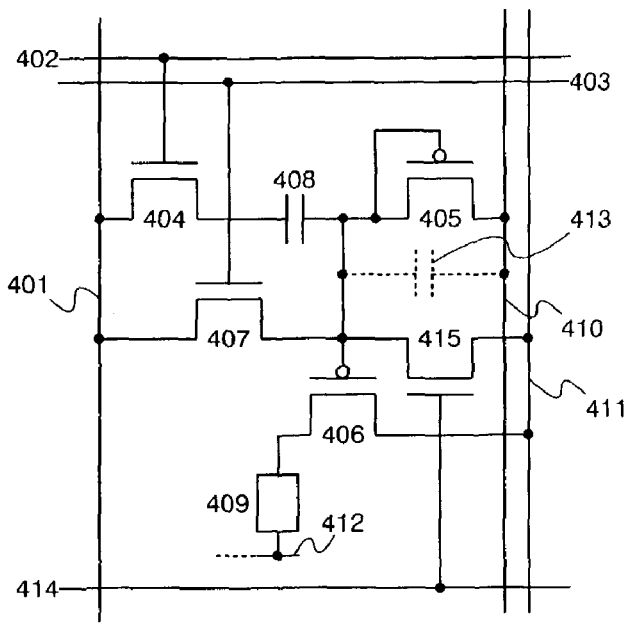
FIGS. 4A to 4C are diagrams for explaining an embodiment mode of the present invention, and operation of the embodiment mode.

FIG. 4A shows a method of combining a digital gray scale method and a time gray scale method, wherein a third gate signal line 414 and an erasure TFT 415 are added to the pixel structure shown in Embodiment Mode 1. A gate electrode of the erasure TFT 415 is connected to the third gate signal line 414, a first electrode of the erasure TFT 415 is connected to a gate signal line of a TFT 406, and a second electrode of the erasure TFT 415 is connected to an electric current supply line 411. Further, in the case where a storage capacitor means 413 for storing an image signal is formed, it may be formed between a gate electrode of the TFT 406 and a location at which a fixed electric potential can be obtained. The storage capacitor means 413 is formed between the gate electrode of the TFT 406 and the electric current supply line 411 in FIGS. 4A to 4C, but it may also be formed, for example, between the gate electrode of the TFT 406 and a prior stage gate signal line. Further, it may also be formed between a second electrode of the TFT 404 and a fixed electric potential such as the electric current supply line 411, and it may be formed on both if there is a desire to make the storage capacitance larger.

Operations from initialization, to input of an image signal, and to light emission is similar to the explanation provided in Embodiment Mode 1. Note that the erasure TFT 415 is off during initialization, input of the image signal, and the sustain (light emitting) period.

Figure 12A:
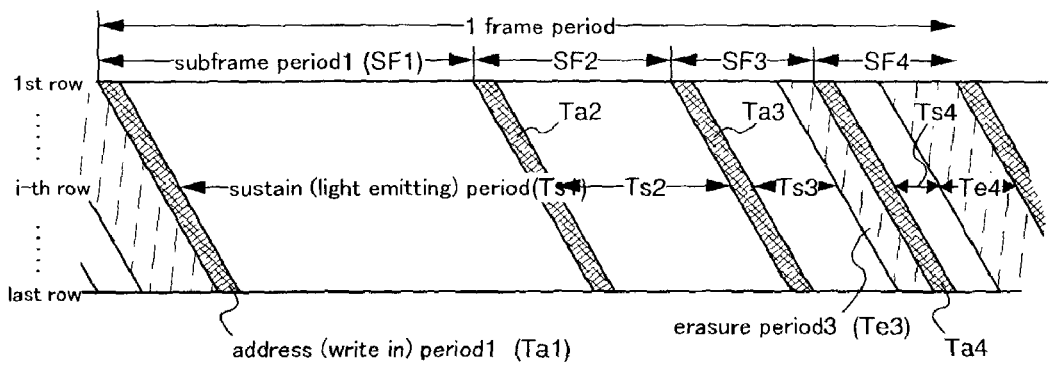
FIGS. 12A to 12C are diagrams for explaining operation when a method combining a digital gray scale method and a time gray scale method is used in the present invention.
Figure 12B:
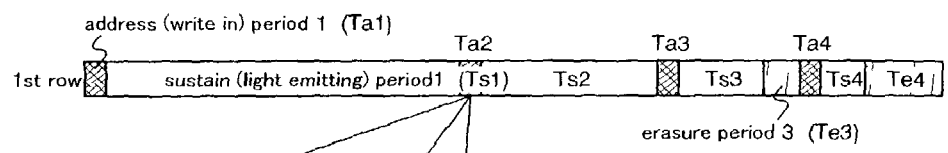

Operation from the sustain (light emitting) period to the erasure period is explained here using FIGS. 4A to 4C, and FIGS. 12A to 12C. FIG. 12A is similar to the diagram shown in FIG. 9B, and one frame period has four subframe periods. Subframe periods SF3 and SF4, which have short sustain (light emitting) periods, each have erasure periods Te3 and Te4, as shown in FIG. 12B. Operation during the sustain period SF3 is taken as an example here for explanation.

Figure 4B:
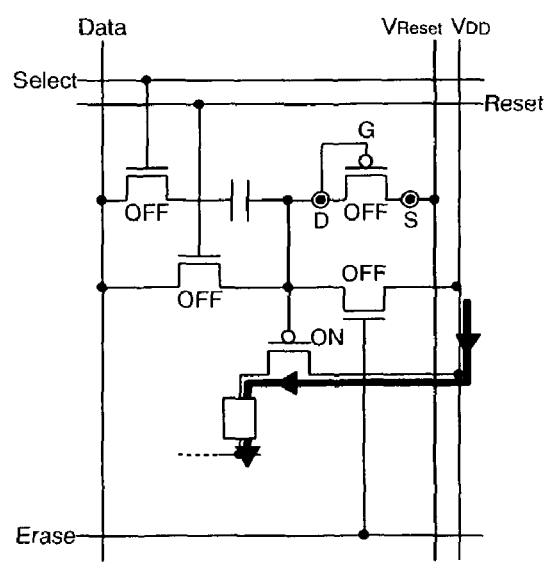
Figure 4C:
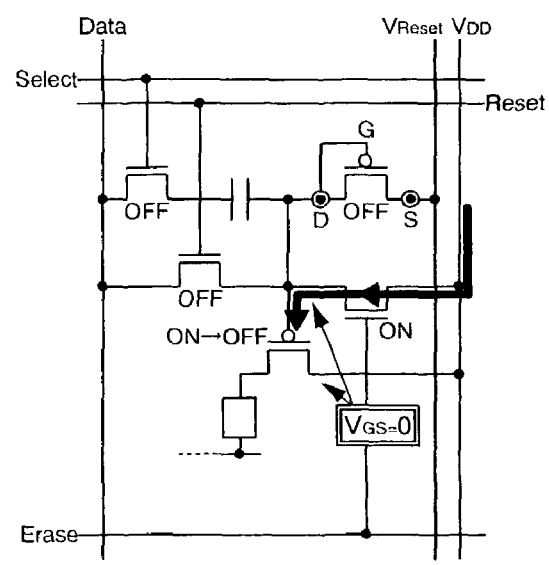

Electric current corresponding to the voltage between the gate and the source of the TFT 406 flows in the EL element 409 as shown in FIG. 4B after input of the image signal is complete. A pulse is then input to the third gate signal line 414 when a timing for completion of the corresponding sustain (light emitting) period is complete, the third gate signal line 416 becomes H level, and the TFT 415 turns on. The voltage between the gate and the source of the TFT 406 is zero, as shown in FIG. 4C. The TFT 406 thus turns off by this operation, and electric current to the EL element 409 is cut off. The EL element 409 is therefore forcibly placed in a non-light emitting state.

Figure 12C:
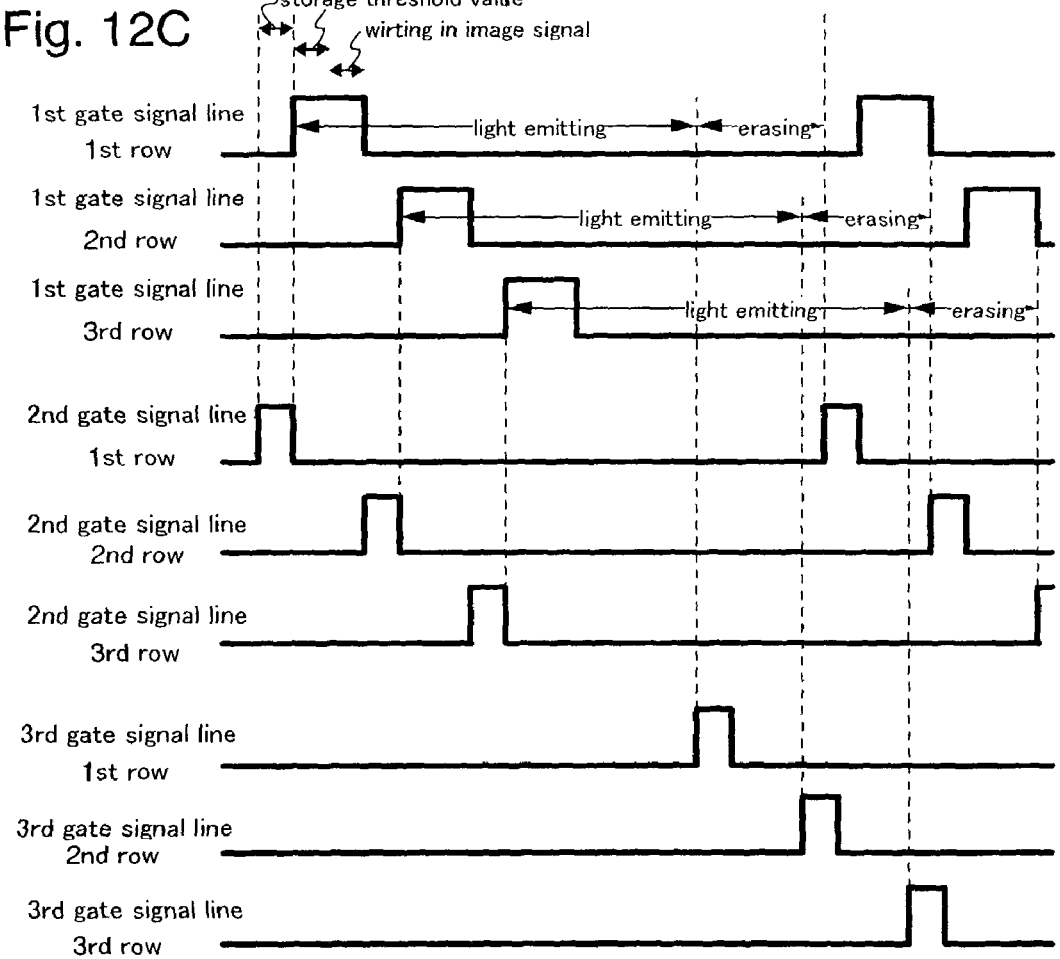

The timing chart for these operations is shown in FIG. 12C. Periods for performing initialization, threshold value storage, and write in of the image signal are contained in the address (write in) period. A period beginning after a pulse is input to the third gate signal line 414 after the sustain (light emitting) period and the EL element 409 becomes non-light emitting, up through when a pulse is next input to the second gate signal line 403 and initialization begins, is the erasure period.

Embodiment Mode 5

An example of performing erasure operations using a structure that differs from the structure of Embodiment Mode 4 is explained using FIGS. 5A to 5C in Embodiment Mode 5.

FIG. 5A shows a structure having the erasure TFT 415, similar to Embodiment Mode 4. However, although the first electrode of the TFT 415 is connected to the gate electrode of the TFT 406, namely to a second electrode of capacitor means 408 in Embodiment Mode 4, the first electrode of the TFT 415 is connected to a first electrode of the capacitor means 408 in FIG. 5.

Electric current corresponding to the voltage between the gate and the source of the TFT 406 flows in the EL element 409 as shown in FIG. 5B after input of the image signal is complete. A pulse is then input to the third gate signal line 414, which becomes H level, when a timing for completion of the corresponding sustain (light emitting) period is reached, and the TFT 415 turns on. The electric potential of the first electrode of the capacitor means 408 becomes $V_{DD}$, as shown in FIG. 5C. The electric potential of the gate electrode of the TFT 406 consequently becomes higher than $V_{DD}$, and therefore the voltage between the gate and the source becomes a positive value. The TFT 406 thus turns off by this operation, electric current to the EL element 409 is cut off, and the EL element 409 is forcibly placed in a non-light emitting state.

Operations during the erasure period are such that electric current to the EL element 409 is cut off by making the voltage between the gate and the source of the TFT 406, which functions as a driver TFT in order to supply electric current to the EL element 409, a voltage at which the TFT 406 turns off. Provided that operation is based upon this principle, there are no limitations placed on the placement of the erasure TFT 415.

Embodiment Mode 6

Operation during the erasure period in Embodiment Modes 4 and 5 is such that electric current to the EL element 409 is cut off by making the voltage between the gate and the source of the TFT 406, which functions as a driver TFT for supplying electric current to the EL element 409, a voltage at which the TFT 406 turns off. An example of using another method is shown in FIG. 6A. The erasure TFT 415 is formed between the electric current supply line 411 and the gate electrode of the TFT 406, or between the electric current supply line 411 and the first electrode of the capacitor means 408 in Embodiment Modes 4 and 5. However, the erasure TFT 415 is formed between the TFT 406 and the EL element 409 in Embodiment Mode 6. That is, a TFT is added in any place of the pathway from the electric current supply line to the TFT 406 and to the EL element 409 with the method of Embodiment Mode 6, and the supply of electric current to the EL element 409 is cut off by turning this TFT off.

Initialization, input of an image signal, and light emission are similar to those of Embodiment Modes 4 and 5. However, the erasure TFT 415 is on only during the sustain (light emitting) period, and electric current flows as shown in FIG. 6B. The TFT 415 is off during initialization, input of the image signal, and during the erasure period, and electric current to the EL element 409 is cut off during these periods.

Differences in operation between Embodiment Mode 6 and Embodiment Modes 4 and 5 are explained. The voltage between the gate and the source of the TFT 406 is controlled by turning the erasure TFT 415 on once in Embodiment Modes 4 and 5, and therefore the EL element 409 does not emit light after this operation is performed until the next image signal is written in. Consequently, pulses input to the third gate signal line 414 may be short pulses input at a timing at which the erasure period begins, as shown in FIG. 12C. In Embodiment Mode 6, however, it is necessary for the erasure TFT 415 to be on throughout the sustain (light emitting) period, and therefore it is necessary to input pulses to the third gate signal line 415, the pulses lengths equal to the sustain (light emitting) periods, for each of the subframe periods.

Further, although the erasure TFT 415 uses an n-channel TFT in Embodiment Modes 4, 5, and 6, there are no particular limitations placed on the polarity in Embodiment Mode 6 because the erasure TFT 415 functions solely as a switching element.

Embodiment Mode 7

Figure 7A:
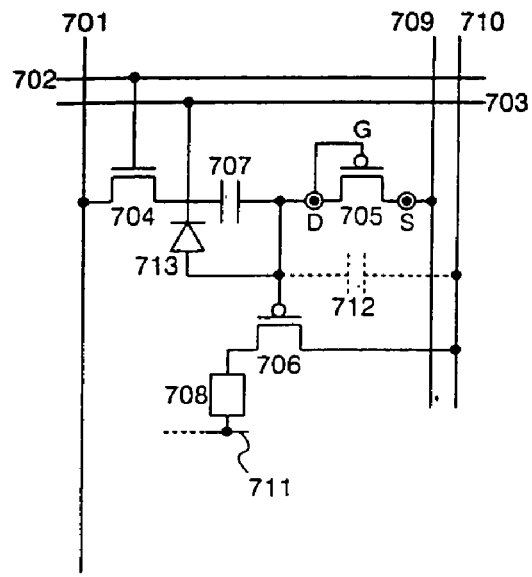
FIGS. 7A to 7D are diagrams for explaining an embodiment mode of the present invention, and operation of the embodiment mode.

Initialization operations prior to the input of image signals are performed by using a certain TFT in Embodiment Modes 1 to 6. Specifically, a threshold value appearing between the source and the drain of a TFT, which has a connection between a gate electrode and a drain electrode, is obtained. In contrast, a diode 713 is used as a substitute for the TFT in FIG. 7A. A first electrode of the diode 713 is connected to a gate electrode of a TFT 706, and a second electrode of the diode 713 is connected to a second gate signal line 703. Further, if capacitor means 712 is formed in order to store image signals, then the capacitor means may be formed between the gate electrode of the TFT 706 and a location at which a fixed electric potential can be obtained, such as an electric current supply line 710. Furthermore, the capacitor means 712 may also be formed between a second electrode of a TFT 704 and a location at which a fixed electric potential can be obtained, such as the electric current supply line 710. The capacitor means may also be formed in both locations if a large value of storage capacitance is desired. Reference numerals 701, 707, 709 and 711 denote a source signal line, a capacitor means, a reset power source line and a power supply line, respectively.

Only operations during initialization differ from Embodiment Mode 1. Explanations regarding input of an image signal and light emitting operations are omitted here. Operations during initialization are explained using FIG. 7B.

Figure 7B:
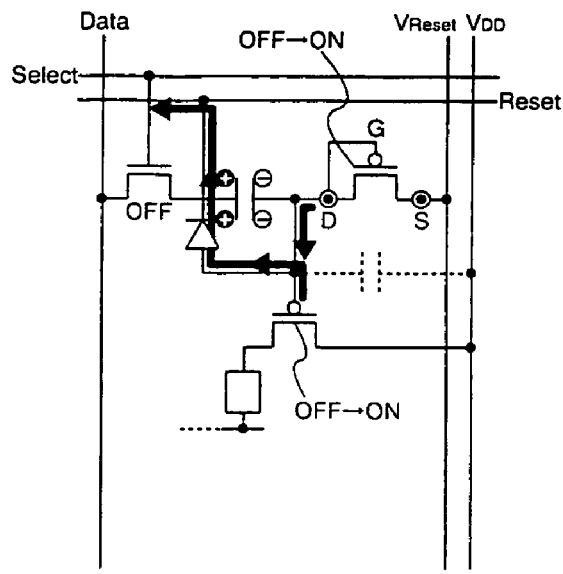

First, the electric potential of the second gate signal line 703 is set to H level (for example, $V_{DD}$). A forward bias is then imparted to the diode 713 if the electric potential of the second gate signal line 703 is set to L level (for example, $V_{SS}$) at the initialization timing. Electric current develops as shown in FIG. 7B from nodes having a high electric potential to nodes having a low electric potential, and the electric potential of a gate electrode of a TFT 705, and the electric potential of the gate electrode of the TFT 706, drop The voltage between the gate and the source of the TFT 705 soon becomes lower than the threshold voltage, and the TFT 705 turns on. Thereafter, the voltage between the gate and the source of the TFT 706 becomes lower than the threshold voltage, and the TFT 706 also turns on. Initialization is complete at this point, and the electric potential of the second gate signal line 703 once again becomes H level. A reverse bias is imparted to the diode 713 at this point, and electric current does not flow during periods for performing image signal input and light emission operations.

Electric current corresponding to the input image signal then flows in the EL element 708, and the EL element 708 emits light, similar to Embodiment Mode 1.

Figure 7C:
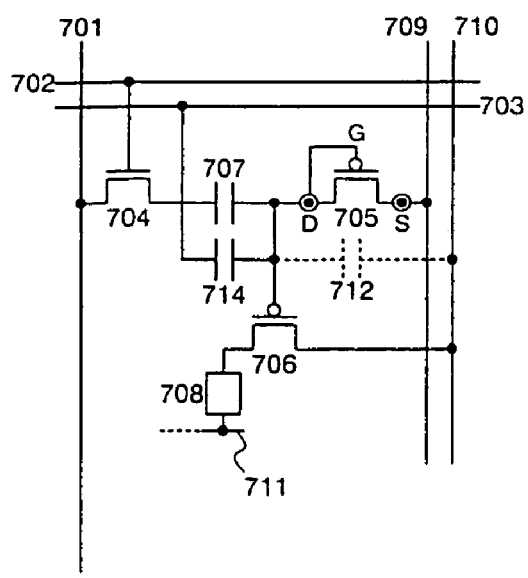
Figure 7D:
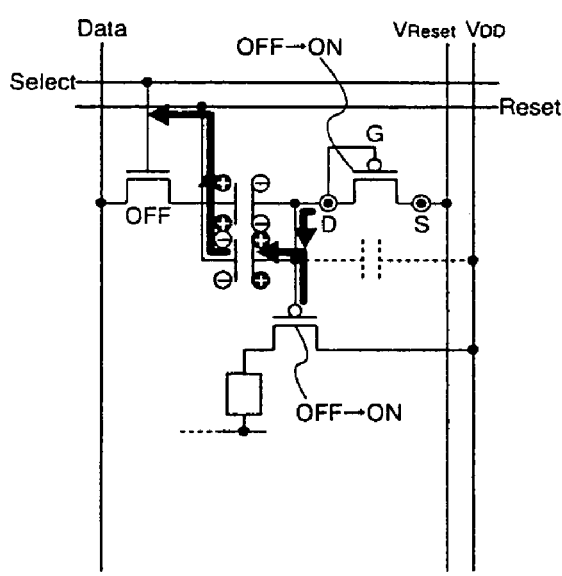
Figure 8:
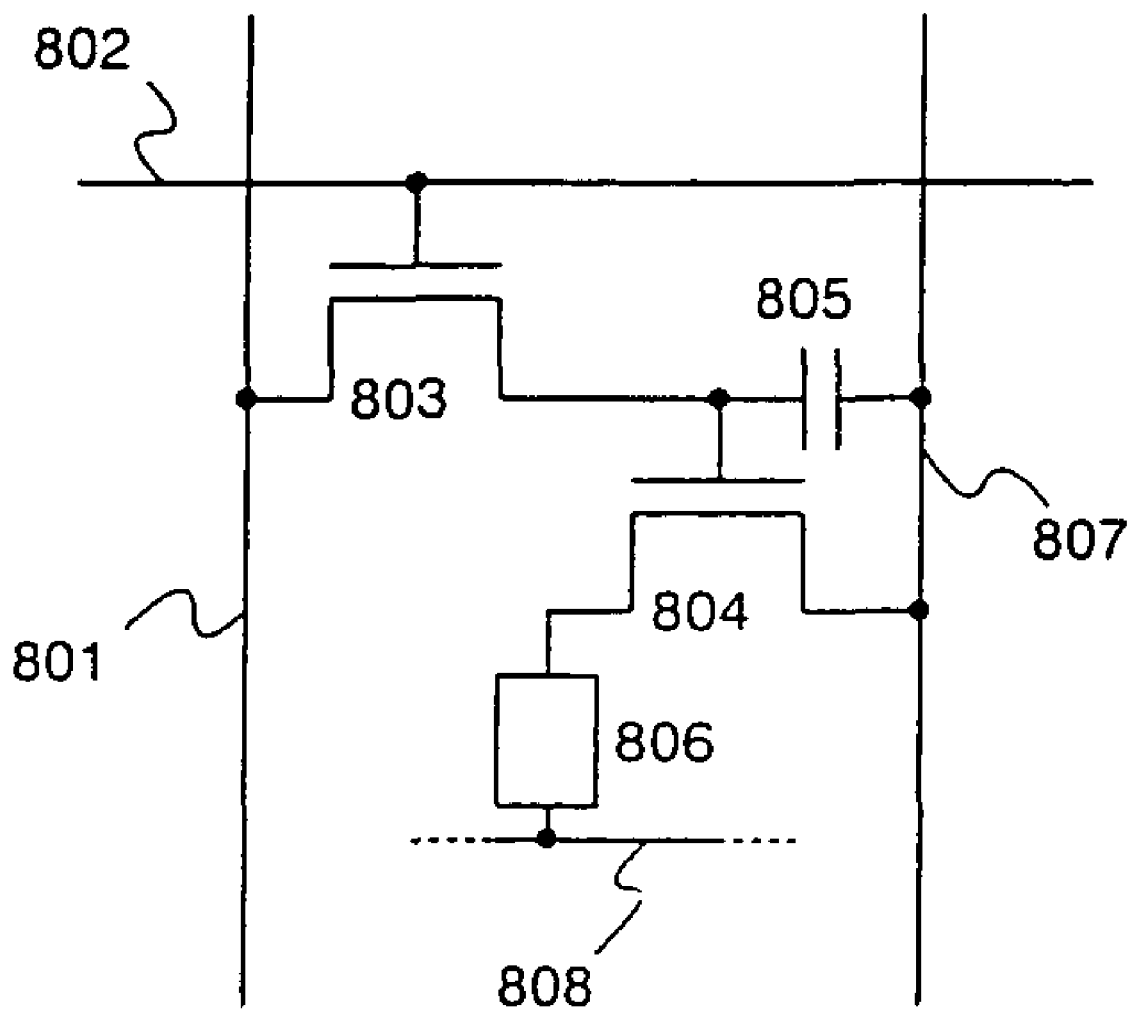
FIG. 8 is a diagram showing the structure of a pixel in a general light emitting device.

FIG. 7C shows an example of forming capacitor means 714 as a substitute for the diode 713. A first electrode of the capacitor means 714 is connected to the gate electrode of the TFT 706, and a second electrode of the capacitor means 714 is connected to the second gate signal line 703. Also in this case, operation is similar to that shown in FIG. 7B. First, the second gate signal line 703 is set to H level, and the electric potential of the second gate signal line 703 is set to L level at the initialization timing. The TFT 705 turns off at this point, and therefore the electric potentials of the gate electrodes of the TFTs 705 and 706 drop due to capacitive coupling with the capacitor means 714. The voltage between the gate and the source of the TFT 705 soon becomes lower than the threshold voltage, and the TFT 705 turns on. The voltage between the gate and the source of the TFT 706 then becomes lower than the threshold voltage, and the TFT 706 also turns on.

The TFT 704 then turns on, and input of an image signal is performed. The second gate signal line 703 is L level at this point, but may also be set to H level during input of the image signal.

Electric current corresponding to the input image signal then flows in the EL element 708, and the EL element 708 emits light, similar to Embodiment Mode 1.

Embodiment Mode 8

Display devices having an integrally formed pixel portion and peripheral circuits, formed by TFTs and the like built into a substrate, have the advantages of small size and light weight. However, their manufacturing processes are complex, such as element formation by repeatedly performing film formation and etching, and the addition of impurity elements for imparting conductivity to semiconductor layers. In particular, processes for adding impurity elements differ between p-channel TFTs and n-channel TFTs, and this therefore invites further increases of processing.

Processes for adding impurity elements can be partly omitted by structuring the pixel portion and the peripheral circuits using TFTs having a single polarity. Not only does it thus become possible to shorten processing, but the number of photomasks can also be reduced.

An example of a structure that uses TFTs having a single polarity type is the structure disclosed in Japanese Patent Application No. 2001-348032 by the applicants of the present invention. This is a structure in which only n-channel TFTs having a high field-effect mobility are used, and in addition, a structure in which drops in brightness do not easily occur, even if EL elements deteriorate.

A structure provided with both advantages, that is a structure in which drops in brightness following deterioration of EL elements are controlled, and one in which correction of dispersion in TFT threshold values is possible, is explained in Embodiment Mode 8 by combining the aforementioned technique with the present invention.

Figure 16A:
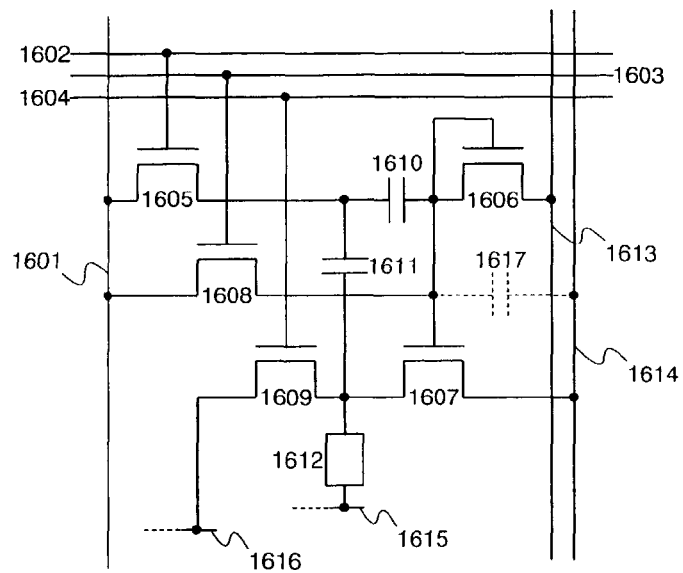
FIGS. 16A and 16B are diagrams for explaining an embodiment mode of the present invention, and operation of the embodiment mode.

FIG. 16A shows an example structure. The structure has a source signal line 1601, a first gate signal line 1602, a second gate signal line 1603, a third gate signal line 1604, TFTs 1605 to 1609, capacitor means 1610 and 1611, an EL element 1612, a reset electric power source line 1613, an electric current supply line 1614, and electric power source lines 1615 and 1616. If a storage capacitor means 1617 is formed, it may be formed between a gate electrode of the TFT 1607 and a location at which a fixed electric potential can be obtained, such as the electric current supply line 1614.

A gate electrode of the TFT 1605 is connected to the first gate signal line 1602, a first electrode of the TFT 1605 is connected to the source signal line 1601, and a second electrode of the TFT 1605 is connected to a first electrode of the capacitor means 1610. A gate electrode and a first electrode of the TFT 1606 are connected with each other, and then connected to a second electrode of the capacitor means 1610. A second electrode of the TFT 1606 is connected to the reset electric power source line 1613. The gate electrode of the TFT 1607 is connected to the gate electrode and the first electrode of the TFT 1606. A first electrode of the TFT 1607 is connected to the electric current supply line 1614, and a second electrode of the TFT 1607 is connected to a first electrode (anode) of the EL element 1612. A gate electrode of the TFT 1608 is connected to the second gate signal line 1603, a first electrode of the TFT 1608 is connected to the source signal line 1601, and a second electrode of the TFT 1608 is connected to the gate electrodes of the TFTs 1606 and 1607. A gate electrode of the TFT 1609 is connected to the third gate signal line 1604, a first electrode of the TFT 1609 is connected to the electric power source line 1616, and a second electrode of the TFT 1609 is connected to the first electrode (anode) of the EL element 1612. A second electrode (cathode) of the EL element 1612 is connected to the electric power source line 1615. A first electrode of the capacitor means 1611 is connected to the second electrode of the TFT 1605, and a second electrode of the capacitor means 1611 is connected to the first electrode (anode) of the EL element 1612.

Figure 16B:
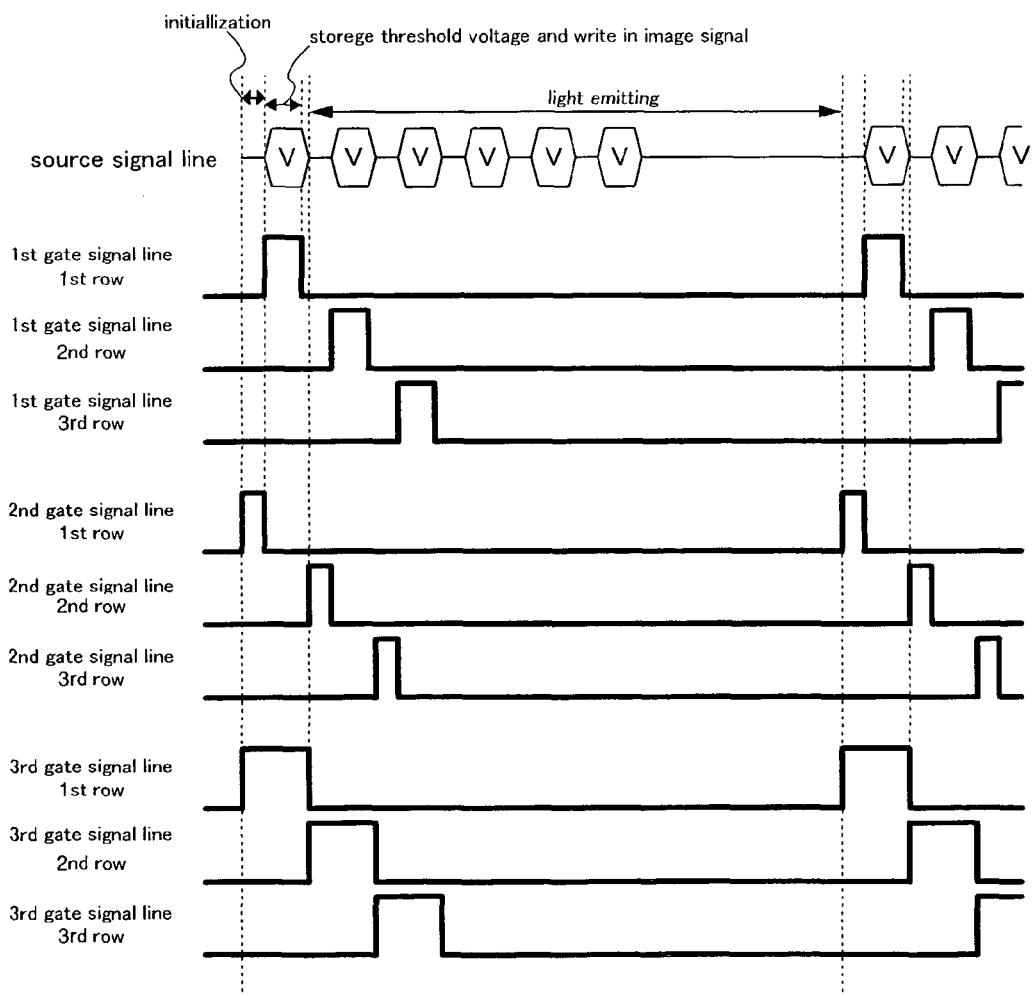

Operation is explained following FIG. 16B and FIGS. 17A to 17E. A timing chart for pulses input into the first to the third gate signal lines 1602 to 1604, and for an image signal input to the source signal line 1601 is shown in FIG. 16B. The image signal is input at a timing denoted by symbol "V", and at a predetermined electric potential.

Figure 17A:
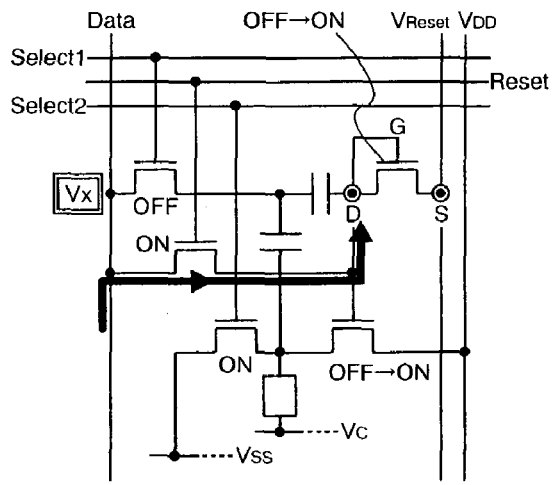
FIGS. 17A to 17E are diagrams for explaining an embodiment mode of the present invention, and operation of the embodiment mode.

The electric potential of the reset electric power source line 1613 is $V_{Reset}$, the electric potential of the electric current supply line 1614 is $V_{DD}$, the electric potential of the electric power source line 1615 is $V_C$, and the electric potential of the electric power source line 1616 is $V_{SS}$, where $V_{SS} < V_C < V_{DD} < V_{Reset}$. First, the electric potential of the source signal line 1601 is set to $V_x$ (where $V_x > V_{Reset}$). The second gate signal line 1603 and the third gate signal line 1604 then become H level, the TFTs 1608 and 1609 both turn on, an electric current develops as shown in FIG. 17A, and the electric potentials of the gate electrodes of the TFTs 1606 and 1607 rise. The voltage between the gate and the source of the TFT 1606 soon rises above the threshold value, and the TFT 1606 turns on. In addition, the voltage between the gate and the source of the TFT 1607 rises above the threshold value, and the TFT 1607 turns on. Initialization is thus complete by the above operations.

The second gate signal line becomes L level immediately after initialization is complete, and the TFT 1608 turns off. The electric potentials of the gate electrodes of the TFTs 1606 and 1607 thus begin to drop. The TFT 1606 turns off at the point where the electric potential becomes $(V_{Reset}+V_{th})$, that is when the voltage between the gate and the source of the TFT 1606 becomes equal to the threshold value. An electric potential difference thus develops between both electrodes of the capacitor means 1610, and this electric potential difference is stored.

Figure 17B:
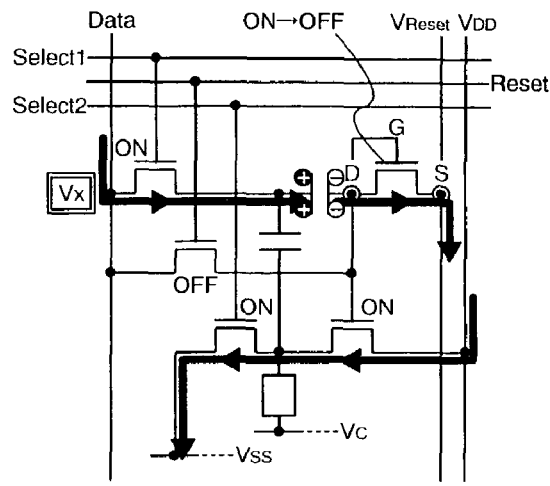
Figure 17C:
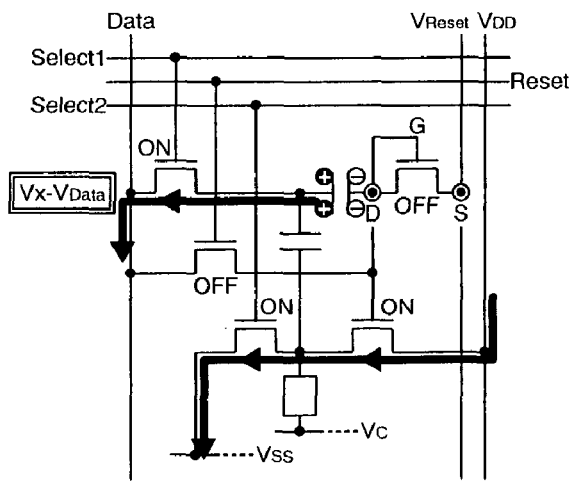
Figure 17D:
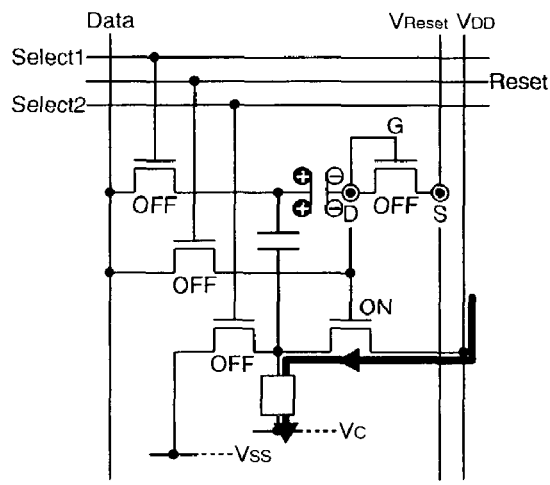

On the other hand, the voltage between the gate and the source of the TFT 1607 at this point exceeds the threshold value, and therefore the TFT 1607 turns on. The TFT 1609 also turns on, and therefore electric current flows as shown in FIG. 17B in a pathway from the electric current supply line 1614, to the TFT 1607, to the TFT 1609, and to the electric power source line 1616. Electric current does not flow in the EL element 1612 at this point, however, because $V_{SS} < V_C$. The EL element 1612 therefore does not emit light.

Input of an image signal begins next. An image signal having a predetermined electric potential is input to the source signal line 1601, which is fixed to the electric potential $V_x$, and the electric potential of the source signal line 1601 becomes $(V_x - V_{Data})$. The voltage between the gate and the source of the TFT 1606 becomes lower than the threshold value, and the TFT remains off. On the other hand, the voltage between the gate and the source of the TFT 1607 becomes $(V_{Reset}+V_{th}-V_{Data}-V_{DD})$, and a drain current corresponding to this voltage flows (see FIG. 17C).

The first gate signal line 1602 becomes L level when input of the image signal is complete, and the TFT 1605 turns off. The third gate signal line 1604 then becomes L level, and the TFT 1609 turns off. Electric current flowing in the TFT 1607 thus flows in the EL element 1612, and light is emitted (see FIG. 17D).

Figure 17E:
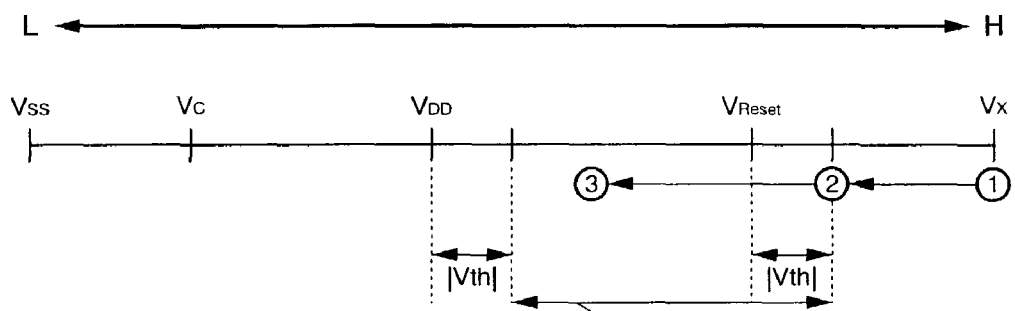

An explanation regarding the relationship between the sizes of the electric potential $V_{Reset}$ of the reset electric power source line 1613, the electric potential $V_{DD}$ of the electric current supply line 1614, the electric potential of the source signal line 1601, and the image signal $V_{Data}$ is made here using FIG. 17E.

Consider the electric potentials of the gate electrodes of the TFTs 1606 and 1607. The electric potentials of the gate electrodes of the TFTs 1606 and 1607 become the electric potential denoted by symbol [1] in FIG. 17E due to the initialization of FIG. 17A. That is, the electric potentials become $V_x$. The electric potentials of the gate electrodes of the TFTs 1606 and 1607 drop during a period for performing storage of the threshold values, and finally become the electric potential denoted by symbol [2] in FIG. 17E. That is, the electric potentials become $(V_{Reset}+|V_{th}|)$. Subsequently, when an image signal is input, the electric potentials of the gate electrodes of the TFTs 1606 and 1607 further change by $V_{Data}$ from the electric potential of symbol [2]. The electric potentials of the gate electrodes of the TFTs 1606 and 1607 becomes higher than the electric potential of symbol [2] here in the case where the change is positive. That is, the voltage between the gate and the source of the TFT 1606 becomes higher than the threshold voltage, and the TFT 1606 turns on, which is contrary to the prior conditions. It is therefore necessary that the change to the image signal be negative. The electric potentials of the TFTs 1606 and 1607 therefore become an electric potential denoted by symbol [3] in FIG. 17E due to the input of the image signal. That is, the electric potentials become $(V_{Reset}+|V_{th}|-V_{Data})$. Further, the electric potential of the gate electrode of the TFT 1607 becomes lower than $VDD+|V_{th}|$, and the TFT 1607 turns off, and therefore a range of electric potentials at which the image signal $V_{Data}$ can be obtained is a range denoted by reference numeral 1700 in FIG. 17E. That is, it is necessary that $0 \leq V_{Data} \leq V_{Reset} - V_{DD}$ (preferably $0 < V_{Data} \leq V_{Reset} - V_{DD}$ in order to ensure that the TFT 1606 is off). However, at a gray scale of zero, namely when the EL element 1612 is in a non-light emitting state, an electric potential slightly larger than $(V_{Reset}-V_{DD})$ may also be imparted as $V_{Data}$ so as to ensure that the TFT 1607 turns off.

The closer $V_{Data}$ is to zero at this point, the higher the absolute value of the voltage between the gate and the source of the TFT 1607 becomes, and therefore the higher the brightness of the EL element 1612 becomes. The larger $V_{Data}$ becomes, the smaller the absolute value of the voltage between the gate and the source of the TFT 1607, and therefore the lower the brightness of the EL element 1612 becomes.

The above explanation is made for an example of performing display by an analog gray scale method, but display by a digital gray scale method like that disclosed by Embodiment Mode 2 can also be similarly made. Further, it is easy to combine Embodiment Mode 8 with a structure in which an erasure TFT is formed when using a time gray scale method.

EMBODIMENTS

Hereafter, the embodiments of the invention will be described.

Embodiment 1

Figure 18A:
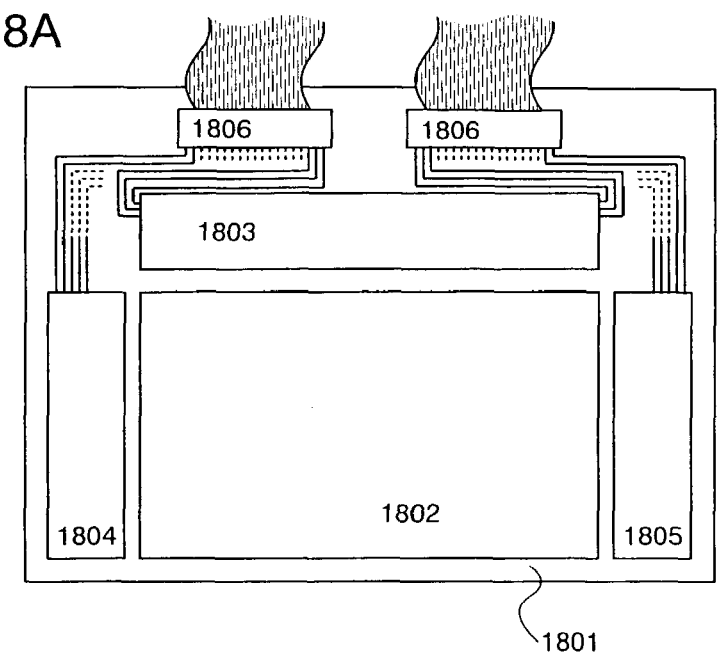
FIGS. 18A to 18C are diagrams for explaining an outline of a light emitting device using an analog signal method.

In this embodiment, the configuration of a light-emitting device in which analog video signals are used for video signals for display will be described. A configuration example of the light-emitting device is shown in FIG. 18A. The device has a pixel portion 1802 wherein a plurality of pixels is arranged in a matrix shape over a substrate 1801, and it has a source signal line driver circuit 1803 and first and second gate signal line driver circuits 1804 and 1805 around the pixel portion. In FIG. 18A, two couples of gate signal line driver circuits are used, which control first and second gate signal lines.

Signals inputted to the source signal line driver circuit 1803, and the first and second gate signal line driver circuits 1804 and 1805 are provided from outside through a flexible printed circuit (FPC) 1806.

Figure 18B:
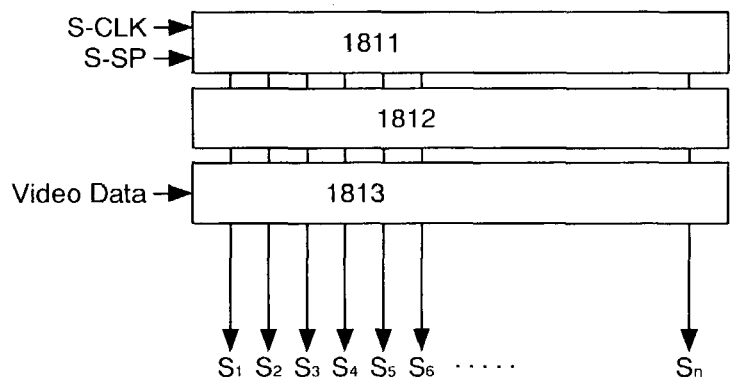

FIG. 18B shows a configuration example of the source signal line driver circuit. This is the source signal line driver circuit for using analog video signals for video signals for display, which has a shift register 1811, a buffer 1812, and a sampling circuit 1813. Not shown particularly, but a level shifter may be added if necessary.

Figure 19A:
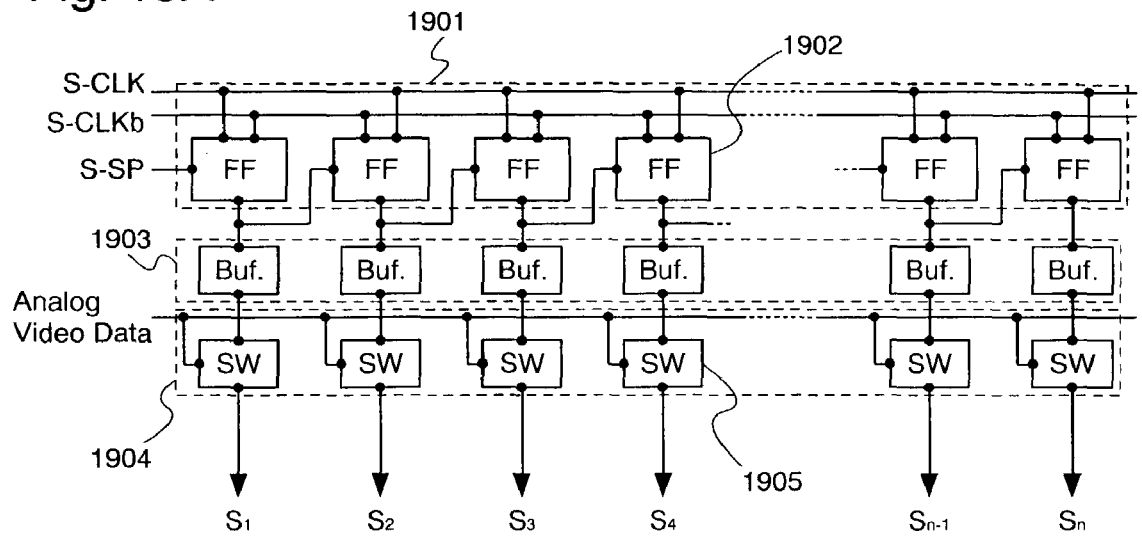
FIGS. 19A and 19B are diagrams showing examples of the structure of a source signal line driver circuit and a gate signal line driver circuit, respectively, used in FIGS. 18A to 18C.

The operation of the source signal line driver circuit will be described. FIG. 19A shows the more detailed configuration, thus referring to the drawing.

A shift register 1901 is formed of a plurality of flip-flop circuits (FF) 1902, to which the clock signal (S-CLK), the clock inverted signal (S-CLKb), and the start pulse (S-SP) are inputted. In response to the timing of these signals, sampling pulses are outputted sequentially.

The sampling pulses outputted from the shift register 1901 are passed through a buffer 1903 etc. and amplified, and then inputted to a sampling circuit. The sampling circuit 1904 is formed of a plurality of sampling switches (SW) 1905, which samples video signals in a certain column in accordance with the timing of inputting the sampling pulses. More specifically, when the sampling pulses are inputted to the sampling switches, the sampling switches 1905 are turned on. The potential held by the video signals at this time is outputted to the respective source signal lines through the sampling switches.

Figure 18C:
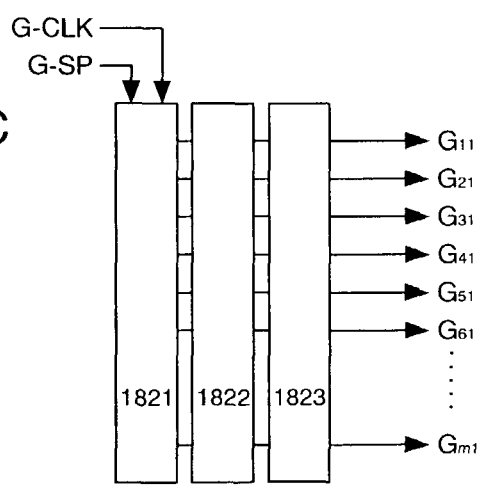
Figure 19B:
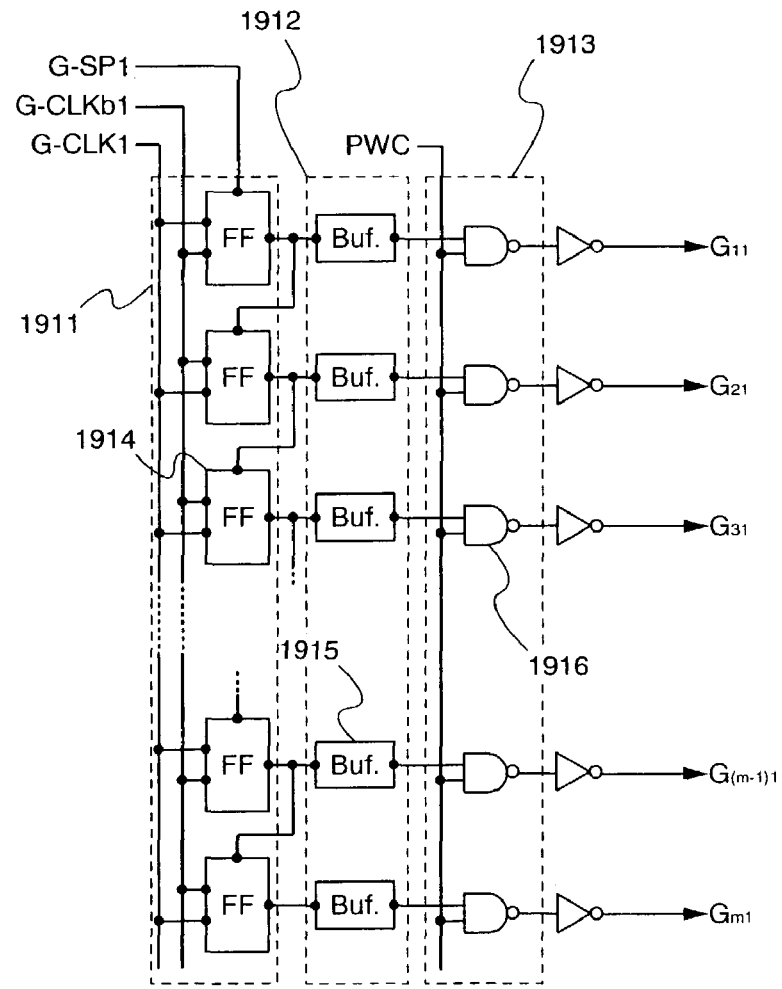

Subsequently, the operation of the gate signal line driver circuit will be described. FIG. 19B shows the more detailed configuration of the first and second gate signal line driver circuits 1804 and 1805 shown in FIG. 18C. The first gate signal line driver circuit has a shift register circuit 1911, and a buffer 1912, which is driven in response to the clock signal (G-CLK1), the clock inverted signal (G-CLKb1), and the start pulse (G-SP1). The second gate signal line driver circuit 2405 may have a same configuration.

The operation from the shift register to the buffer is the same as that in the source signal line driver circuit. The selecting pulses amplified by the buffer select respective gate signal lines for them. The first gate signal line driver circuit sequentially selects first gate signal lines $G_{11}$, $G_{21}$, . . . and $G_{m1}$, and the second gate signal line driver circuit sequentially selects second gate signal lines $G_{12}$, $G_{22}$, . . . and $G_{m2}$. A third gate signal line driver circuit, not shown, is also the same as the first and second gate signal line driver circuits, sequentially selecting third gate signal lines $G_{13}$, $G_{23}$, . . . and $G_{m3}$. In the selected row, video signals are written in the pixel to emit light according to the procedures described in the embodiment mode.

Note that, as one example of the shift register that formed of a plurality of D-flip-flops is shown here. However, such the configuration is acceptable that signal lines can be selected by a decoder and the like.

Embodiment 2

Figure 20A:
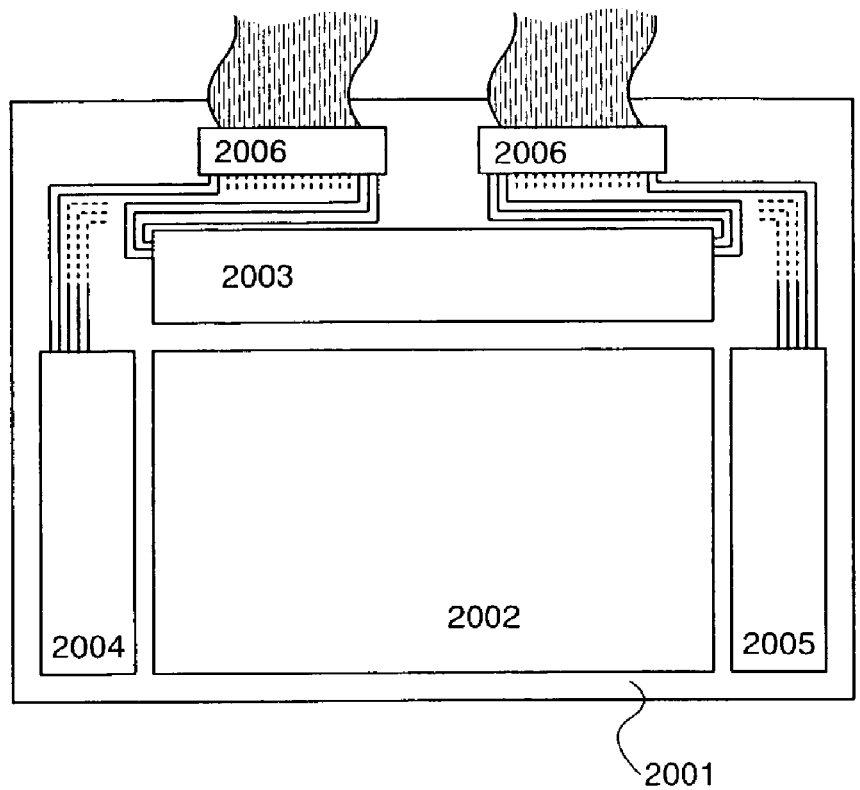
FIGS. 20A and 20B are diagrams for explaining an outline of a light emitting device using a digital signal method.

In this embodiment, a configuration of a light-emitting device in which digital video signals are used for video signals for display will be described. FIG. 20A shows a configuration example of the light-emitting device. The device has a pixel portion 2002 wherein a plurality of pixels is arranged in a matrix shape over a substrate 2001, and it has a source signal line driver circuit 2003, and first and second gate signal line driver circuits 2004 and 2005 around the pixel portion. In FIG. 20A, two couples of gate signal line driver circuits are used, which control first and second gate signal lines.

Signals inputted to the source signal line driver circuit 2003, and the first and fourth gate signal line driver circuits 2004 and 2005 are supplied from outside through a flexible printed circuit (FPC) 2006.

Figure 20B:
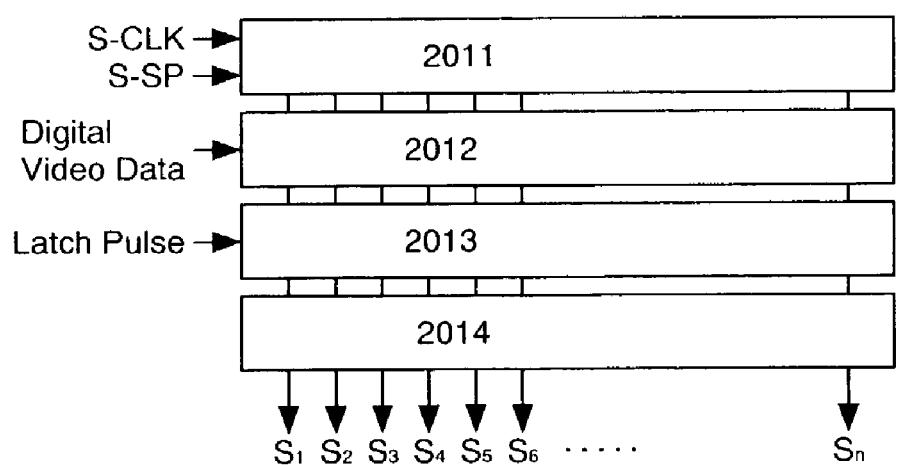

FIG. 20B shows a configuration example of the source signal line driver circuit. This is the source signal line driver circuit for using digital video signals for video signals for display, which has a shift register 2011, a first latch circuit 2012, a second latch circuit 2013, and a D/A converter circuit 2014. Not shown in the drawing particularly, but a level shifter may be added if necessary.

The first and second gate signal line driver circuits 2004 and 2005 can be same as those shown in Embodiment 1, thus omitting the illustration and description here.

Figure 21A:
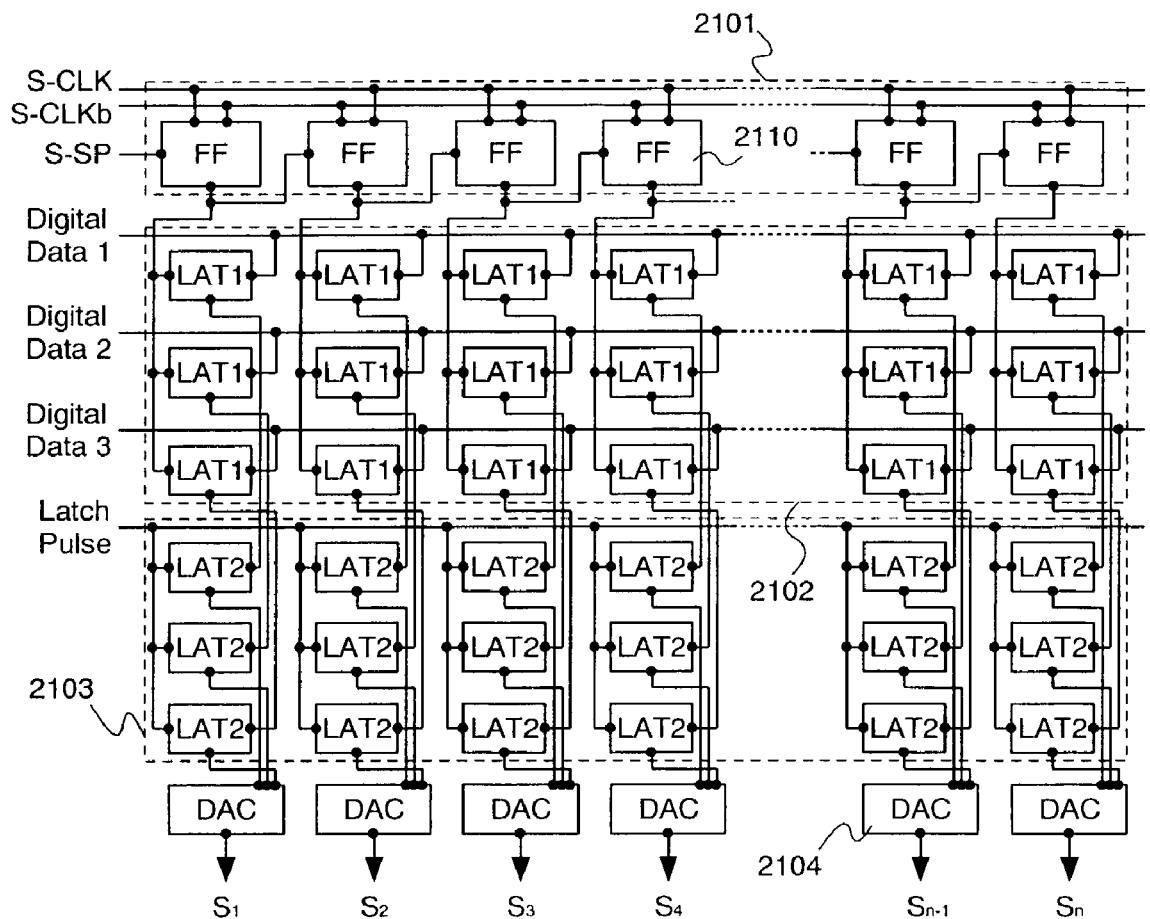
FIGS. 21A and 21B are diagrams showing examples of the structure of a source signal line driver circuit and a gate signal line driver circuit, respectively, used in FIGS. 20A to 20C.

The operation of the source signal line driver circuit will be described. FIG. 21A shows the more detailed configuration, thus referring to the drawing.

A shift register 2101 is formed of a plurality of flip-flop circuits (FF) 2110 or the like, to which the clock signal (S-CLK), the clock inverted signal (S-CLKb), and the start pulse (S-SP) are inputted. Sampling pulses are sequentially outputted in response to the timing of these signals.

The sampling pulses outputted from the shift register 2101 are inputted to first latch circuits 2102. Digital video signals are being inputted to the first latch circuits 2102. The digital video signals are held at each stage in response to the timing of inputting the sampling pulses. Here, the digital video signals are inputted by three bits. The video signals at each bit are held in the respective first latch circuits. Here, three first latch circuits are operated in parallel by one sampling pulse.

When the first latch circuits 2102 finish to hold the digital video signals up to the last stage, latch pulses are inputted to second latch circuits 2103 during the horizontal retrace period, and the digital video signals held in the first latch circuits 2102 are transferred to the second latch circuits 2103 all at once. After that, the digital video signals held in the second latch circuits 2103 for one row are inputted to D/A converter circuits 2104 simultaneously.

While the digital video signals held in the second latch circuits 2103 are being inputted to D/A converter circuits 2104, the shift register 2101 again outputs sampling pulses. Subsequent to this, the operation is repeated to process the video signals for one frame.

The D/A converter circuits 2104 convert the inputted digital video signals from digital to analog and output them to the source signal lines as the video signals having the analog voltage.

The operation described above is conducted throughout the stages during one horizontal period. Accordingly, the video signals are outputted to the entire source signal lines.

Note that, as described in the Embodiment 1, such the configuration is acceptable that a decoder or the like is used instead of the shift register to select signal lines.

Embodiment 3

Figure 21B:
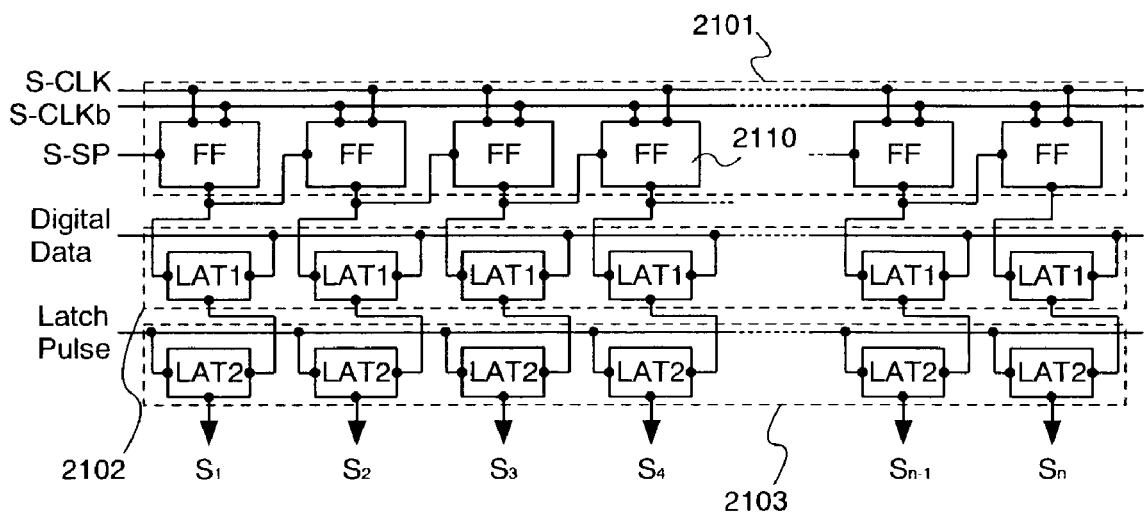

In Embodiment 2, the digital video signal is subjected to digital-to-analog conversion by the D/A converting circuit and written into the pixel. The light-emitting device of the present invention can also conduct gradation representation by a time gradation method. In this case, as shown in FIG. 21B, the D/A converting circuit is not required and the gradation representation is controlled according to a length of a light emitting time of the EL element. Thus, it is unnecessary to parallel-process video signals of respective bits so that the first and second latch circuits each may also have one bit. At this time, with respect to the digital video signal, each bit is serially inputted, held in succession in the latch circuit, and written into the pixel. Of course, the latch circuit of the required number of bits may be provided in parallel.

Embodiment 4

In this embodiment, an example in which a light-emitting device is manufactured according to the present invention will be described using FIGS. 15A to 15C.

Figure 15A:
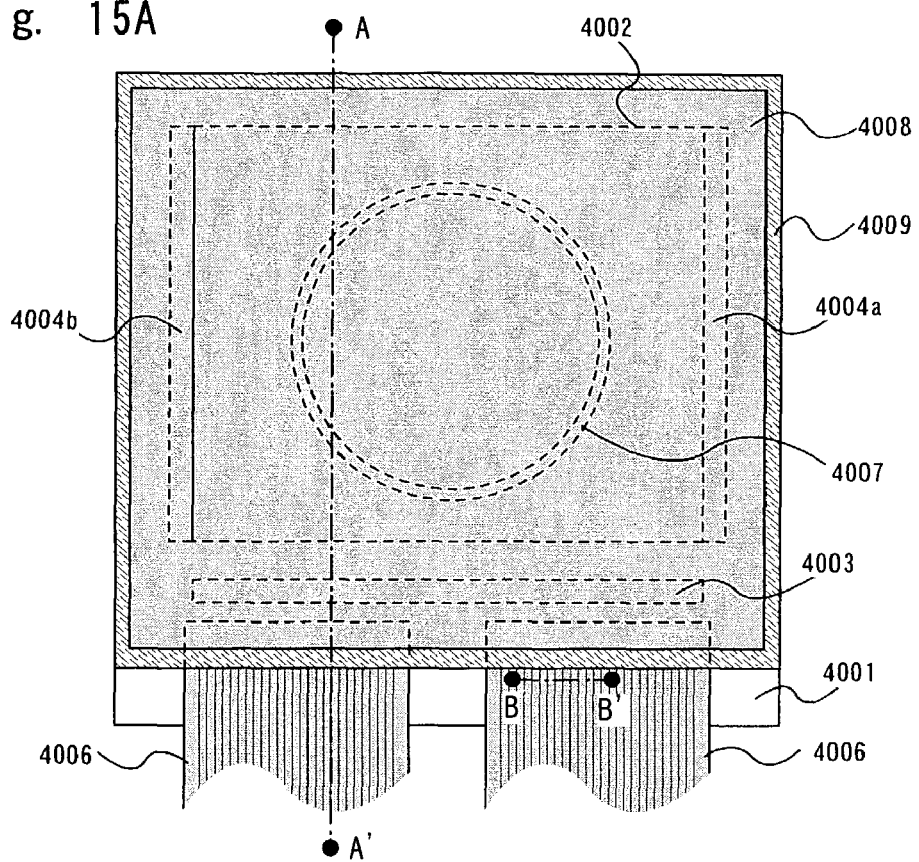
FIGS. 15A to 15C are an upper surface diagram and cross sectional diagrams of a light emitting device.
Figure 15B:
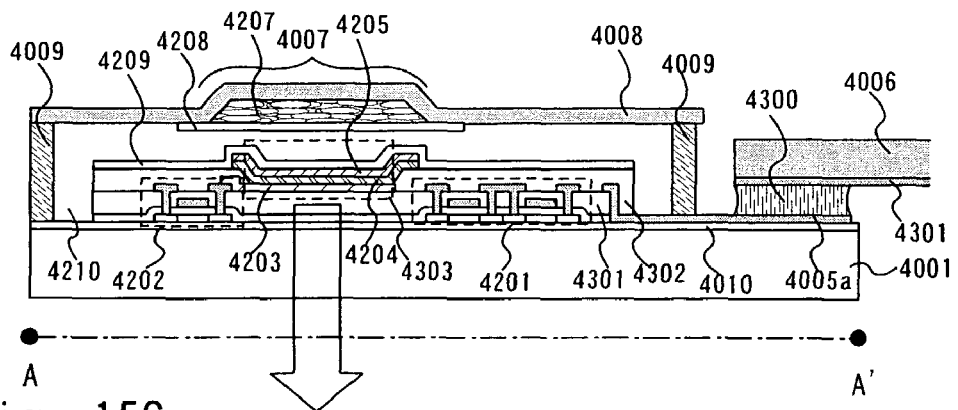

FIG. 15A is a top view of a light-emitting device produced by sealing an element substrate in which TFTs are formed with a sealing member. FIG. 15B is a cross sectional view along a line A-A' in FIG. 15A. FIG. 15C is a cross sectional view along a line B-B' in FIG. 15A.

A seal member 4009 is provided to surround a pixel portion 4002, a source signal line driver circuit 4003, and first and second gate signal line driver circuits 4004a and 4004b which are provided on a substrate 4001. In addition, a sealing member 4008 is provided over the pixel portion 4002, the source signal line driver circuit 4003, and the first and second gate signal line driver circuits 4004a and 4004b. Thus, the pixel portion 4002, the source signal line driver circuit 4003, and the first and second gate signal line driver circuits 4004a and 4004b are sealed with the substrate 4001, the seal member 4009 and the sealing member 4008 and filled with a filling agent 4210.

Also, the pixel portion 4002, the source signal line driver circuit 4003, and the first and second gate signal line driver circuits 4004a and 4004b which are provided on the substrate 4001 each have a plurality of TFTs. In FIG. 15B, TFTs (note that an N-channel TFT and a P-channel TFT are shown here) 4201 included in the source signal line driver circuit 4003 and a TFT 4202 included in the pixel portion 4002, which are formed on a base film 4010 are typically shown.

An interlayer insulating film (planarization film) 4301 is formed on the TFTs 4201 and 4202, and a pixel electrode (anode) 4203 electrically connected with the drain of the TFT 4202 is formed thereon. A transparent conductive film having a large work function is used as the pixel electrode 4203. A compound of indium oxide and tin oxide, a compound of indium oxide and zinc oxide, zinc oxide, tin oxide, or indium oxide can be used for the transparent conductive film. In addition, the transparent conductive film to which gallium is added may be used.

An insulating film 4302 is formed on the pixel electrode 4203. An opening portion is formed in the insulating film 4302 on the pixel electrode 4203. In the opening portion, an organic light-emitting layer 4204 is formed on the pixel electrode 4203. An organic light emitting material or an inorganic light emitting material that is known can be used as the organic light-emitting layer 4204. In addition, the organic light emitting material includes a to low molecular weight based (monomer system) material and a high molecular weight based (polymer system) material, and any material may be used.

An evaporation technique or an applying method technique that is known is preferably used as a method of forming the organic light-emitting layer 4204. In addition, a laminate structure or a single layer structure which is obtained by freely combining a hole injection layer, a hole transporting layer, a light emitting layer, an electron transporting layer, and an electron injection layer is preferably used as the structure of the organic light emitting layer.

A cathode 4205 made from a conductive film having a light shielding property (typically, a conductive film containing mainly aluminum, copper, or silver, or a laminate film of the conductive film and another conductive film) is formed on the organic light emitting layer 4204. In addition, it is desirable that moisture and oxygen that exist in an interface between the cathode 4205 and the organic light-emitting layer 4204 are minimized. Thus, a devise is required in which the organic light emitting layer 4204 is formed in a nitrogen atmosphere or a noble atmosphere and the cathode 4205 without being exposed to oxygen and moisture is formed. In this embodiment, the above film formation is possible by using a multi-chamber type (cluster tool type) film formation apparatus. A predetermined voltage is supplied to the cathode 4205.

By the above steps, a light-emitting element 4303 composed of the pixel electrode (anode) 4203, the organic light emitting layer 4204, and the cathode 4205 is formed. A protective film 4209 is formed on the insulating film 4302 so as to cover the light-emitting element 4303. The protective film 4209 is effective to prevent oxygen, moisture, and the like from penetrating the light-emitting element 4303.

Reference numeral 4005a denotes a lead wiring connected with a power source, which is connected with a first electrode of the TFT 4202. The lead wiring 4005a is passed between the seal member 4009 and the substrate 4001 and electrically connected with an FPC wiring 4301 of an FPC 4006 through an anisotropic conductive film 4300.

A glass material, a metallic member (typically, a stainless member), a ceramic member, a plastic member (including a plastic film) can be used as the sealing member 4008. An FRP (fiberglass reinforced plastic) plate, a PVF (polyvinyl fluoride) film, a Mylar film, a polyester film, or an acrylic resin film can be used as the plastic member. In addition, a sheet having a structure in which aluminum foil is sandwiched by a PVF film and a Mylar film can be used.

Note that, it is required that the cover member is transparent to the light when the light generated at the light-emitting element is emitted through a cover member side. In this case, a transparent material such as a glass plate, a plastic plate, a polyester film, or acrylic film is used.

Also, in addition to an inert gas such as nitrogen or argon, ultraviolet curable resin or thermal curable resin can be used for the filling agent 4103. PVC (polyvinyl chloride), acrylic, polyimide, epoxy resin, silicon resin, PVB (polyvinyl butyral), or EVA (ethylene vinyl acetate) can be used. In this embodiment, nitrogen is used for the filling agent.

Also, in order to expose the filling agent 4103 to a hygroscopic material (preferably barium oxide) or a material capable of absorbing oxygen, a concave portion 4007 is provided to the surface of the sealing member 4008 in the substrate 4001 side, and the hygroscopic material or the material capable of absorbing oxygen which is indicated by 4207 is located. In order to prevent the material 4207 having a hygroscopic property or being capable of absorbing oxygen from flying off, the material 4207 having a hygroscopic property or being capable of absorbing oxygen is held in the concave portion 4007 by a concave cover member 4208. Note that concave cover member 4208 is formed in a fine meshed shape and constructed such that it transmits air and moisture but does not transmit the material 4207 having a hygroscopic property or being capable of absorbing oxygen. When the material 4207 having a hygroscopic property or being capable of absorbing oxygen is provided, the deterioration of the light-emitting element 4303 can be suppressed.

Figure 15C:
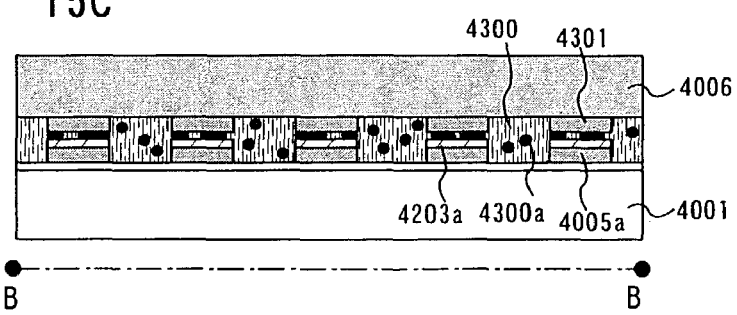

As shown in FIG. 15C, a conductive film 4203a is formed on the lead wiring 4005a such that it is in contact with the lead wiring 4005a simultaneously with the formation of the pixel electrode 4203.

Also, the anisotropic conductive film 4300 has a conductive filler 4300a. When the substrate 4001 and the FPC 4006 are bonded to each other by thermal compression, the conductive film 4203a located over the substrate 4001 and the FPC wiring 4301 located on the FPC 4006 are electrically connected with each other through the conductive filler 4300a.

Embodiment 5

Figure 22:
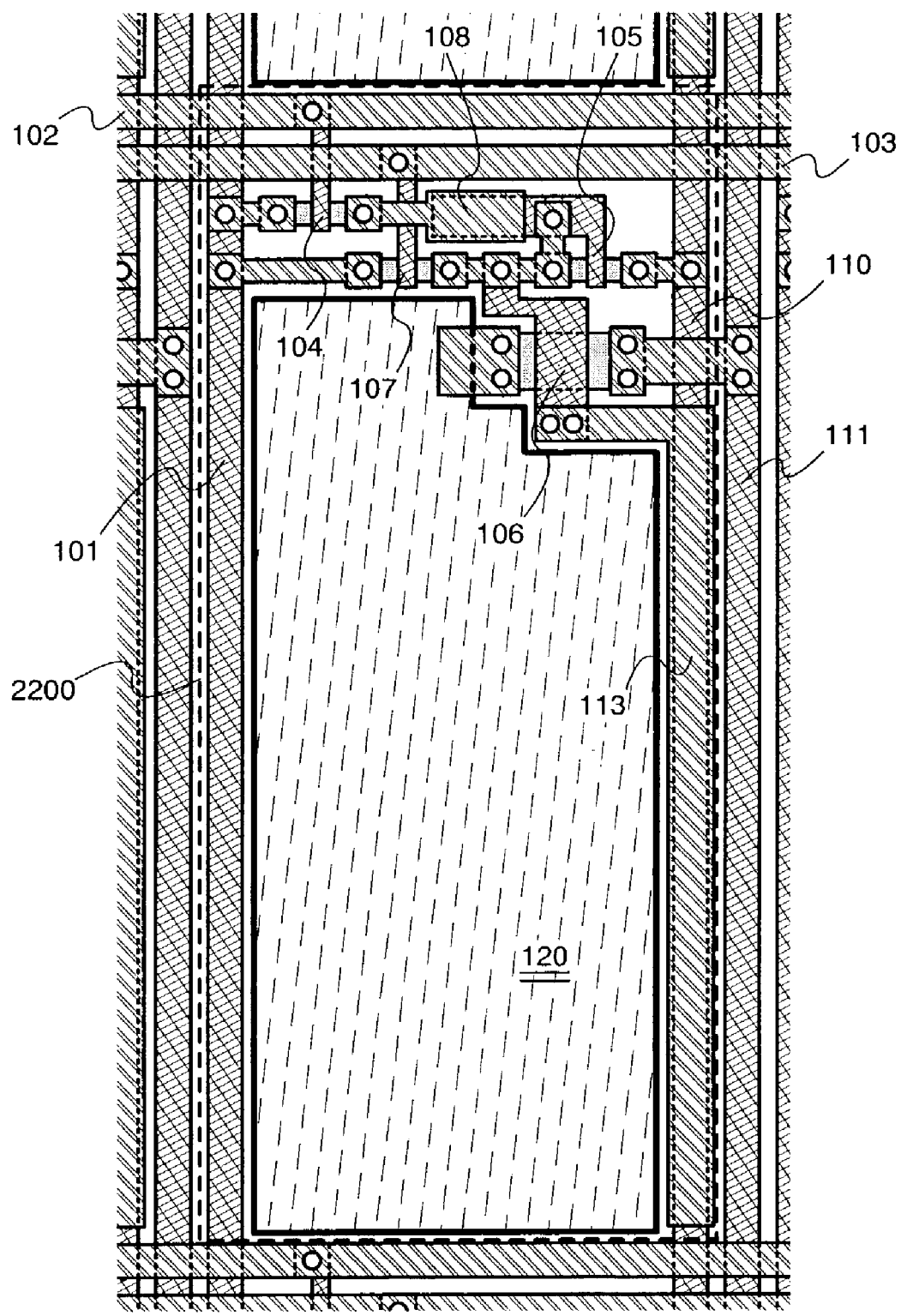
FIG. 22 is a diagram showing an example of a layout of pixels having the structure shown in FIGS. 1A and 1B.

An example of manufacturing pixels actually by using the configuration shown in FIG. 1A is demonstrated with reference to FIG. 22. A portion surrounded by a dotted line frame 2200 represents one pixel. Another figure numbers are the same as those assigned in FIG. 1A.

A source signal line 101, a reset power source line 110, and a current supply line 111 are formed by using a same layer material for forming a gate electrode. First and second gate signal lines 102 and 103 are formed by using a wiring material.

The pixel electrode 120 serves as a transparent electrode here, and connects to a drain electrode of TFT 106. The pixel electrode 120 and the drain electrode of TFT 106 contact each other without through a contact hole by means of overlapping directly a transparent conductive film forming a pixel electrode 120 and wiring materials. Of course, another method may be used to contact the drain electrode of TFT 106 and the pixel electrode 120.

Though a capacity device 108 and a retention capacity device 113 are formed at between the gate materials and the wiring materials, it is not especially limited to this type. For ease of illustration, a channel length L and a channel width W of TFTs 104 to 107 are not illustrated as to correspond to the actual sizes. It is possible that the desired size of L and W is determined at the designing phase and that each TFT differs in size.

Embodiment 6

A light-emitting device using a light-emitting element is a self light emission type. Thus, such a light-emitting device has high visibility in a light place and a wide viewing angle, as compared with a liquid crystal display. Therefore, it can be used for a display portion of various electronic apparatuses.

As electronic apparatuses using the light-emitting device of the present invention, there are a video camera, a digital camera, a goggle type display (head mount display), a navigation system, a sound reproducing device (car audio system, audio component system, or the like), a laptop computer, a game machine, a portable information terminal (mobile computer, mobile telephone, portable game machine, an electric book, or the like), an image reproducing device including a recording medium (specifically, apparatus for reproducing an image from a recording medium such as a digital versatile disc (DVD), which includes a display capable of displaying the image), and the like. In particular, in the case of the portable information terminal in which a screen is viewed from an oblique direction in many cases, it is important that a view angle is large. Thus, it is desirable that the light-emitting device is used. Concrete examples of those electronic apparatuses are shown in FIGS. 13A to 13H.

Figure 13A:
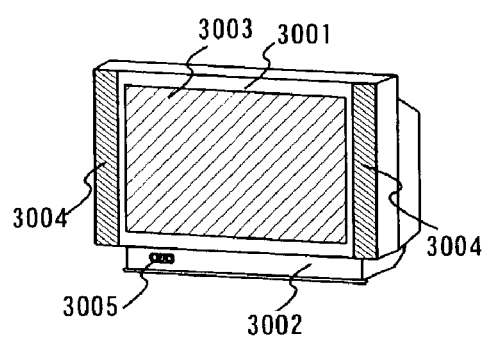
FIGS. 13A to 13H are diagrams showing examples of electronic equipment capable of applying the present invention.

FIG. 13A shows a light emitting element display device which includes a cabinet 3001, a support base 3002, a display portion 3003, a speaker portion 3004, and a video input terminal 3005. The light-emitting device of the present invention can be used for the display portion 3003. The light-emitting device is a self light emission type and thus does not require a back light. Therefore, a thinner display portion than a liquid crystal display can be obtained. Note that the light-emitting element display device includes all display devices for information display such as personal computer, TV broadcast receiving, and advertisement display.

Figure 13B:
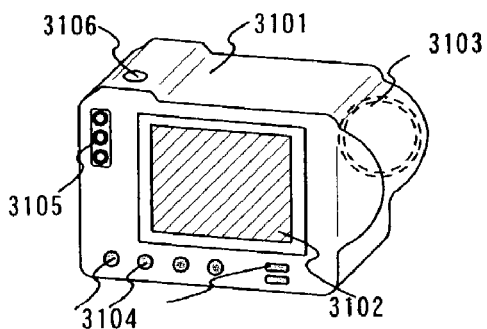

FIG. 13B is a digital still camera, which is composed of a main body 3101, a display portion 3102, an image-receiving portion 3103, operation keys 3104, external connection ports 3105, a shutter 3106, and the like. The light-emitting device of the present invention can be used in the display portion 3102.

Figure 13C:
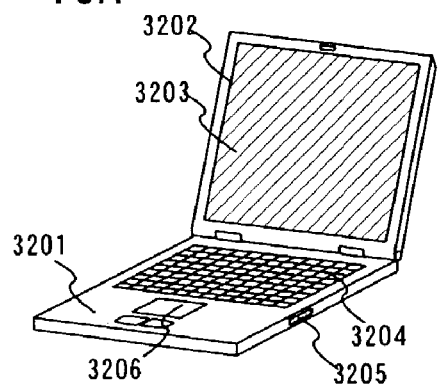

FIG. 13C is a laptop computer, which is composed of a main body 3201, a frame 3202, a display portion 3203, a keyboard 3204, external connection ports 3205, a pointing mouse 3206, and the like. The light-emitting device of the present invention can be used in the display portion 3203.

Figure 13D:
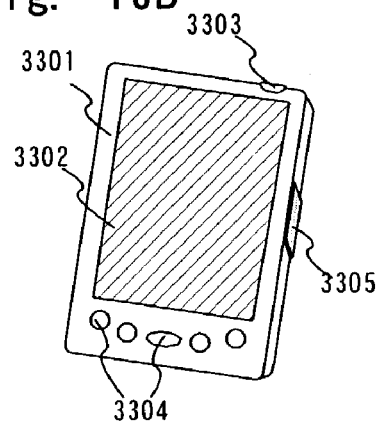

FIG. 13D is a mobile computer, which is composed of a main body 3301, a display portion 3302, a switch 3303, operation keys 3304, an infrared port 3305, and the like. The light-emitting device of the present invention can be used in the display portion 3302.

Figure 13E:
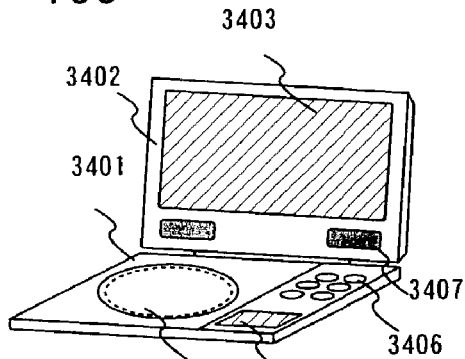

FIG. 13E is a portable image reproducing device equipped with a recording medium (specifically, a DVD player), and is composed of a main body 3401, a frame 3402, a display portion A 3403, a display portion B 3404, a recording medium (such as a DVD) read-in portion 3405, operation keys 3406, a speaker portion 3407, and the like. The display portion A 3403 mainly displays image information, and the display portion B 3404 mainly displays character information, and the light-emitting device of the present invention can be used in the display portion A 3403 and in the display portion B 3404. Note that family game machines and the like are included in the category of image reproducing devices provided with a recording medium.

Figure 13F:
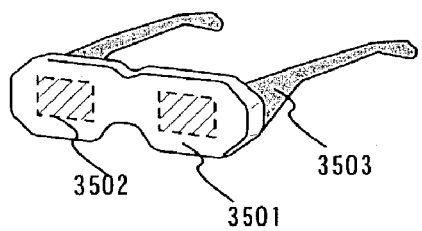

FIG. 13F is a goggle type display device (head mounted display), which is composed of a main body 3501, a display portion 3502, and an arm portion 3503. The light-emitting device of the present invention can be used in the display portion 3502.

Figure 13G:
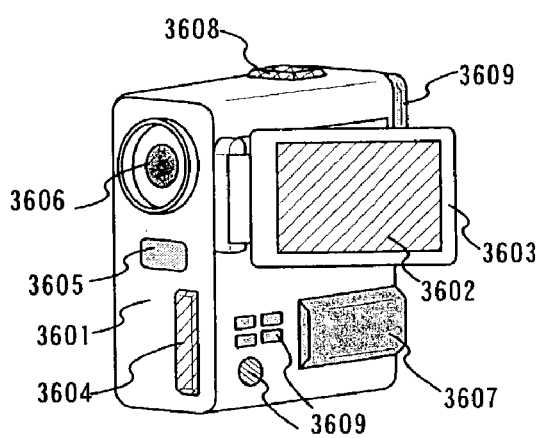

FIG. 13G is a video camera, which is composed of a main body 3601, a display portion 3602, a frame 3603, external connection ports 3604, a remote control receiving portion 3605, an image receiving portion 3606, a battery 3607, an audio input portion 3608, operation keys 3609, and the like. The light-emitting device of the present invention can be used in the display portion 3602.

Figure 13H:
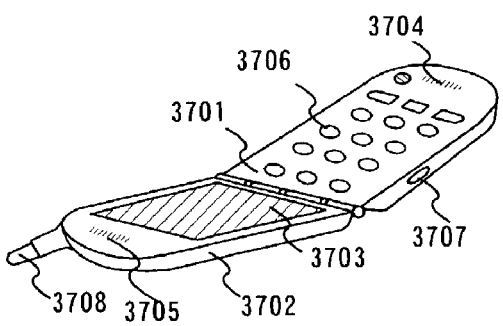
Figure 14A:
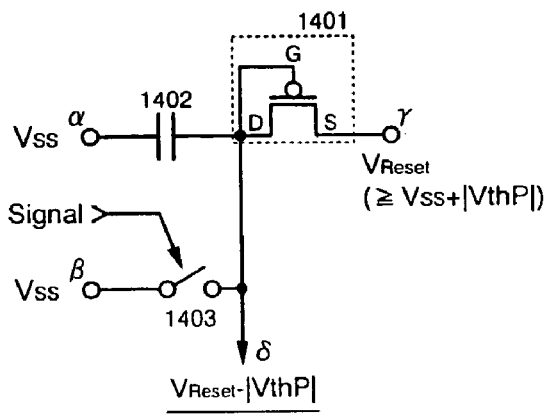
FIGS. 14A to 14E are diagrams for explaining the operating principle of the present invention.
Figure 14B:
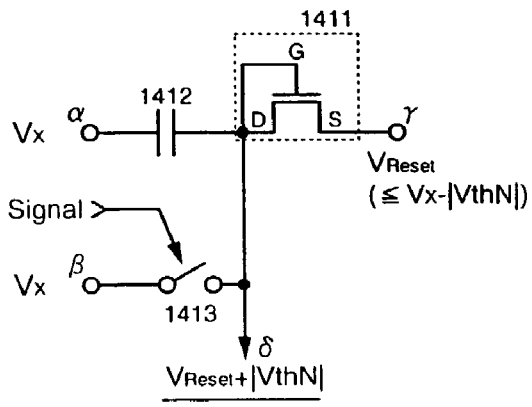
Figure 14C:
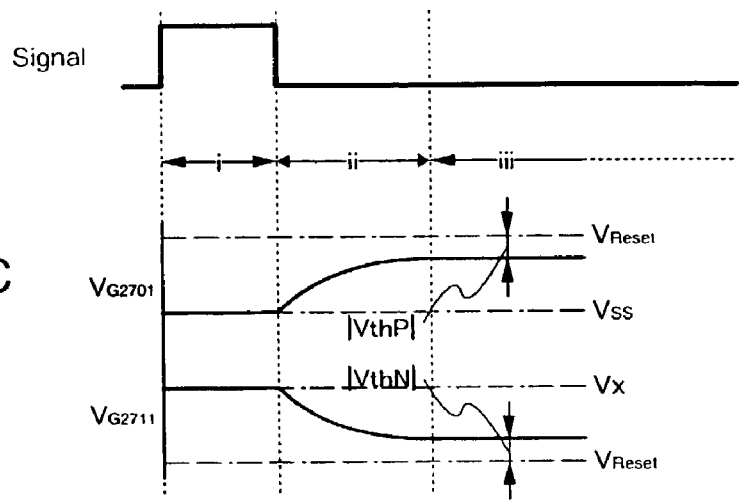
Figure 14D:
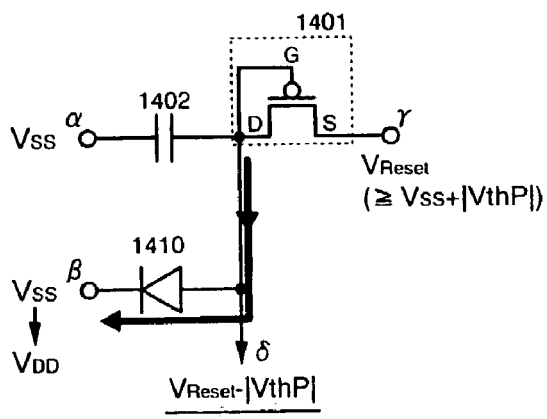
Figure 14E:
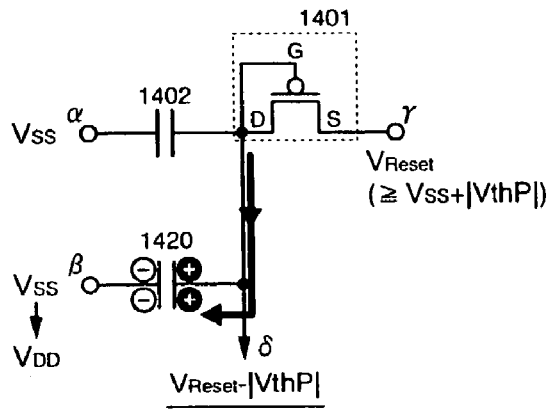

FIG. 13H is a mobile telephone, which is composed of a main body 3701, a frame 3702, a display portion 3703, an audio input portion 3704, an audio output portion 3705, operation keys 3706, external connection ports 3707, an antenna 3708, and the like. The light-emitting device of the present invention can be used in the display portion 3703. Note that white characters are displayed on a black background in the display portion 3703, and thus, the power consumption of the mobile telephone can be suppressed.

Note that, when a light emitting intensity of an organic light emitting material is increased in future, it can be used for a front type or a rear type projector for magnifying and projecting outputted light including image information by a lens or the like.

Also, in the above electronic apparatuses, the number of cases where information distributed through an electronic communication line such as an Internet or a CATV (cable television) is displayed is increased. In particular, a chance in which moving image information is displayed is increased. A response speed of the organic light emitting material is very high. Thus, the light-emitting device is preferable for moving image display.

Also, with respect to the light-emitting device, power is consumed in a portion that emits light. Thus, it is desirable that information is displayed so as to minimize an area of a light-emitting portion. Accordingly, when the light-emitting device is used for a display portion of, a portable information terminal, particularly, a mobile telephone or a sound reproducing device in which character information is mainly displayed, it is desirable that the light-emitting device is driven so as to use a non-light emitting portion as a background and produce character information in a light emitting portion.

As described above, an application area of the present invention is extremely wide and the light-emitting device can be used for electronic apparatuses in all fields. In addition, the light-emitting device having any structure described in Embodiments 1 to 7 may be used for the electronic apparatuses of this embodiment.

Embodiment 7

A phenomenon is used in the present invention as a method of correcting the threshold value of transistors by making a short circuit between the gate and the drain of a transistor used in correction, and letting electric current flow between the source and the drain in this diode state, thus making the voltage between the source and the drain equal to the threshold value. It is also possible to apply this phenomenon to driver circuits as well as to pixel portions as introduced by the present invention.

An electric current source circuit in a driver circuit for outputting electric current to pixels and the like can be given as an example. The electric current source circuit is a circuit in which a predetermined amount of electric current is output in accordance with an input voltage signal. A voltage signal is input to a gate electrode of an electric current source transistor within the electric current source circuit, and an electric current corresponding to the voltage between the gate and the source is output through the electric current source transistor. That is, the method of the present invention for correcting the threshold value is utilized in correcting the threshold value of the electric current source transistor.

Figure 23A:
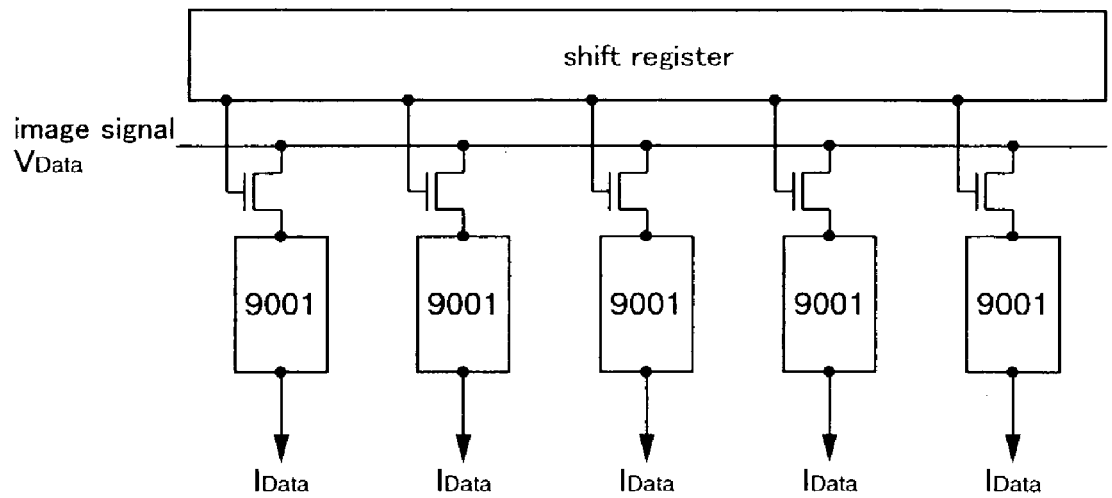
FIGS. 23A and 23B are diagrams showing examples of the structure of an electric current source circuit using the threshold value correcting principle of the present invention.

An example of utilizing the electric current source circuit is shown in FIG. 23A. Sampling pulses are output in order from a shift register, and the sampling pulses are each input to electric current source circuits 9001. Sampling of an image signal is performed in accordance with the timing at which the sampling pulses are input to the electric current source circuits 9001. Sampling operations are performed in a dot sequential manner in this case.

Figure 23B:
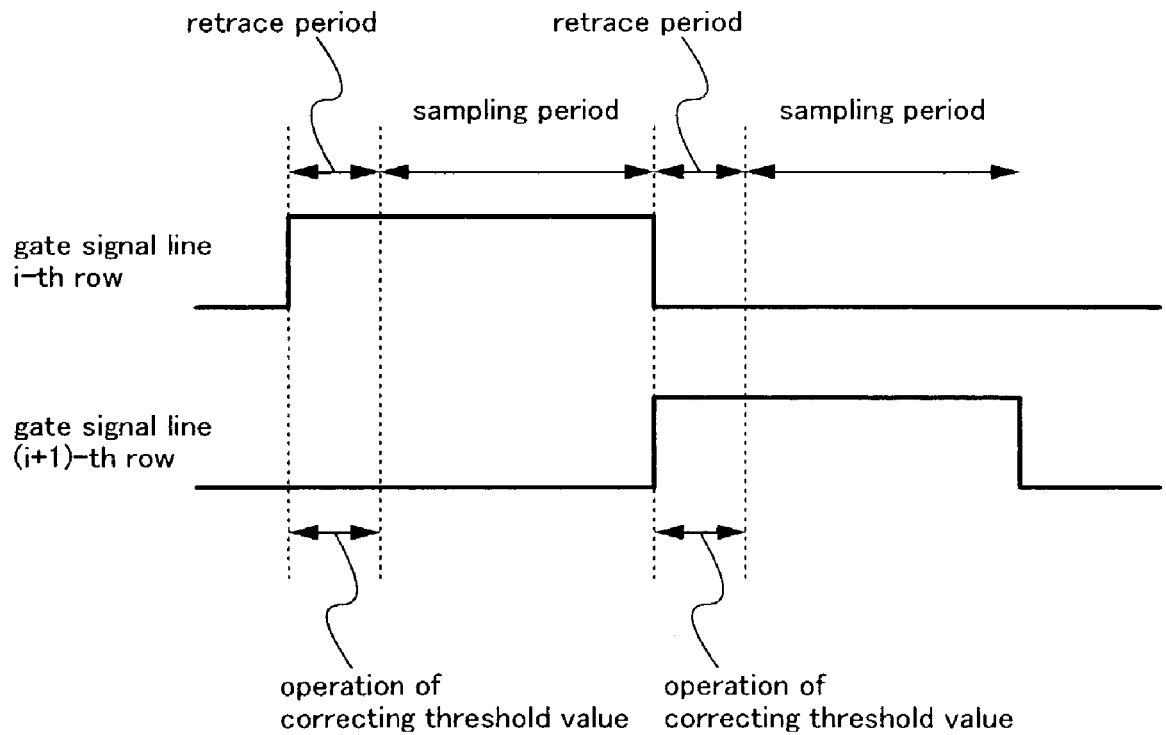

A simple operation timing is shown in FIG. 23B. A period for selecting a number i gate signal line is divided into a period for performing sampling of an image signal, in which the sampling pulses are output from the shift register, and a retrace period. The threshold value correction operations of the present invention are performed in the retrace period. That is, operations for initializing the electric potential of each portion, and operations for obtaining the transistor threshold voltages are performed sequentially. In other words, operations for obtaining the threshold values can be performed per single horizontal period.

Figure 24A:
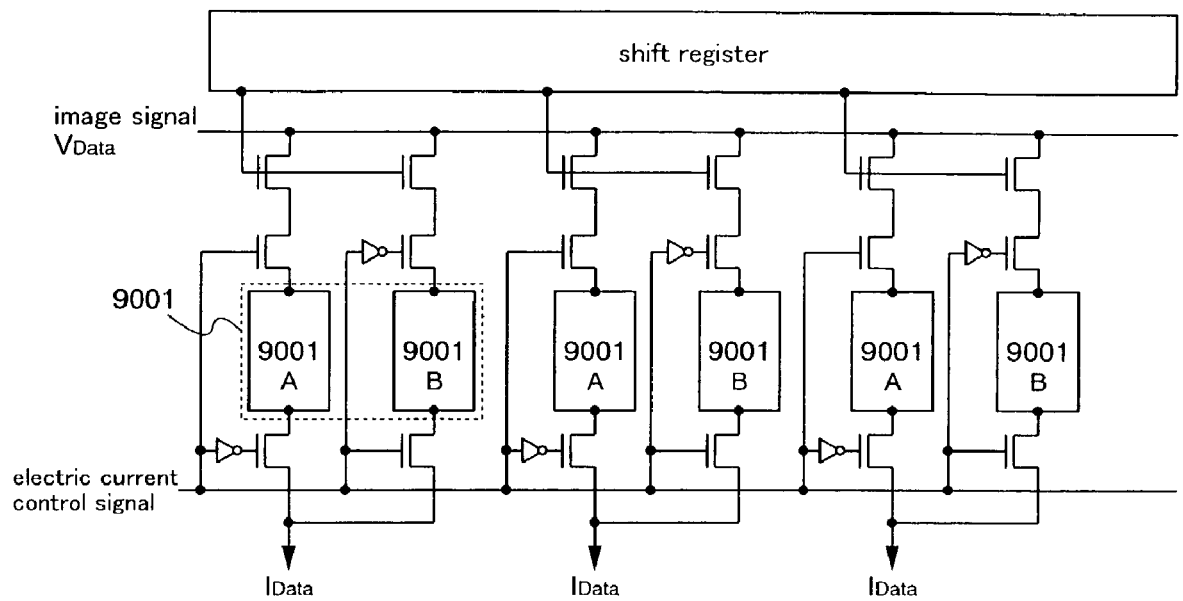
FIGS. 24A and 24B are diagrams showing examples of the structure of an electric current source circuit using the threshold value correcting principle of the present invention.

The structure of a driver circuit for outputting electric current to pixels, but which differs from the structure of FIGS. 23A and 23B, is shown in FIG. 24A. Differing from the case of FIGS. 23A and 23B, the electric current source circuits 9001, which are controlled by one stage of sampling pulses, become two electric current source circuits 9001A and 9001B, and both operations are selected by an electric current source control signal.

Figure 24B:
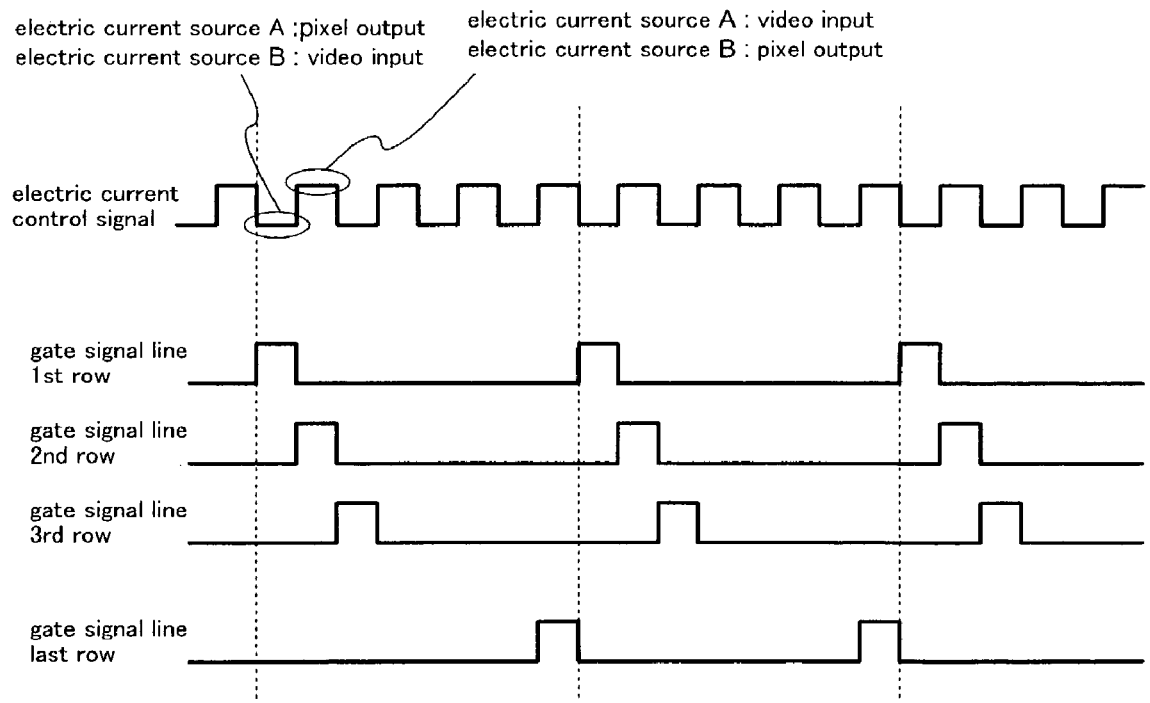

As shown in FIG. 24B, the electric current source control signal may be made to change every single horizontal period, for example. Operation of the electric current source circuits 9001A and 9001B is thus performed so that one of the two circuits performs electric current output to pixels and the like while the other circuit performs input of the image signal. These operations are switched every row. Sampling operations are thus performed in a line sequential manner in this case.

Figure 25A:
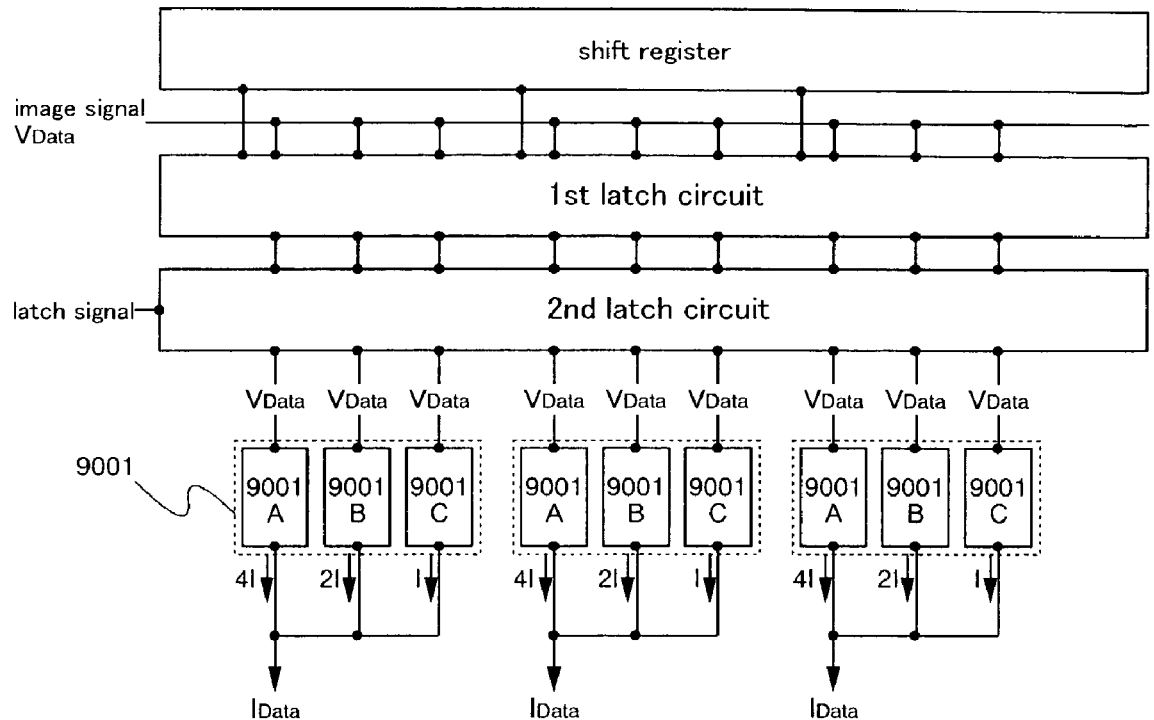
FIGS. 25A and 25B are diagrams showing examples of the structure of an electric current source circuit using the threshold value correcting principle of the present invention.

A driver circuit having another different structure is shown in FIG. 25A. The image signal type may be either digital or analog in FIGS. 23A and 23B, and FIGS. 24A and 24B, but a digital image signal is input with the structure of FIG. 25A. The input digital image signal is taken in by a first latch circuit in accordance with the output of sampling pulses, and is transferred to a second latch circuit after the input of one row portion of the image signal is complete. This is later input to the electric current source circuits 9001A and 9001B, and electric current source circuits 9001C. The amounts of electric current value output by the electric current source circuits 9001A to 9001C differ. For example, the ratio of the electric current values becomes 1:2:4. That is, n electric current source circuits may be disposed in parallel, the ratio of the electric current values of the circuits may be set as $1:2:4: \ldots :2^{(n-1)}$, and the amount of electric current values output can be changed linearly by combining the electric currents output from each of the electric current source circuits.

Operation timing is nearly the same as that shown in FIGS. 23A and 23B. Threshold value correction is performed in the electric current source circuits 9001 within the retrace period during which sampling operations are not performed, data stored in the latch circuits is transferred, and V-I conversion is performed in the electric current source circuits 9001 and electric current is output to pixels. The sampling operations are performed in a line sequential manner, similar to the structure shown in FIGS. 24A and 24B.

Figure 26A:
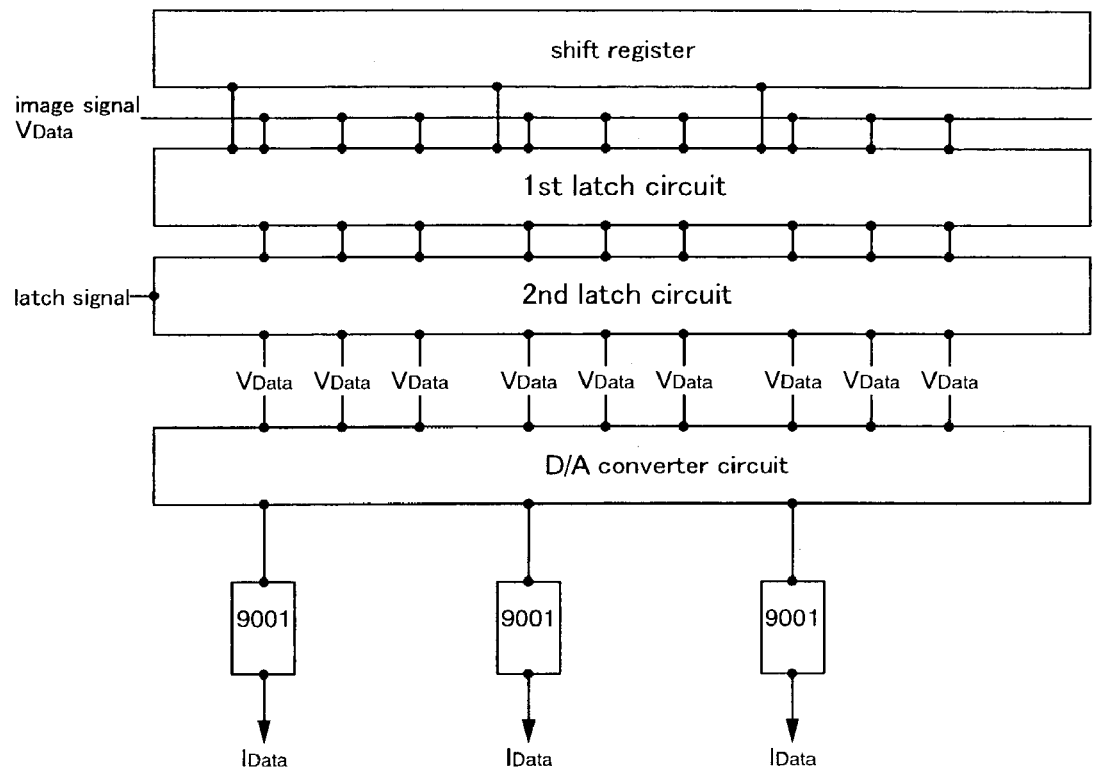
FIGS. 26A and 26B are diagrams showing examples of the structure of an electric current source circuit using the threshold value correcting principle of the present invention.

The structure of another driver circuit for outputting electric current to pixels and the like is shown in FIG. 26A. A digital image signal taken in by a latch circuit is transferred to a D/A converter circuit by the input of a latching signal with this structure, and the digital image signal is converted to an analog image signal. The analog image signal is input to each of the electric current source circuits 9001, which output electric current.

Further, other functions may also be given to this type of D/A converter circuit, such as gamma correction.

Figure 26B:
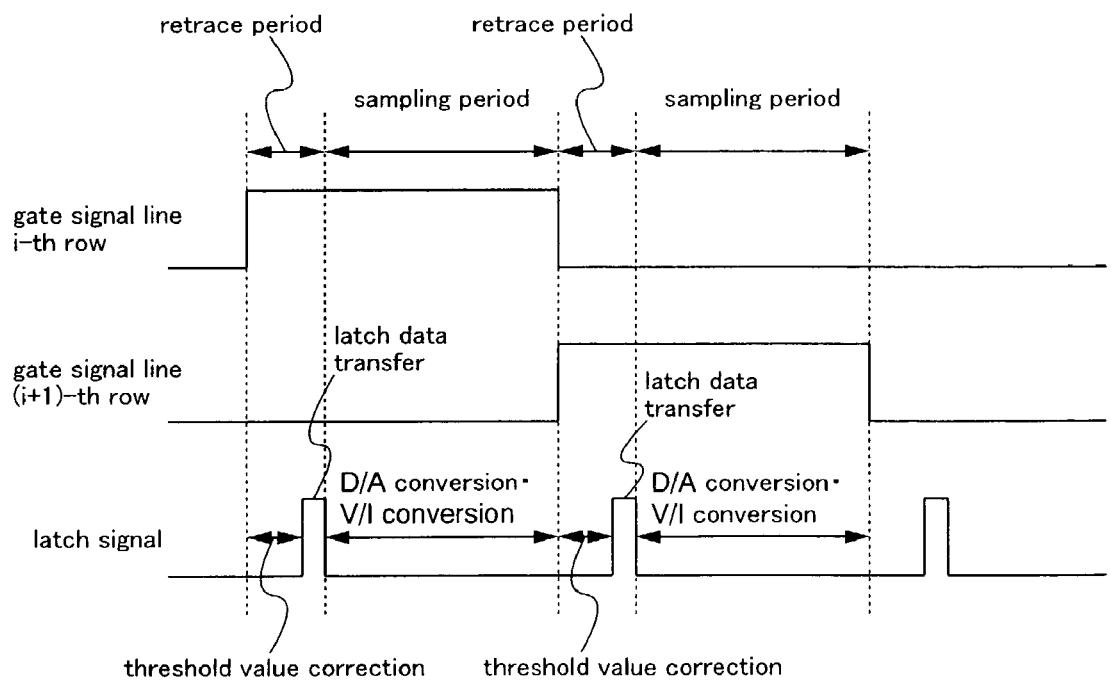

Threshold value correction and latch data transfer are performed within the retrace period as shown in FIG. 26B. V-I conversion of a certain row, and output of electric current to pixels and the like, are performed during a period for performing sampling operations of the next row. The sampling operations are performed in a line sequential manner, similar to the structure shown in FIGS. 24A and 24B.

Figure 25B:
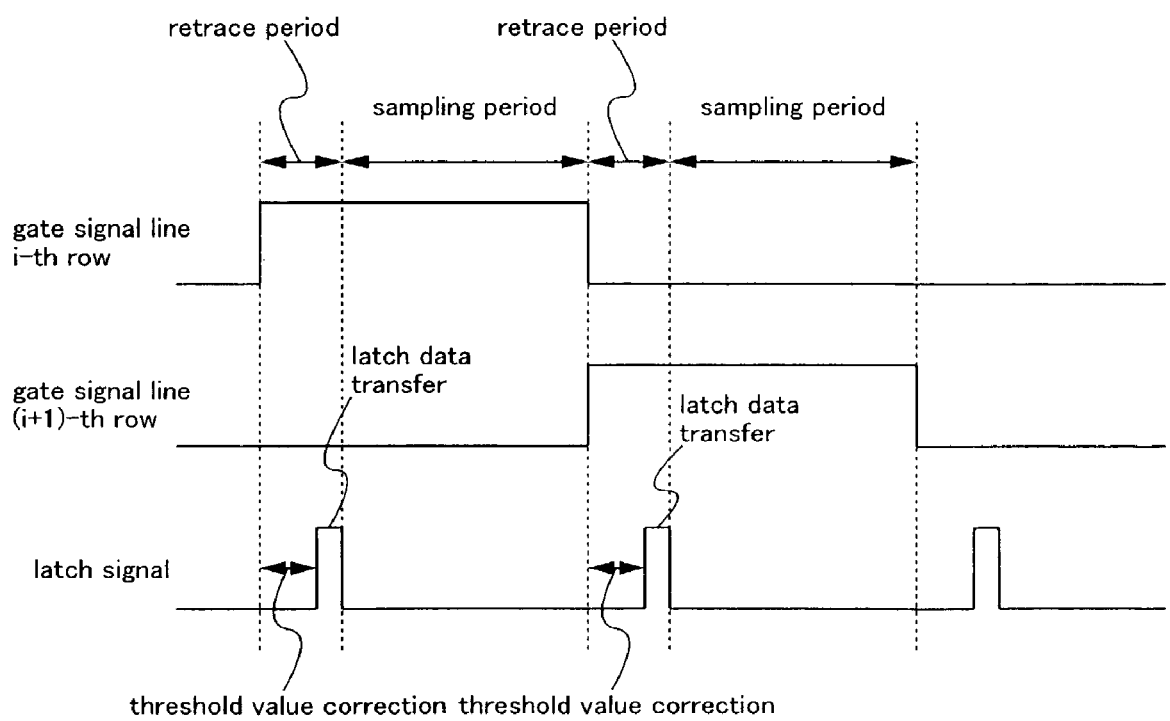

The present invention is not limited to the structures discussed above, and it is possible to apply the threshold value correcting means of the present invention to the case of performing V-I correction by using an electric current source circuit. Further, a structure in which a plurality of electric current source circuits are disposed in parallel, like the structure shown in FIGS. 24A and 24B, and used by switching between the circuits may also be combined with other structures, such as those of FIGS. 25A and 25B, and those of FIGS. 26A and 26B.

Dispersion in the threshold values of TFTs can be corrected normally by the present invention, without being influenced by dispersion and the like in the capacitance values of capacitor means, etc. In addition, although operations are often performed within one horizontal period in the case of performing threshold value correction in accordance with the structures shown in FIGS. 10A and 10B, and FIGS. 11A to 11F, the present invention is based on a simple operating principle. The operation timing is also simple, and therefore high speed circuit operations become possible. In particular, it becomes possible to display a high quality image using an image signal having a very large number of bits when performing display by a method in which a digital gray scale method and a time gray scale method are combined.

What is claimed is:

1. A semiconductor device comprising:
   a plurality of pixels, each pixel comprising:
      a first transistor having a gate electrode, a first electrode electrically connected to the gate electrode, and a second electrode;
      a second transistor having a gate electrode, a first electrode, a second electrode;
      a rectifying element having a first electrode;
      capacitor means; and
      a light emitting element,
   wherein:
      the first electrode of the first transistor is electrically connected to a first electrode of the capacitor means, the gate electrode of the second transistor and the first electrode of the rectifying element, and
      the first electrode of the second transistor is electrically connected to the light emitting element.

2. A semiconductor device according to claim 1, wherein the semiconductor device is applied in an electronic apparatus selected from the group consisting of a video camera, a digital camera, a goggle type display, a laptop computer, a game machine, a portable information terminal, a DVD player and a mobile telephone.

3. A semiconductor device comprising:
   a first rectifying element;
   a second rectifying element; and
   capacitor means,
   wherein:
      an electric potential $V_1$ of a first electric power source is imparted to a first electrode of the first rectifying element;
      a second electrode of the first rectifying element is electrically connected to a first electrode of the capacitor means and a first electrode of the second rectifying element;
      a first signal having an electric potential greater than or equal to an electric potential $V_2$ and less than or equal to an electric potential $V_2'$ is input to a second electrode of the second rectifying element;
      a second signal having an electric potential that is greater than or equal to an electric potential $V_3$ and less than or equal to ($V_3$+an electric potential $V_{Data}$), or, greater than or equal to ($V_3-V_{Data}$) and less than or equal to $V_3$, is input to a second electrode of the capacitor means; and
      a signal having an electric potential equal to any one of ($V_1-|V_{th}1|$), ($V_2+V_{th}2$), and ($V_1-|V_{th}1|\pm V_{Data}$) is obtained from the second electrode of the first rectifying element when a threshold voltage of the first rectifying element is taken as $V_{th}1$ and a threshold voltage of the second rectifying element is taken as $V_{th}2$.

4. A semiconductor device according to claim 3, wherein:
   the first rectifying element is formed by using a transistor having a connection between its gate and its drain;
   $V_1<V_2$ if the transistor having a connection between its gate and its drain is an n-channel transistor; and
   $V_1>V_2$ if the transistor having a connection between its gate and its drain is a p-channel transistor.

5. A semiconductor device according to claim 3, further comprising a transistor, wherein a gate electrode of the transistor is electrically connected to the first electrode of the capacitor means.

6. A semiconductor device according to claim 3, wherein the semiconductor device is applied in an electronic apparatus selected from the group consisting of a video camera, a digital camera, a goggle type display, a laptop computer, a game machine, a portable information terminal, a DVD player and a mobile telephone.

7. A semiconductor device comprising:
   a first rectifying element;
   a second rectifying element; and
   capacitor means,
   wherein:
      an electric potential $V_1$ of a first electric power source is imparted to the first electrode of the first rectifying element;
      a second electrode of the first rectifying element is electrically connected to a first electrode of the capacitor means and a first electrode of the second rectifying element;
      a first signal having a voltage amplitude of an electric potential greater than or equal to an electric potential $V_2$ and less than or equal to an electric potential $V_2'$ is input to a second electrode of the second rectifying element;
      a second signal having an electric potential that is greater than or equal to an electric potential $V_3$ and less than or equal to ($V_3$+an electric potential $V_{Data}$), or greater than or equal to ($V_3-V_{Data}$) and less than or equal to $V_3$, is input to a second electrode of the capacitor means; and
      a signal having an electric potential equal to any one of ($V_1+V_{th}1$), ($V_2'-V_{th}2$), and ($V_1+V_{th}1\pm V_{Data}$) is obtained from the second electrode of the first rectifying element when a threshold voltage of the first rectifying element is taken as $V_{th}1$ and a threshold voltage of the second rectifying element is taken as $V_{th}2$.

8. A semiconductor device according to claim 7, wherein:
the first rectifying element is formed by using a transistor having a connection between its gate and its drain;
$V_1<V_2$ if the transistor having a connection between its gate and its drain is an n-channel transistor; and
$V_1>V_2$ if the transistor having a connection between its gate and its drain is a p-channel transistor.

9. A semiconductor device according to claim 7, further comprising a transistor; wherein a gate electrode of the transistor is electrically connected to the first electrode of the capacitor means.

10. A semiconductor device according to claim 7, wherein the semiconductor device is applied in an electronic apparatus selected from the group consisting of a video camera, a digital camera, a goggle type display, a laptop computer, a game machine, a portable information terminal, a DVD player and a mobile telephone.

11. A semiconductor device comprising a plurality of pixels, each pixel including:
a source signal line;
a first gate signal line;
a second gate signal line;
a reset electric power source line;
an electric current supply line;
a first transistor;
a second transistor;
a third transistor;
capacitor means;
a diode; and
a light emitting element,
wherein:
a gate electrode of the first transistor is electrically connected to the first gate signal line;
a first electrode of the first transistor is electrically connected to the source signal line;
a second electrode of the first transistor is electrically connected to a first electrode of the capacitor means;
a second electrode of the capacitor means is electrically connected to a gate electrode of the second transistor, a first electrode of the second transistor, and a gate electrode of the third transistor;
a second electrode of the second transistor is electrically connected to the reset electric power source line;
a first electrode of the third transistor is electrically connected to the electric current supply line;
a second electrode of the third transistor is electrically connected to a first electrode of the light emitting element;
a first electrode of the diode is electrically connected to the gate electrode of the second transistor, the first electrode of the second transistor, and the gate electrode of the third transistor; and
a second electrode of the diode is electrically connected to the second gate signal line.

12. A semiconductor device according to claim 11, wherein the second transistor and the third transistor have the same polarity.

13. A semiconductor device according to claim 11, wherein the semiconductor device is applied in an electronic apparatus selected from the group consisting of a video camera, a digital camera, a goggle type display, a laptop computer, a game machine, a portable information terminal, a DVD player and a mobile telephone.

14. A semiconductor device comprising a plurality of pixels, each pixel including:
a source signal line;
a first gate signal line;
a second gate signal line;
a reset electric power source line;
an electric current supply line;
a first transistor;
a second transistor;
a third transistor;
a first capacitor means;
a second capacitor means; and
a light emitting element,
wherein:
a gate electrode of the first transistor is electrically connected to the first gate signal line;
a first electrode of the first transistor is electrically connected to the source signal line;
a second electrode of the first transistor is electrically connected to a first electrode of the first capacitor means;
a second electrode of the first capacitor means is electrically connected to a gate electrode of the second transistor, a first electrode of the second transistor, and a gate electrode of the third transistor;
a second electrode of the second transistor is electrically connected to the reset electric power source line;
a first electrode of the third transistor is electrically connected to the electric current supply line;
a second electrode of the third transistor is electrically connected to a light emitting element;
a first electrode of the second capacitor means is electrically connected to the gate electrode of the second transistor, the first electrode of the second transistor, and the gate electrode of the third transistor; and
a second electrode of the second capacitor means is electrically connected to the second gate signal line.

15. A semiconductor device according to claim 14, wherein the second transistor and the third transistor have the same polarity.

16. A semiconductor device according to claim 14, wherein the semiconductor device is applied in an electronic apparatus selected from the group consisting of a video camera, a digital camera, a goggle type display, a laptop computer, a game machine, a portable information terminal, a DVD player and a mobile telephone.

17. A method of driving a semiconductor device, the semiconductor device comprising:
a first rectifying element having a first electrode and a second electrode;
a second rectifying element having a first electrode and a second electrode; and
capacitor means,
wherein:
an electric potential $V_1$ of a first electric power source is imparted to a first electrode of the first rectifying element;
a second electrode of the first rectifying element is electrically connected to a first electrode of the capacitor means and a first electrode of the second rectifying element; and
a first signal having an electric potential greater than or equal to art electric potential. $V_2$ and less than or equal to an electric potential $V_2'$ is input to a second electrode of the second rectifying element;

the method of driving the semiconductor device comprising:
when a threshold voltage of the first rectifying element is taken as $V_{th}1$ and a threshold voltage of the second rectifying element is taken as $V_{th}2$,
a first step of setting the electric potential of a second electrode of the second capacitor means to $V_2$, and setting the electric potential of the second electrode of the first rectifying element to $(V_2+V_{th}2)$; and
a second step of setting the electric potential of a second electrode of the second capacitor means to $V_2'$, making the voltage between both electrodes of the first rectifying element converge to the threshold voltage $V_{th}1$, and setting the electric potential of the second electrode of the first rectifying element to $(V_1-|V_{th}1|)$.

18. A method of driving a semiconductor device according to claim 17, wherein:
the first rectifying element is formed by using a transistor having a connection between its gate and its drain;
$V_1<V_2$ if the transistor having a connection between its gate and its drain is an n-channel transistor; and
$V_1>V_2$ if the transistor having a connection between its gate and its drain is a p-channel transistor.

19. A method of driving a semiconductor device, the semiconductor device comprising:
a first rectifying element;
a second rectifying element; and
capacitor means,
wherein:
an electric potential $V_1$ of a first electric power source is imparted to a first electrode of the first rectifying element;
a second electrode of the first rectifying element is electrically connected to a first electrode of the capacitor means and a first electrode of the second rectifying element;
a first signal having an electric potential greater than or equal to an electric potential $V_2$ and less than or equal to an electric potential $V_2'$ is input to a second electrode of the second rectifying element; and
a second signal having an electric potential that is greater than or equal to an electric potential $V_3$ and less than or equal to $(V_3+$an electric potential $V_{Data})$, or greater than or equal to $(V_3-V_{Data})$ and less than or equal to $V_3$, is input to a second, electrode of the capacitor means;
the method of driving the semiconductor device comprising:
when a threshold voltage of the first rectifying element is taken as $V_{th}1$ and a threshold voltage of the second rectifying element is taken as $V_{th}2$,
a first step of setting the electric potential of the second electrode of the second capacitor means to $V_2$, and setting the electric potential of the second electrode of the first rectifying element to $(V_2+V_{th}2)$;
a second step of setting the electric potential of a second electrode of the second capacitor means to $V_2'$, making the voltage between both electrodes of the first rectifying element converge to the threshold voltage $V_{th}1$, and setting the electric potential of the second electrode of the first rectifying element to $(V_1-|V_{th}1|)$; and
a third step of changing the electric potential of the second electrode of the capacitor means by $V_{Data}$, and setting the electric potential of the second electrode of the first rectifying element to $(V_1-|V_{th}1|\pm V_{Data})$.

20. A method of driving a semiconductor device according to claim 19, wherein:
the semiconductor device further comprises a transistor; and
a gate electrode of the transistor is electrically connected to the second electrode of the first rectifying element.

21. A method of driving a semiconductor device according to claim 19, wherein:
the first rectifying element is formed by using a transistor having a connection between its gate and its drain;
$V_1<V_2$ if the transistor having a connection between its gate and its drain is an n-channel transistor; and
$V_1>V_2$ if the transistor having a connection between its gate and its drain is a p-channel transistor.

22. A method of driving a semiconductor device, the semiconductor device comprising:
a first rectifying element;
a second rectifying element; and
capacitor means;
wherein:
an electric potential $V_1$ of a first electric power source is imparted to the first electrode of the first rectifying element;
a second electrode of the first rectifying element is electrically connected to a first electrode of the capacitor means and a first electrode of the second rectifying element; and
a first signal having an electric potential greater than or equal to an electric potential $V_2$ and less than or equal to an electric potential $V_2'$ is input to a the second electrode of the second rectifying element;
the method of driving the semiconductor device comprising:
when a threshold voltage of the first rectifying element is taken as $V_{th}1$ and a threshold voltage of the second rectifying element is taken as $V_{th}2$,
a first step of setting the electric potential of a second electrode of the second capacitor means to $V_2'$, and setting the electric potential of the second electrode of the first rectifying element to $(V_2'-|V_{th}2|)$; and
a second step of setting the electric potential of a second electrode of the second capacitor means to $V_2$, making the voltage between both electrodes of the first rectifying element converge to the threshold voltage $V_{th}1$, and setting the electric potential of the second electrode of the first rectifying element to $(V_1+V_{th}1)$.

23. A method of driving a semiconductor device according to claim 22, wherein:
the first rectifying element is formed by using a transistor having, a connection between its gate and its drain;
$V_1<V_2$ if the transistor having a connection between its gate and its drain is an n-channel transistor; and
$V_1>V_2$ if the transistor having a connection between its gate and its drain is a p-channel transistor.

24. A method of driving a semiconductor device, the semiconductor device comprising:
a first rectifying element;
a second rectifying element; and
capacitor means,
wherein:
an electric potential $V_1$ of a first electric power source is imparted to a first electrode of the first rectifying element;
a second electrode of the first rectifying element is electrically connected to a first electrode of the capacitor means and a first electrode of the second rectifying element;

a first signal having an electric potential greater than or equal to an electric potential $V_2$ and less than or equal to an electric potential $V_2'$ is input to a second electrode of the second rectifying element; and a second signal having an electric potential that is greater than or equal to an electric potential $V_3$ and less than or equal to ($V_3$+an electric potential $V_{Data}$), or greater than or equal to ($V_3-V_{Data}$) and less than or equal to $V_3$, is input, to a second electrode of the capacitor means;

the method of driving the semiconductor device comprising:

when a threshold voltage of the first rectifying element is taken as $V_{th}1$ and a threshold voltage of the second rectifying element is taken as $V_{th}2$, a first step of setting the electric potential of the second electrode of the second capacitor means to $V_2'$, and setting the electric potential of the second electrode of the first rectifying element to $(V_2'-|V_{th}2|)$;

a second step of setting the electric potential of a second electrode of the second capacitor means to $V_2$, making the voltage between both electrodes of the first rectifying element converge to the threshold voltage $V_{th}1$, and setting the electric potential of the second electrode of the first rectifying element to $(V_1+V_{th}1)$; and a third step of changing the electric potential of the second electrode of the capacitor means by $V_{Data}$, and setting the electric potential of the second electrode of the first rectifying element to $(V_1+V_{th}1 \pm V_{Data})$.

25. A method of driving a semiconductor device according to claim 24, wherein:

the semiconductor device further comprises a transistor; and a gate electrode of the transistor is electrically connected to the second electrode of the first rectifying element.

26. A method of driving a semiconductor device according to claim 24, wherein:

the first rectifying element is formed by using a transistor having a connection between its gate and its drain;

$V_1<V_2$ if the transistor having a connection between its gate and its drain is an n-channel transistor; and $V_1>V_2$ if the transistor having a connection between its gate and its drain is a p-channel transistor.

27. A semiconductor device comprising:

a plurality of pixels, each pixel comprising:

a first transistor having a gate electrode, a first electrode electrically connected to the gate electrode, and a second electrode;

a second transistor having a gate electrode, a first electrode, a second electrode;

capacitor means; and a light emitting element, wherein:

the first electrode of the first transistor is electrically connected to a first electrode of the capacitor means and the gate electrode of the second transistor, the second electrode of the first transistor is electrically connected to a reset electric power source line, and the first electrode of the second transistor is electrically connected to the light emitting element.

* * * * *